US011882743B2

(12) United States Patent
Ma et al.

(10) Patent No.: US 11,882,743 B2
(45) Date of Patent: Jan. 23, 2024

(54) DISPLAY PANEL AND DISPLAY APPARATUS

(71) Applicant: WuHan TianMa Micro-electronics CO., LTD., Wuhan (CN)

(72) Inventors: Yangzhao Ma, Wuhan (CN); Meihong Wang, Wuhan (CN); Hao Dai, Wuhan (CN); Pengcheng Mu, Wuhan (CN); Lida Li, Wuhan (CN)

(73) Assignee: WuHan TianMa Micro-electronics CO., LTD., Wuhan (CN)

(*) Notice: Subject to any disclaimer, the term of this patent is extended or adjusted under 35 U.S.C. 154(b) by 0 days.

(21) Appl. No.: 18/148,508

(22) Filed: Dec. 30, 2022

(65) Prior Publication Data

US 2023/0139359 A1 May 4, 2023

Related U.S. Application Data

(63) Continuation of application No. 17/350,759, filed on Jun. 17, 2021, now Pat. No. 11,574,992.

(30) Foreign Application Priority Data

Apr. 23, 2021 (CN) .......................... 202110443304.5

(51) Int. Cl.
G09G 3/32 (2016.01)
H10K 59/131 (2023.01)
G09G 3/3233 (2016.01)

(52) U.S. Cl.
CPC ....... H10K 59/1315 (2023.02); *G09G 3/3233* (2013.01); *G09G 2300/0426* (2013.01); *G09G 2300/0842* (2013.01)

(58) Field of Classification Search
CPC ............. H10K 59/1315; H10K 59/131; H10K 59/353; H10K 59/60; G09G 3/3233;
(Continued)

(56) References Cited

U.S. PATENT DOCUMENTS 9,786,217 B2* 10/2017 Roh ...................... G09G 3/3208
2012/0026155 A1* 2/2012 Komiya ................. G09G 3/003
345/76
(Continued)

FOREIGN PATENT DOCUMENTS

CN 110767097 A 2/2020

OTHER PUBLICATIONS

First Chinese Office Action dated May 6, 2022, issued in corresponding Chinese Application No. 202110443304.5, filed on Apr. 23, 2021, and its English translation thereof, 10 pages.

*Primary Examiner* — Pegeman Karimi
(74) *Attorney, Agent, or Firm* — CHRISTENSEN O'CONNOR JOHNSON KINDNESS PLLC

(57) ABSTRACT

A display panel and a display apparatus are provided. The display panel includes pixel circuits in a display region, a light-emitting device, and signal lines. The pixel circuits are electrically connected to the light-emitting devices, and the signal lines are electrically connected to the pixel circuits. The signal lines include constant voltage signal lines extending in a first direction and connected to a constant voltage terminal. The display region includes a first display region and a second display region. The constant voltage signal lines include first constant voltage signal lines located in the first display region and second constant voltage signal lines located in the second display region. A distance between two adjacent first constant voltage signal lines in the first display region is D1, and a distance between two adjacent second constant voltage signal lines in the second display region is D2, where D1≥D2.

39 Claims, 44 Drawing Sheets

(58) Field of Classification Search
CPC ... G09G 2300/0426; G09G 2300/0842; G09G 2340/0407; G09G 3/32; H01L 27/156
See application file for complete search history.

(56) References Cited

U.S. PATENT DOCUMENTS

2015/0371589 A1* 12/2015 Kim .................... H01L 27/1251
345/208
2018/0061311 A1* 3/2018 Lin .......................... G09G 3/32
2020/0411607 A1* 12/2020 Jian ........................ H10K 59/60

* cited by examiner

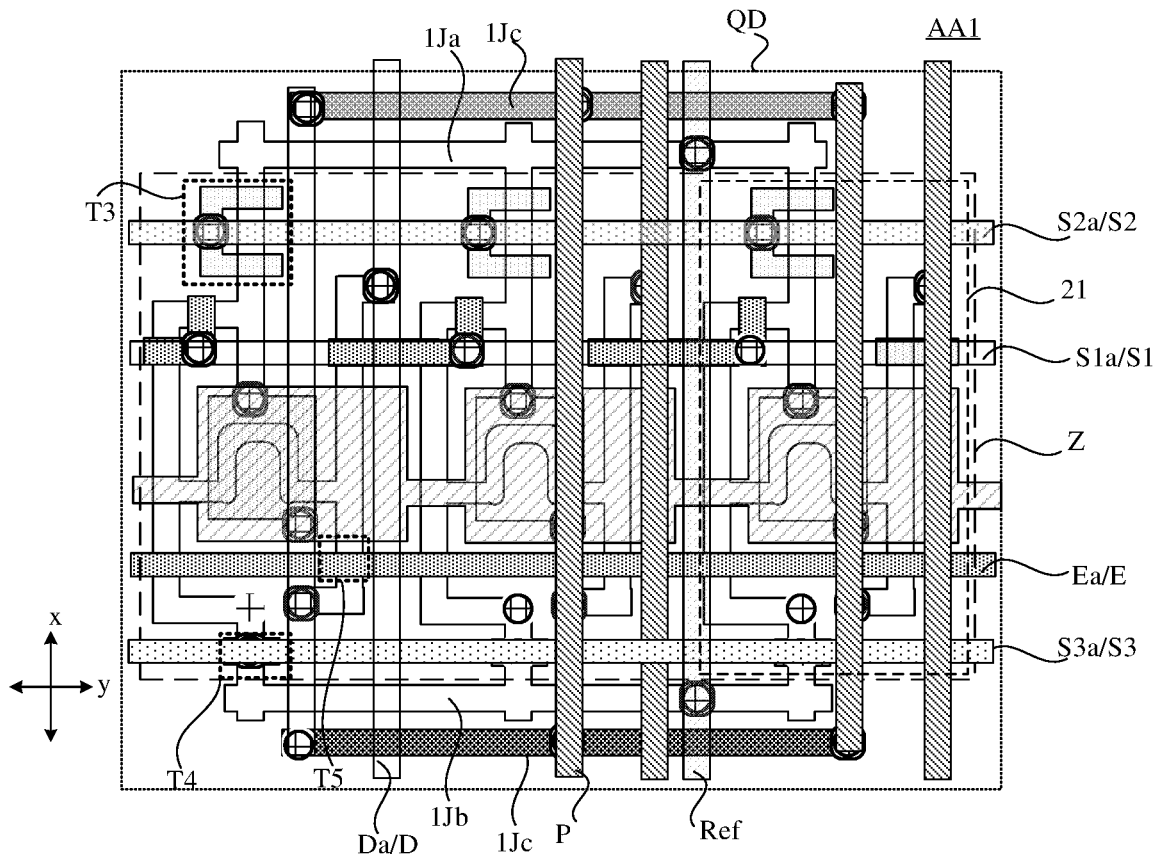
FIG. 18
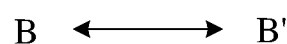
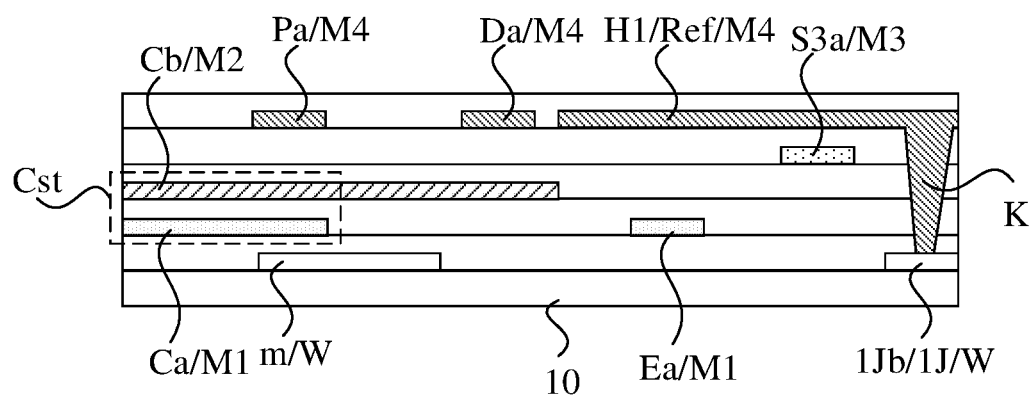
FIG. 19

DISPLAY PANEL AND DISPLAY APPARATUS

CROSS-REFERENCE TO RELATED APPLICATIONS

This application is a continuation of U.S. patent application Ser. No. 17/350,759, filed on Jun. 17, 2021, which claims to the benefit of Chinese Patent Application No. 202110443304.5, filed on, Apr. 23, 2021. All of the above-mentioned patent applications are hereby incorporated by reference in their entireties.

TECHNICAL FIELD

The present disclosure relates to the field of display technologies, and in particular, to a display panel and a display apparatus.

BACKGROUND

In an electronic product, such as a mobile phone or a tablet computer, a front camera, an infrared sensing element, and other photosensitive devices occupy space on the front of the product, affecting a screen-to-body ratio. With introduction of a full screen in the display field, major manufacturers are endeavoring to research in the full-screen field. It is commonly acknowledged that an under-screen photosensitive device solution is a favorable solution in which a true full screen can be implemented. For example, in an under-screen camera solution, a camera is disposed below a display region of a display screen, and the camera does not occupy space of a non-display region on the front of the electronic product. During application, a position of the camera can be displayed normally, and the camera receives light passing through the display screen for imaging. A display panel applied in the under-screen photosensitive device solution needs to be specially designed, so that light transmittance in a display region corresponding to a photosensitive device meets requirements.

SUMMARY

An embodiment of the present disclosure provides a display panel. The display panel has a display region, the display region includes a first display region and a second display region. The display panel includes pixel circuits, light-emitting devices, and signal lines. The pixel circuits are electrically connected to the light-emitting devices, and the signal lines are electrically connected to the pixel circuits. The signal lines include first signal lines extending in a first direction, the first signal lines include constant voltage signal lines, and the constant voltage signal lines are connected to the constant voltage terminal. The first display region is a region where a reserved device is arranged, and the constant voltage signal lines include first constant voltage signal lines located in the first display region and second constant voltage signal lines located in the second display region.

An embodiment of the present disclosure further provides a display apparatus, including a display panel provided in the above embodiment of the present disclosure.

BRIEF DESCRIPTION OF THE DRAWINGS

To describe the technical solutions in the embodiments of the present disclosure or in the related art more clearly, the following briefly describes the accompanying drawings required for describing the embodiments or the related art. Apparently, the accompanying drawings in the following description show some embodiments of the present disclosure, and a person skilled in the art can still derive other drawings from these accompanying drawings.

FIG. 18 is a partial schematic view of another display panel according to an embodiment of the present disclosure.

FIG. 19 is a cross-sectional view along a line B-B' in FIG. 14 according to an embodiment of the present disclosure.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by persons of ordinary skill in the art based on the embodiments of the present disclosure shall fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

Some embodiments of the present disclosure provide a display panel and a display apparatus. A display region of the display panel includes a reserved device setting region reserved for a device. A line arrangement manner of a circuit in the reserved device setting region is designed to increase light transmittance in the reserved device setting region.

Figure 1:
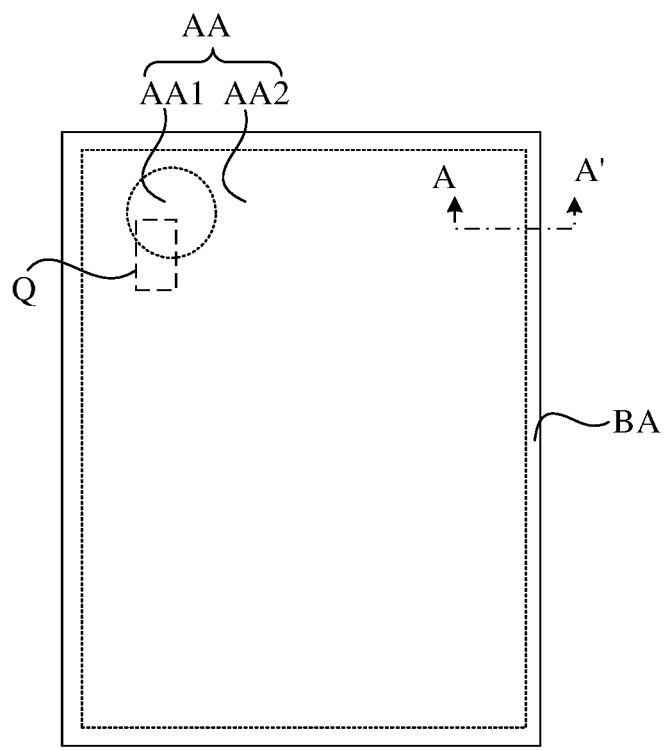
FIG. 1 is a schematic diagram of a display panel according to an embodiment of the present disclosure.
Figure 2:
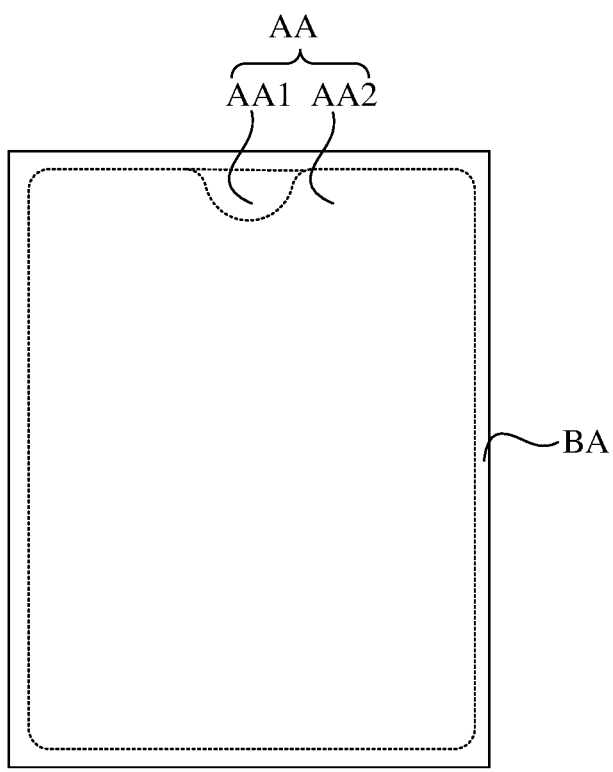
FIG. 2 is a schematic diagram of another display panel according to an embodiment of the present disclosure.
Figure 3:
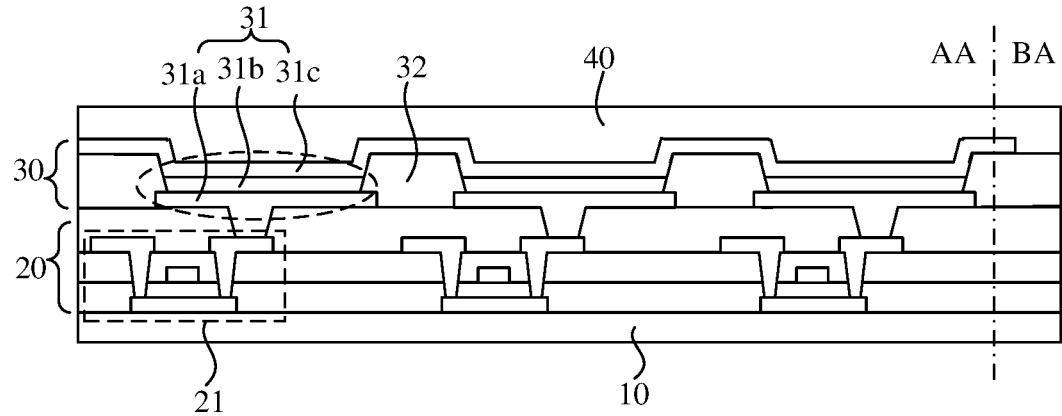
FIG. 3 is a cross-sectional view along a line A-A' in FIG. 1 according to an embodiment of the present disclosure.

FIG. 1 is a schematic diagram of a display panel according to an embodiment of the present disclosure. FIG. 2 is a schematic diagram of another display panel according to an embodiment of the present disclosure. FIG. 3 is a cross-sectional view along tangent A-A' in FIG. 1.

As shown in FIG. 1 and FIG. 2, the display panel includes a display region AA and a non-display region BA. The display region AA includes a first display region AA1 and a second display region AA2. FIG. 1 shows that the second display region AA2 surrounds the first display region AA1. FIG. 2 shows that the first display region AA1 is partially surrounded by the second display region. The first display region AA1 is a reserved device setting region, and is applied in an under-screen photosensitive device solution. A photosensitive device is disposed under the reserved device setting region. A shape of the first display region AA1 is not limited in this embodiment of the present disclosure. A light transmittance of the first display region AA1 is greater than a light transmittance of the second display region AA2.

In some embodiments, a density of the light-emitting devices in the first display region AA1 is smaller than a density of the light-emitting devices in the second display region AA2, and a density of the pixel circuits in the first display region AA1 is smaller than a density of the pixel circuits in the second display region AA.

In some embodiments, a density of the light-emitting devices in the first display region AA1 is the same as a density of the light-emitting devices in the second display region AA2, and a density of the pixel circuits in the first display region AA1 is smaller than a density of the pixel circuits in the second display region AA2. In an embodiment, one pixel circuit (can be located in the first display region AA1 or the second display region AA2) is electrically connected to two or more light-emitting devices in the first display region AA1, which emit light of a same color.

As shown in FIG. 3, the display panel includes a substrate 10, and an array layer 20, a display layer 30, and an encapsulation layer 40 that are located on the substrate 10. A pixel circuit 21 and signal lines are located in the array layer 20, and the signal line is electrically connected to the pixel circuit 21. The display layer 30 includes a light-emitting device 31 and a pixel definition layer 32. The pixel circuit 21 is electrically connected to the light-emitting device 31. The pixel circuit 21 is a minimum repetition unit of a circuit structure that drives the light-emitting device 31 to emit light. The light-emitting device 31 includes a first electrode 31a, a light-emitting layer 31b, and a second electrode 31c that are sequentially stacked. In an embodiment, the light-emitting device 31 is an organic light-emitting device. In another embodiment, the light-emitting device 31 is an inorganic light-emitting device. The encapsulation layer 40 is configured to isolate water and oxygen, to prevent the water and the oxygen from damaging the light-emitting device 31. The signal lines include a data line, a reset signal line, a power signal line, a scanning line, and a light-emitting control line.

In an embodiment, the first electrode 31a is an anode, and the second electrode 31c is a cathode. In another embodiment, the first electrode 31a is a cathode, and the second electrode 31c is an anode.

In some embodiments, the first electrode 31a is a reflective electrode, the reflective electrode includes a reflective layer, and the reflective layer can include Ag, Mg, Al, Pt, Pd, Au, Ni, Nd, Ir, Cr, or a mixture thereof. The second electrode 31c is a transparent electrode, and the transparent electrode can be made of one or more of ITO, IZO, ZnO, or $In_2O_3$.

Figure 4:
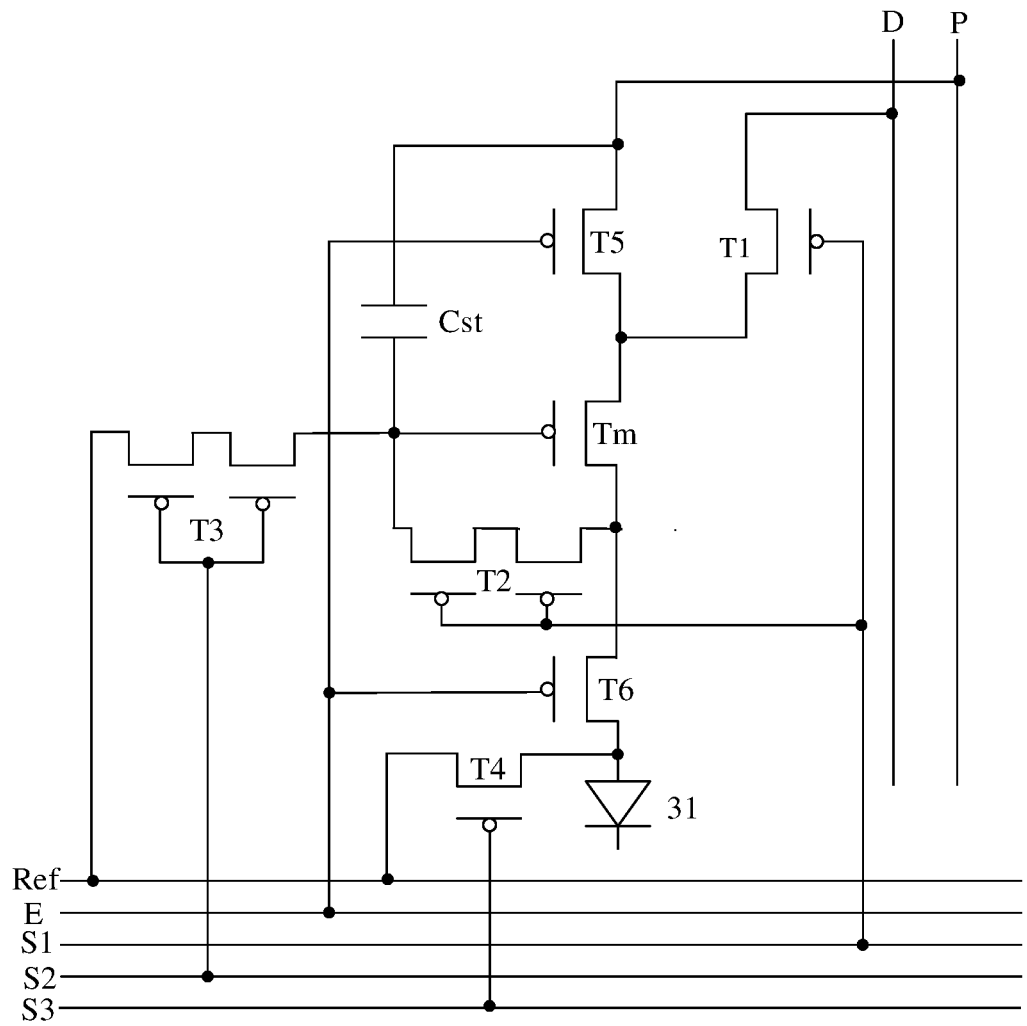
FIG. 4 is a schematic diagram of a pixel circuit of a display panel according to an embodiment of the present disclosure.
Figure 5:
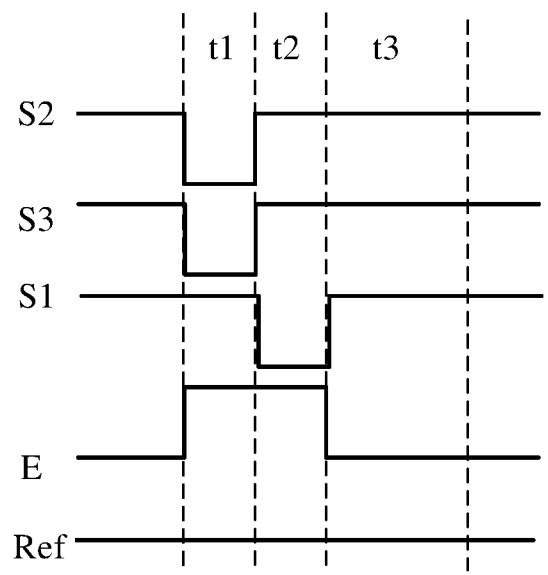
FIG. 5 is a time sequence diagram of the pixel circuit in FIG. 4 according to an embodiment of the present disclosure.

FIG. 4 is a schematic diagram of a pixel circuit in a display panel according to an embodiment of the present disclosure. FIG. 5 is a time sequence diagram of the pixel circuit in FIG. 4. As shown in FIG. 4, the pixel circuit includes seven transistors and one capacitor. In other words, the pixel circuit is a 7T1C pixel circuit. As shown in FIG. 4, the pixel circuit includes a drive transistor Tm, a data writing transistor T1, a threshold compensation transistor T2, a first reset transistor T3, a second reset transistor T4, a first light-emitting control transistor T5, a second light-emitting control transistor T6, and a storage capacitor Cst. The first reset transistor T3 is configured to reset a control terminal of the drive transistor Tm. The second reset transistor T4 is configured to reset a first electrode of a light-emitting device 31a.

A first electrode of the data writing transistor T1 is connected to a data line D, and a second electrode of the data writing transistor T1 is electrically connected to a first electrode of the drive transistor Tm. A first electrode of the first light-emitting control transistor T5 is connected to a power signal line P, and a second electrode of the first light-emitting control transistor T5 is electrically connected to the first electrode of the drive transistor Tm. A first electrode of the second light-emitting control transistor T6 is electrically connected to the second electrode of the drive transistor Tm, and a second electrode of the second light-emitting control transistor T6 is electrically connected to a first electrode of the light-emitting device 31. A first electrode of the first reset transistor T3 is electrically connected to a control terminal of the drive transistor Tm, a first electrode of the second reset transistor T4 is electrically connected to the first electrode of the light-emitting device 31, and both a second electrode of the first reset transistor T3 and a second electrode of the second reset transistor T4 are connected to a reset signal line Ref. A first electrode of the threshold compensation transistor T2 is electrically connected to the second electrode of the drive transistor Tm, and a second electrode of the threshold compensation transistor T2 is electrically connected to the control terminal of the drive transistor Tm. FIG. 4 shows that both a control terminal of the data writing transistor T1 and a control terminal of the threshold compensation transistor T2 are connected to a first scanning line S1, and a control terminal of the first reset transistor T3 is connected to a second scanning line S2; a control terminal of the second reset transistor T4 is connected to a third scanning line S3; and both a control terminal of the first light-emitting control transistor T5 and a control terminal of the second light-emitting control transistor T6 are connected to a light-emitting control line E.

A working process of the pixel circuit includes a reset stage t1, a data writing stage t2, and a light emitting stage t3, and is understood with reference to the schematic time sequence diagram of FIG. 5.

During the reset stage t1, the second scanning line S2 provides an effective level signal to control the first reset transistor T3 to be turned on, and to write a reset signal provided by the reset signal line Ref to the control terminal of the drive transistor Tm to reset the control terminal of the drive transistor Tm; and the third scanning line S3 provides an effective level signal to control the second reset transistor T4 to be turned on, and to write a reset signal provided by the reset signal line Ref to the first electrode of the light-emitting device 31 to reset the first electrode.

During the data writing stage t2, the first scanning line S1 provides an effective level signal to control the data writing transistor T1 and the threshold compensation transistor T2 to be turned on, and to write a data voltage provided by the data line D to the control terminal of the drive transistor Tm, and compensate for a threshold voltage of the drive transistor Tm.

During the light emitting stage t3, the light-emitting control line E provides an effective level signal to control the first light-emitting control transistor T5 and the second light-emitting control transistor T6 to be turned on; and the drive transistor Tm provides a drive current to the light-emitting device 31 to control the light-emitting device 31 to emit light.

In another embodiment, referring to FIG. 4, during the reset stage, the second scanning line S2 provides an effective level signal to control the first reset transistor T3 to be turned on, and to write a reset signal provided by the reset signal line Ref to the control terminal of the drive transistor Tm to reset the control terminal of the drive transistor Tm.

During the data writing stage, the first scanning line S1 provides an effective level signal to control to the data writing transistor T1 and the threshold compensation transistor T2 to be turned on, to write a data voltage from the data line D into the control terminal of the drive transistor Tm, and compensate for a threshold voltage of the drive transistor Tm; and the third scanning line S3 provides an effective level signal to control the second reset transistor T4 to be turned on, to write a reset signal provided by the reset signal line Ref to the first electrode of the light-emitting device 31 to reset the first electrode.

During the light emitting stage, the light-emitting control line E provides an effective level signal to control to the first light-emitting control transistor T5 and the second light-emitting control transistor T6 to be turned on; and the drive transistor Tm provides a drive current to the light-emitting device 31 to control the light-emitting device 31 to emit light.

Figure 6:
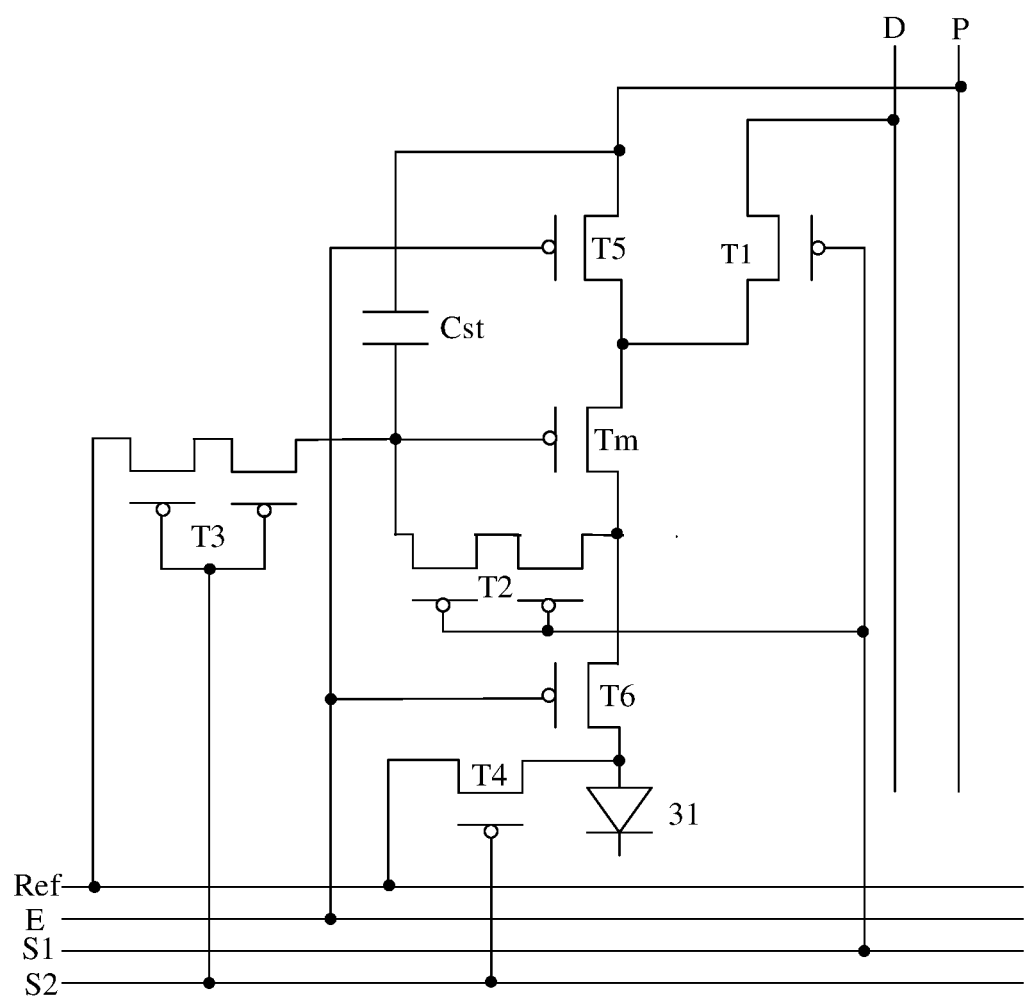
FIG. 6 is a schematic diagram of another pixel circuit according to an embodiment of the present disclosure.

In another embodiment, different from FIG. 6, the control terminal of the second reset transistor T4 can be electrically connected to the first scanning line S1, and during the data writing stage, the first electrode of the light-emitting device 31 is synchronously reset, and details are not described herein.

Figure 7:
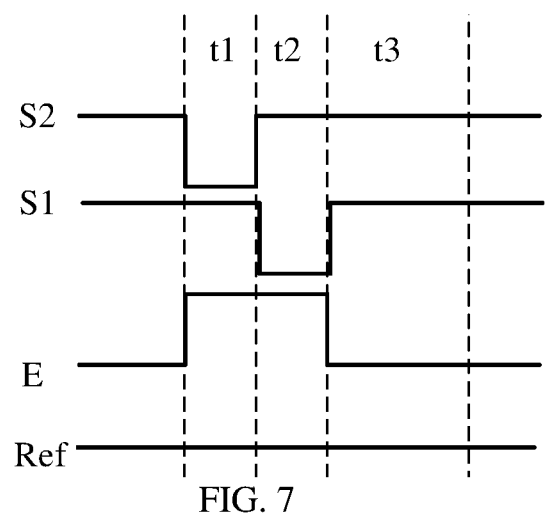
FIG. 7 is a time sequence diagram of the pixel circuit in FIG. 6 according to an embodiment of the present disclosure.

FIG. 6 is a schematic diagram of another pixel circuit according to an embodiment of the present disclosure. FIG. 7 is a time sequence diagram of the pixel circuit in FIG. 6. FIG. 6 shows that the pixel circuit includes seven transistors and one capacitor. For a part in FIG. 6 the same as that in FIG. 4, reference can be made to FIG. 4, and details are not described herein again. In an embodiment of FIG. 6, both a control terminal of a first reset transistor T3 and a control terminal of a second reset transistor T4 are connected to a second scanning line S2. When the pixel circuit works in the reset stage t1, the second scanning line S2 provides an effective level signal to control the first reset transistor T3 to be turned on and to reset a control terminal of a drive transistor Tm, and the second scanning line S2 provides an effective level signal to control a second reset transistor T4 to be turned on, and to reset a first electrode of a light-emitting device 31.

Figure 8:
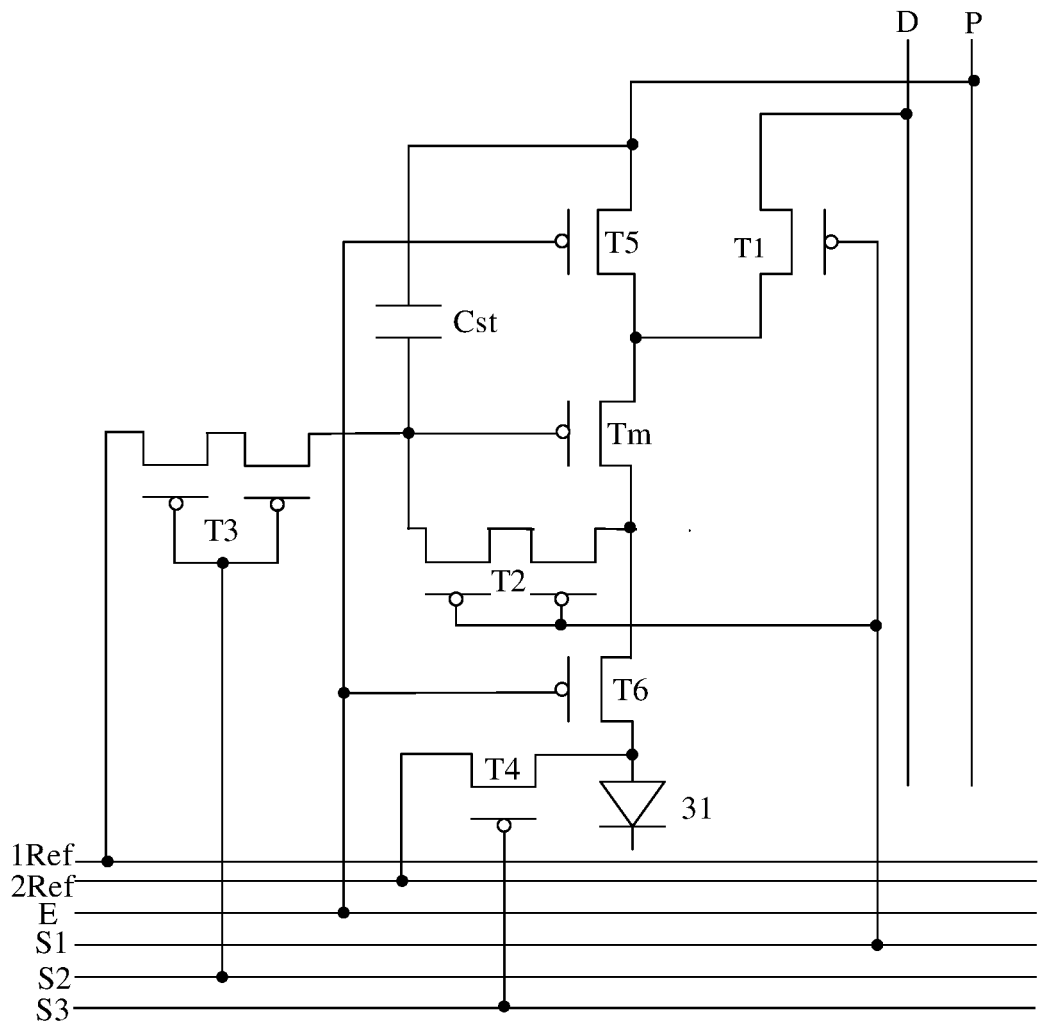
FIG. 8 is a schematic diagram of another pixel circuit according to an embodiment of the present disclosure.

FIG. 8 is a schematic diagram of another pixel circuit according to an embodiment of the present disclosure. For a part of FIG. 8 the same as that in FIG. 4, reference can be made to FIG. 4, and details are not described herein again. In an embodiment of FIG. 8, a second electrode of a first reset transistor T3 is electrically connected to a first reset signal line 1Ref, and a second electrode of a second reset transistor T4 is electrically connected to a second reset signal line 2Ref. When the pixel circuit provided in the embodiment of FIG. 8 is driven to work, for a time sequence of the first scanning line S1, the second scanning line S2, the third scanning line S3, and the light-emitting control line E, reference can be made to the schematic time sequence diagram of FIG. 5.

In an embodiment, during the reset stage t1, the second scanning line S2 provides an effective level signal to control the first reset transistor T3 to be turned on, and to write a reset signal from the first reset signal line 1Ref to the control terminal of the drive transistor Tm to reset the control terminal of the drive transistor Tm; and the third scanning line S3 provides an effective level signal to control the second reset transistor T4 to be turned on, and to write a reset signal provided by the second reset signal line 2Ref to the first electrode of the light-emitting device 31 to reset the first electrode. A voltage of the reset signal provided by the first reset signal line 1Ref is greater than a voltage of the reset signal provided by the second reset signal line 2Ref. In this embodiment, resetting the control terminal of the drive transistor Tm and resetting the first electrode of the light-emitting device can be separately performed. When the second scanning line S2 controls the first reset transistor T3 to be turned on, to reset the control terminal of the drive transistor Tm, the first reset signal line 1Ref provides a relatively high reset voltage signal to the control terminal of the drive transistor Tm. In this case, and after the data writing stage, the closer a voltage of the control terminal of the drive transistor Tm approaches Vdata−|Vth| (where Vdata is a data voltage, and Vth is a threshold voltage of the drive transistor), the faster a speed of collecting a threshold of the control terminal of the drive transistor Tm that is used in a high frequency display or a low brightness (or grayscale) display. In this way, uneven display is reduced. At the same time, when the third scanning line S3 controls the first electrode of the light-emitting device to reset, the second reset signal line 2Ref provides a relatively low reset voltage signal to the first electrode of the light-emitting device. With such configuration, a case in which the light-emitting device emits light in an undetectable manner is reduced, and a low grayscale display effect is improved.

Transistors in the schematic diagrams of the pixel circuits shown in FIG. 4, FIG. 6, and FIG. 8 are all shown as a P type. A type of the transistor of the pixel circuit is not limited in the present disclosure. It should be noted that, there are a plurality of "electrically connected to" in the present disclosure, and "electrically connected to" refers to an electrical connection, which can be understood as that different components of a device structure are connected to each other through a physical trace or a transistor that can transmit an electrical signal.

Figure 9:
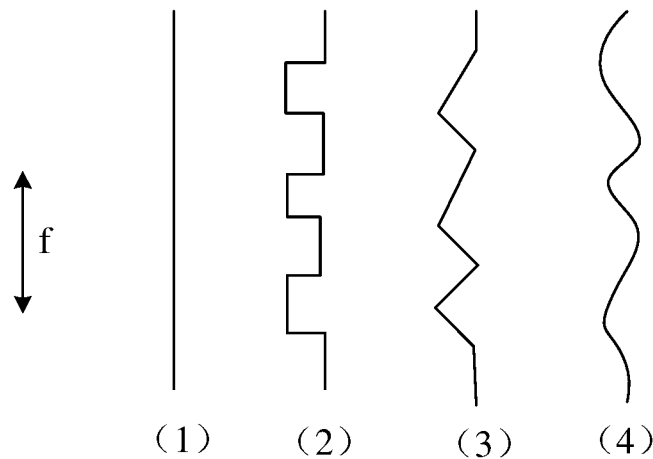
FIG. 9 is a schematic diagram of line types of signal lines of a display panel according to an embodiment of the present disclosure.

In an embodiment of the present disclosure, signal lines electrically connected to the pixel circuit include a data line, a reset signal line, a power signal line, a scanning line, and a light-emitting control line. The signal lines are classified, according to extending directions of the signal lines, to first signal lines extending along a first direction and second signal lines extending along a second direction. The first direction intersects the second direction. It should be noted that the extending direction of the signal line represents only an approximate extending direction of the signal line. FIG. 9 is a schematic diagram of line types of signal lines of a display panel according to an embodiment of the present disclosure. An extending direction of the signal line shown in FIG. 9 is a direction f. The signal line in this embodiment of the present disclosure can be a straight line, a "弓"-shaped line, a zigzag line, or a wave line, shown in (1), (2), (3), and (4) in FIG. 9, respectively. FIG. 9 shows only several implementations of the line type. The line type of the signal line is not limited in this embodiment of the present disclosure. That is, the signal line is not limited to a straight line extending in its extension direction.

Figure 10:
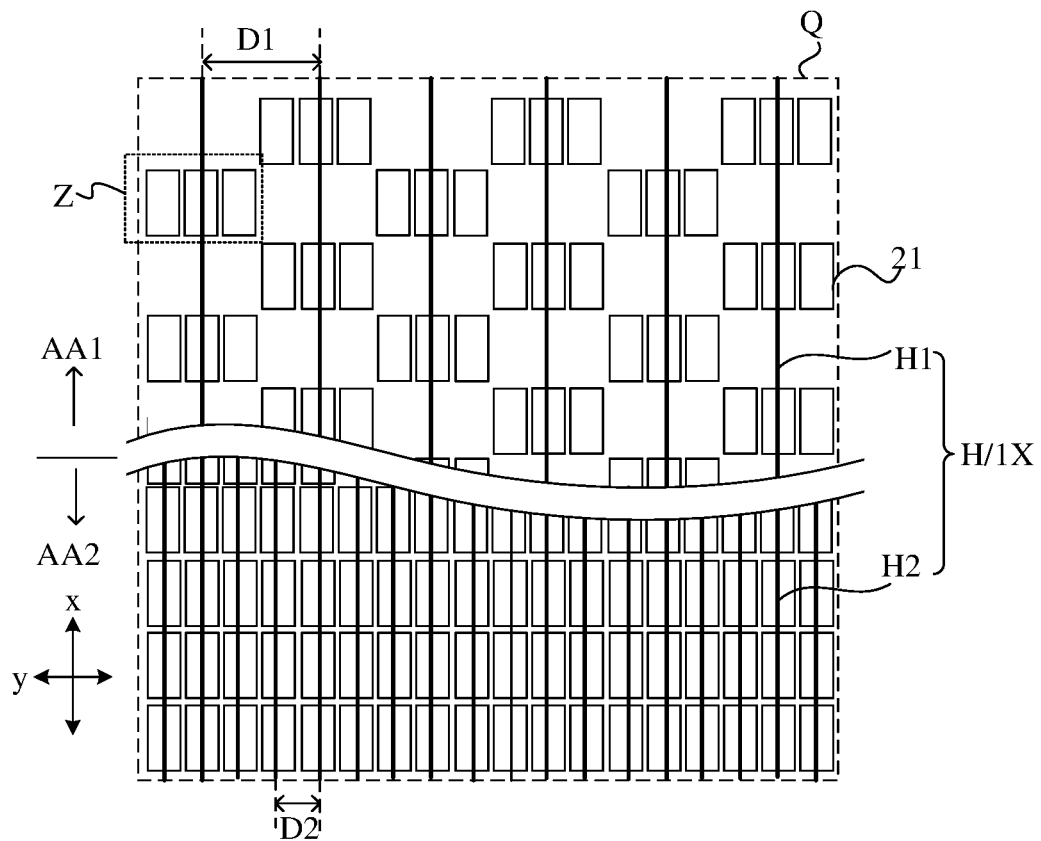
FIG. 10 is an enlarged schematic view of a position of a region Q in FIG. 1 according to an embodiment of the present disclosure.
Figure 11:
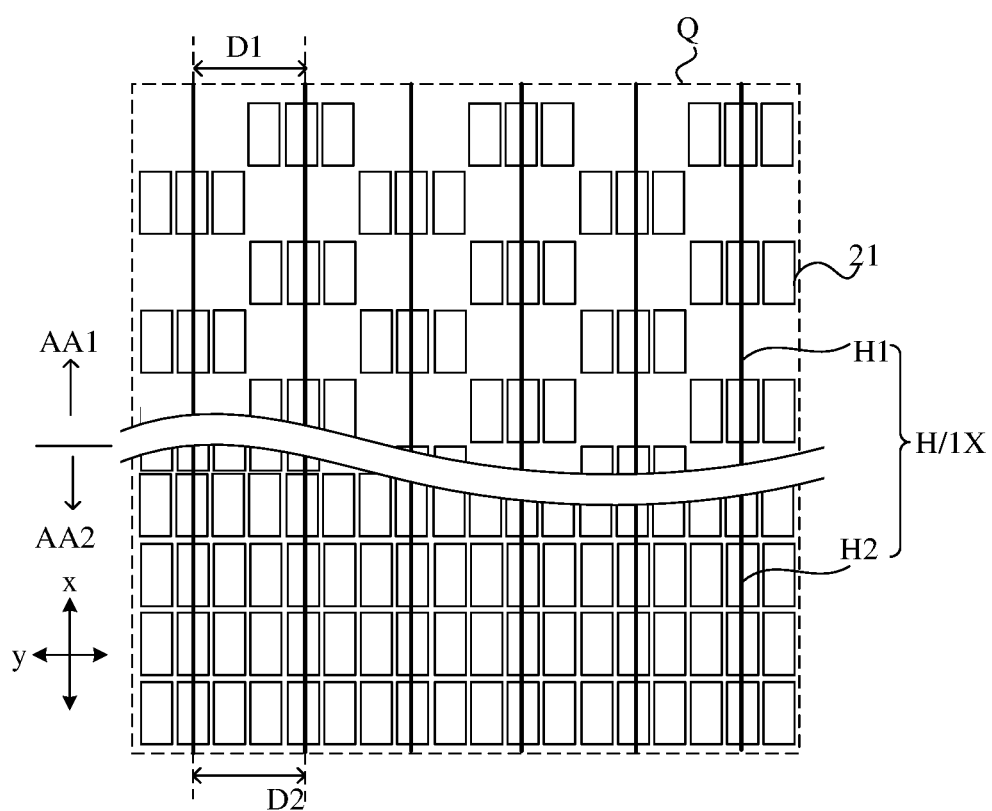
FIG. 11 is another enlarged schematic view of a position of a region Q in FIG. 1 according to an embodiment of the present disclosure.
Figure 12:
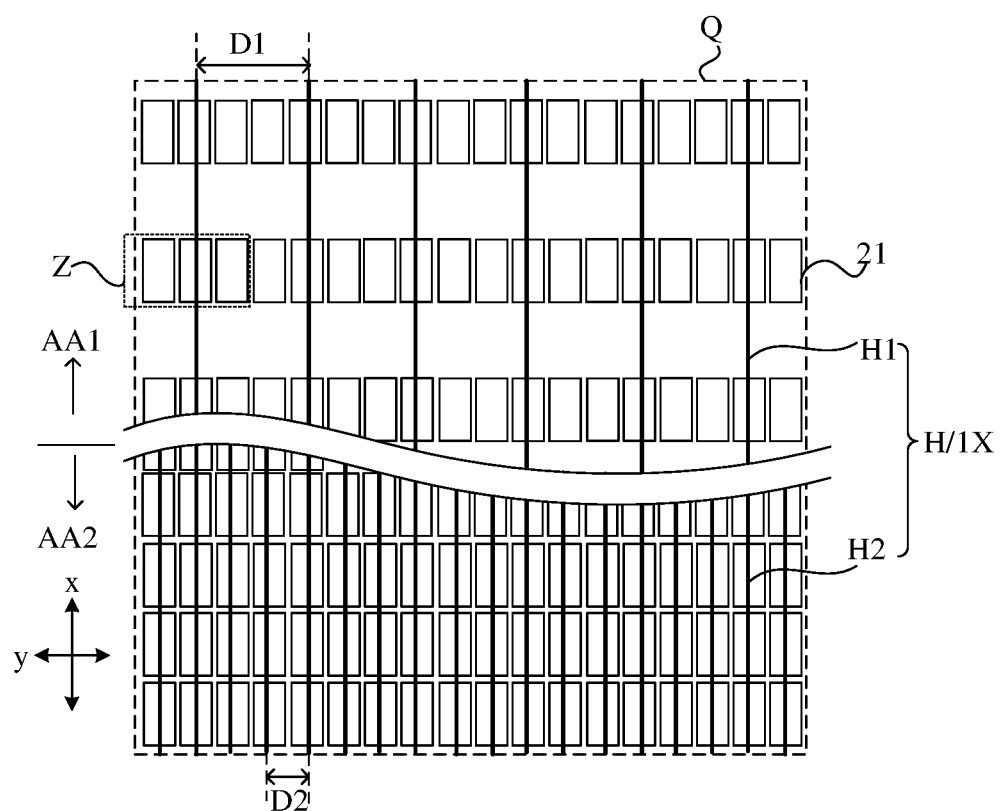
FIG. 12 is another enlarged schematic view of a position of a region Q in FIG. 1 according to an embodiment of the present disclosure.
Figure 13:
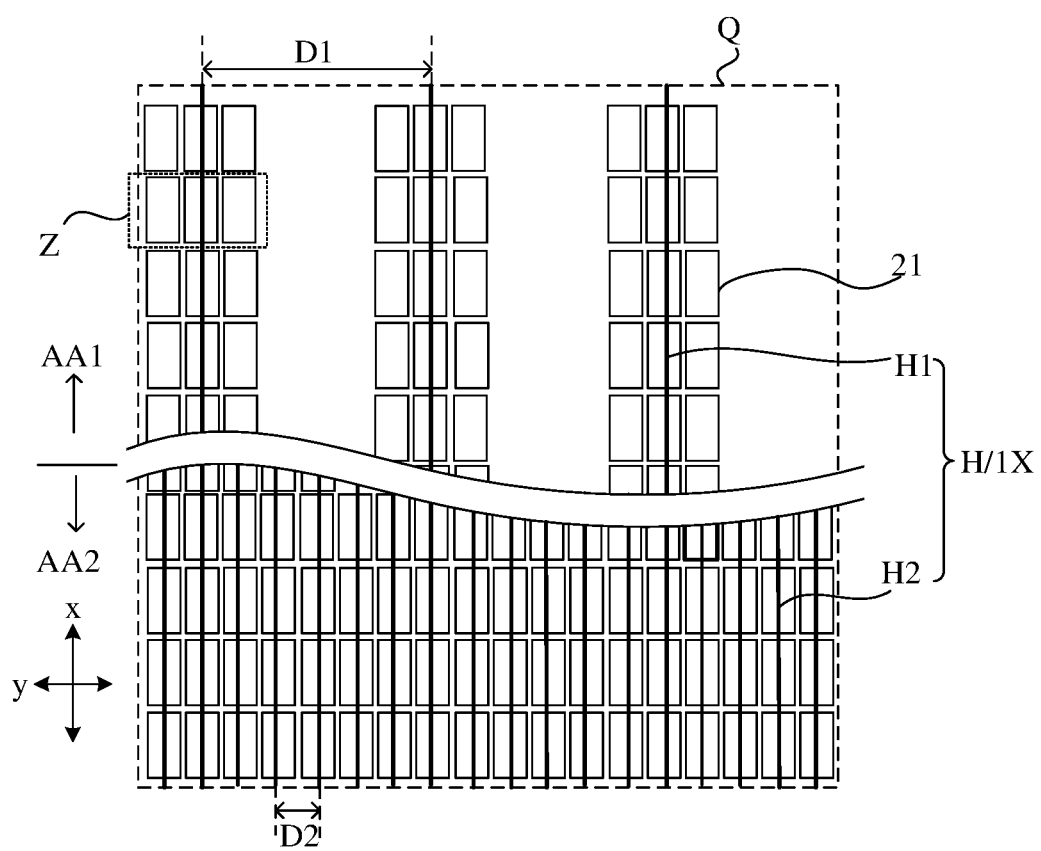
FIG. 13 is another enlarged schematic view of a position of a region Q in FIG. 1 according to an embodiment of the present disclosure.

FIG. 10 is an enlarged schematic view of a region Q in FIG. 1. FIG. 11 is another enlarged schematic view of a region Q in FIG. 1. FIG. 12 is another enlarged schematic view of a region Q in FIG. 1. FIG. 13 is another enlarged schematic view of a region Q in FIG. 1.

FIG. 10 shows first signal lines 1X extending in a first direction x. The first signal lines 1X include constant voltage signal lines H, and the constant voltage signal lines H are connected to a constant voltage terminal. The constant voltage terminal is a terminal in a display panel, which is connected to a drive chip. A position of the constant voltage terminal is not shown in the figure. For example, the drive chip provides a constant voltage signal to the constant voltage terminal. The constant voltage signal line H is electrically connected to the constant voltage terminal, and the constant voltage signal line H is configured to transmit the constant voltage signal. The constant voltage signal lines H include a first constant voltage signal line H1 located in a first display region AA1 and a second constant voltage signal line H2 located in a second display region AA2. The first constant voltage signal line H1 and the second constant voltage signal line H2 are signal lines that transmit a same type of signal. A pixel circuit 21 located in the first display region AA1 is electrically connected to the first constant voltage signal line H1, and a pixel circuit 21 located in the second display region AA2 is electrically connected to the second constant voltage signal line H2. The pixel circuit 21 in FIG. 10 is simplistically shown. In some embodiments, the first constant voltage signal line H1 is electrically connected to the second constant voltage signal line H2. In some embodiments, the first constant voltage signal line H1 ends at a boundary between the first display region AA1 and the second display region AA2.

In an embodiment, a distance between two adjacent first constant voltage signal lines H1 in the first display region AA1 is D1, and a distance between two adjacent second constant voltage signal lines H2 in the second display region AA2 is D2, where FIG. 10 shows that D1 is greater than D2, and FIG. 11 shows that D1 is equal to D2. In an embodiment of the present disclosure, D1≥D2. In other words, the distance between the two adjacent first constant voltage signal lines H1 in the first display region AA1 is not smaller than the distance between the two adjacent second constant voltage signal lines H2 in the second display region AA2. In other words, in regions that have a same area and in which constant voltage signal lines H are arranged, the number of the first constant voltage signal lines H1 in the first display region AA1 is not greater than the number of the second constant voltage signal lines H2 in the second display region AA2.

In an embodiment of the present disclosure, a light transmittance of the first display region AA1 is greater than a light transmittance of the second display region AA2. For example, a density of the pixel circuits in the first display region AA1 is smaller than a density of the pixel circuits in the second display region AA2. In this embodiment of the present disclosure, compared with an arrangement of the pixel circuits in the second display region AA2, the pixel circuits in the first display region AA1 that has a same area as the second display region are arranged sparsely in such a manner that the light transmittance of the first display region AA1 is greater than the light transmittance of the second display region AA2.

In an embodiment of the present disclosure, the first display region AA1 includes a plurality of pixel circuit groups Z, each of which includes three pixel circuits arranged in a second direction y. In an embodiment, the pixel circuits of the display panel are arranged in an array, a first direction x is a row direction, along which the pixel circuit groups Z are arranged, and the second direction y is a column direction, along which the pixel circuit groups Z are arranged. As shown in FIG. 10, an example where one pixel circuit group Z includes three pixel circuits 21 is illustrated; and in the first display region AA1, a pixel circuit group Z located in an odd-numbered column and an odd-numbered row is removed, and a pixel circuit group Z located in an even-numbered column and an even-numbered row is removed. Therefore, an area of a light transmission region of the first display region AA1 is increased.

In another embodiment, as shown in FIG. 12, the first display region AA1 includes a plurality of pixel circuit groups Z, each of which includes three pixel circuits 21 arranged in a second direction y. A first direction x is a row direction, along which the pixel circuit groups Z are arranged, and the second direction y is a column direction, along which the pixel circuit groups Z are arranged. In the first display region AA1, a pixel circuit 21 located in an odd-numbered row of pixel circuit group rows is removed, or a pixel circuit 21 in an even-numbered row of pixel circuit group rows is removed. In this case, a distance between two adjacent pixel circuits 21 in the first display region AA1 in a column direction increases.

In another embodiment, as shown in FIG. 13, in a first display region AA1, a pixel circuit 21 in an even-numbered column of pixel circuit group columns, or a pixel circuit 21 in an odd-numbered column of pixel circuit group columns is removed. In this case, a distance between two adjacent pixel circuit group columns in the first display region AA1 in a second direction y increases.

In the embodiments of the present disclosure, FIG. 10, FIG. 12, and FIG. 13 all show that one column of pixel circuits arranged in the first direction x in the second display region AA2 correspond to one second constant voltage signal line H2, and one column of pixel circuit groups in the first display region AA1 correspond to one first constant voltage signal line H1, that is, three columns of pixel circuits correspond to one first constant voltage signal line H1. FIG. 11 shows that three columns of pixel circuits in the second display region AA2 correspond to one second constant voltage signal line H2. In this embodiment of the present disclosure, a line arrangement manner of first constant voltage signal lines H1 in the first display region AA1 is designed with reference to an arrangement manner of the pixel circuits 21 in the first display region AA1, and is designed to match a line arrangement manner of the second constant voltage signal lines H2 in the second display region AA2 in such a manner that in regions that have a same area and in which constant voltage signal lines are arranged, the number of the first constant voltage signal lines H1 in the first display region AA1 is not greater than the number of the second constant voltage signal lines H2 in the second display region AA2. In this way, the number of the first constant voltage signal lines H1 set in the first display region AA1 can be decreased, which reduces an area of a non-light transmission region of the first display region AA1 and increases an area of a light transmission region correspondingly, thereby improving light transmittance of the first display region AA1. With such configuration, the display panel can be applied in the photosensitive device solution, to meet a relatively high requirement of a photosensitive device on the light transmittance of the display panel.

In an embodiment, the non-light transmission region of the first display region AA1 is a region that has a relatively low light transmittance in the first display region AA1, the first display region AA1 further includes the light transmission region, and a light transmittance of the light transmission region is greater than a light transmittance of the non-light transmission region. In some embodiments, the non-light transmission region surrounds the light transmission region. In some embodiments, in the first display region AA1, the non-light transmission region is formed by regions in which a light-emitting device, a pixel circuit, and a trace are located in a direction perpendicular to a plane of the substrate, and an overlapping region thereof. In some embodiments, a shading layer (made of metal or resin) is set in the first display region AA1, and a shading layer has an opening. A non-light transmission region is a region jointly formed by a light-emitting device, a pixel circuit, a trace, and the shading layer that are located in a direction perpendicular to the plane of the substrate. A light transmission region is formed by a region where the opening of the shading layer is located. When such structure is applied in an under-screen photosensitive device solution, ambient light is received by a photosensitive surface of a photosensitive device after passing through the display panel from a light transmission region of the first display region AA1. Therefore, an area size of the light transmission region of the first display region AA1 has a relatively great impact on light transmittance obtained when the ambient light passes through the first display region AA1. An area of the non-light transmission region of the first display region AA1 can be reduced to correspondingly increase an area of the light transmission region of the first display region AA1, to further improve the light transmittance of the first display region, thereby improving application performance of the photosensitive device.

In an embodiment of the present disclosure, the display region includes pixel circuit groups, each of which includes at least two pixel circuits arranged in the second direction. The pixel circuits in the pixel circuit group is arranged in a direction different from the extension direction of the constant voltage signal line defined in the embodiment of the present disclosure. In the first display region, the pixel circuit group can be understood as a set of minimum pixel circuits that can drive one pixel unit to emit white light. In an embodiment, one pixel unit includes one red light-emitting device that emits red light, one blue light-emitting device that emits blue light, and one green light-emitting device that emits green light. A correspondence between a pixel circuit group of the first display region and light-emitting devices is described with reference to arrangement of the light-emitting devices in the following specific embodiment. In the second display region, a pixel circuit group can be understood with reference to an embodiment. When the number of the pixel circuits in one pixel circuit group in the second display region is the same as the number of the pixel circuits in one pixel circuit group in the first display region, one pixel circuit group in the second display region can drive one pixel unit to emit white light. When the number of the pixel circuits in one pixel circuit group in the second display region is smaller than the number of the pixel circuits in one pixel circuit group in the first display region, the pixel circuits in one pixel circuit group in the second display region can drive only some pixels, in the pixel unit that can emit white light, to emit light.

In some embodiments of the present disclosure, the first display region includes a circuit region and a wiring region. At least one pixel circuit group is provided in the circuit region. In other words, in some embodiments, one pixel circuit group is provided in one circuit region. In some embodiments, two or three pixel circuit groups are provided in one circuit region. In this way, a distance between two adjacent pixel circuit groups is smaller than a distance between two pixel circuit groups that respectively belong to different circuit regions.

In some embodiments, the wiring region is located between adjacent circuit regions, and the wiring region is a region where a signal transmission line segment is provided. It can further be understood as that the pixel circuit and a signal line segment electrically connected to the pixel circuit are provided in the circuit region, and the signal transmission line segment disposed in the wiring region is used to connect signal line segments in adjacent circuit regions.

In some embodiments, some wiring regions are located between adjacent circuit regions, each of some wiring regions is connected to only the circuit region located at one side of the wiring region, and the some wiring regions are used to dispose traces connecting the pixel circuit and the light-emitting device.

In embodiments of the present disclosure, pixel circuit groups is arranged in the first display region AA1, the pixel circuits in the pixel circuit group are arranged in a direction different from an extending direction of the first constant voltage signal line, and the pixel circuits in a same pixel circuit group are electrically connected to a same first constant voltage signal line. In this way, the number of the first constant voltage signal lines in the first display region is decreased. In one aspect, an overall width occupied by the pixel circuit group and a constant voltage signal line connected thereto in the second direction (an arrangement direction of pixel circuits in the pixel circuit group) is reduced. In another aspect, the first constant voltage signal lines in the wiring region between two adjacent circuit regions in the first direction can also be reduced, and a width occupied by the wiring region in the second direction is also reduced. In this way, an area of the non-light transmission region of the first display region can be entirely reduced, and an area of the light transmission region of the first display region is correspondingly increased, which can improve the light transmittance of the first display region. In addition, in the related art, when light passes through the first display region, various traces arranged in the first display region can form diffraction grating, and generate a diffraction of light. For example, when an under-screen photosensitive device is a camera, a diffraction phenomenon affects imaging quality of the camera. In the embodiments of the present disclosure, the quantity of first constant voltage signal lines is reduced in the wiring region, which can also reduce, to some extent, a diffraction phenomenon caused when the light passes through the first display region, and further improve optical performance of an optical device.

Figure 14:
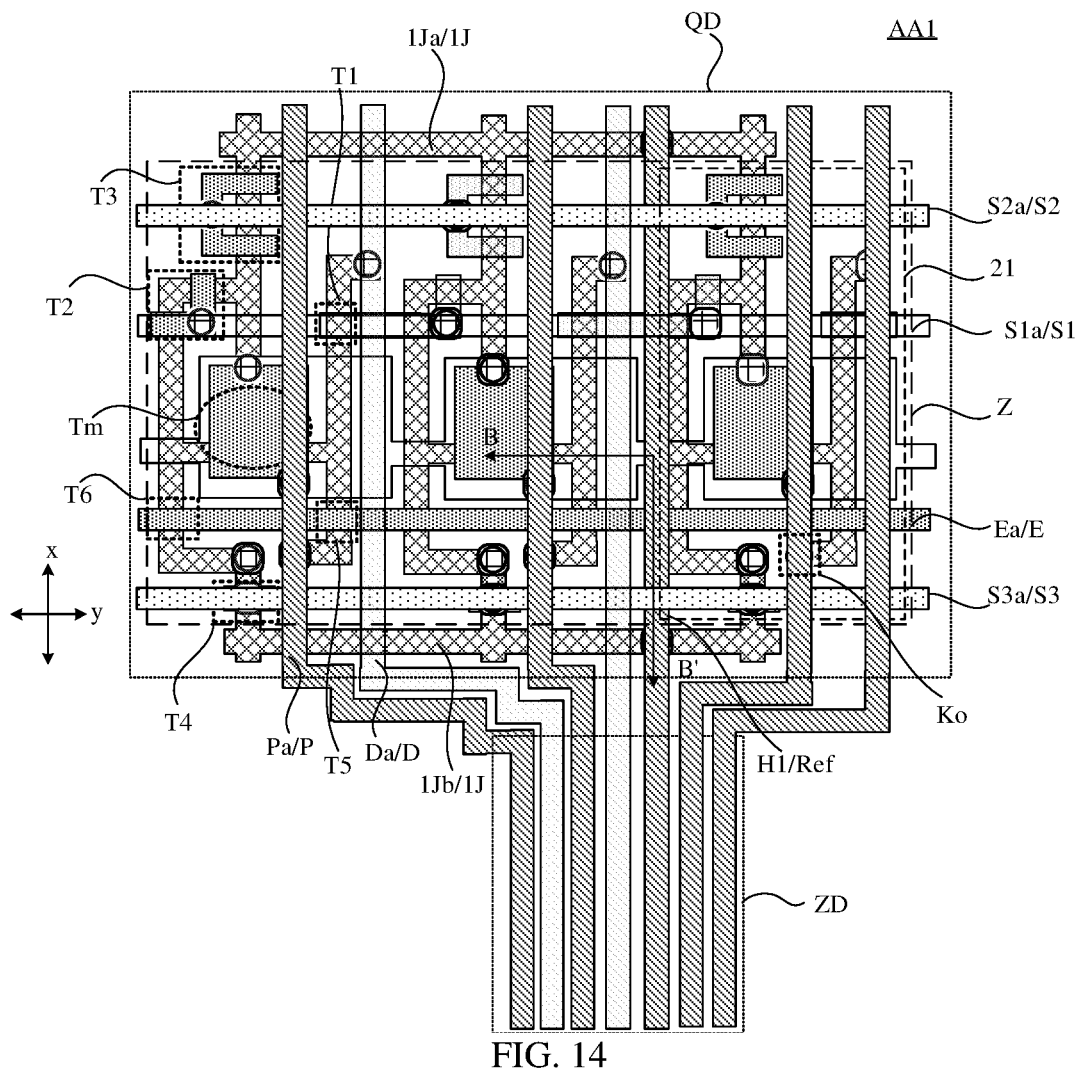
FIG. 14 is a partial schematic view of another display panel according to an embodiment of the present disclosure.

FIG. 14 is a partial schematic view of another display panel according to an embodiment of the present disclosure. In an embodiment, as shown in FIG. 14, in the first display region AA1, the pixel circuit group Z includes three (n=3) pixel circuits 21 arranged in the second direction y. An arrangement direction of the pixel circuit 21 in the pixel circuit group Z intersects an extending direction of a first constant voltage signal line H1. The first display region AA1 includes a circuit region QD. At least one pixel circuit group Z is provided in one circuit region QD. FIG. 14 further shows one wiring region ZD adjacent to the circuit region QD in a first direction. In the first display region AA1, the first constant voltage signal line H1 extends from the circuit region QD to the wiring region ZD. The pixel circuits 21 in a same pixel circuit group Z are electrically connected to a same first constant voltage signal line H1. In this way, the number of the first constant voltage signal lines H1 in the wiring region ZD can be reduced, which reduces a width occupied by the wiring region ZD in the second direction y and facilitates reducing an area of the non-light transmission region of the first display region AA1. In an embodiment, in the first display region AA1, the display panel includes a first connection portion 1J extending along the second direction y. The pixel circuits 21 in a same pixel circuit group Z are connected to the first constant voltage signal line H1 through the first connection portion 1J. An extending direction of the first connection portion 1J is the same (or approximately the same) as a direction along which the pixel circuit 21 in the pixel circuit group Z is arranged, so that one first constant voltage signal line H1 can provide a voltage signal to the pixel circuits 21 in one pixel circuit group Z when the first connection portion 1J is provided. For example, the first connection portion 1J is located in the circuit region QD. When a technological condition is satisfied, a length of the first connection portion 1J is reduced as much as possible, to achieve a relatively small impact on an area of the circuit region QD. In the first display region AA1, the first connection portion 1J is configured to connect an element for receiving the constant voltage signal in the pixel circuit 21 and the first constant voltage signal line H1.

The embodiment of FIG. 14 shows that the first connection portion is provided in the first display region. A second connection portion, a third connection portion, a fourth connection portion, and a fifth connection portion are referred to in some following embodiments. The connection portion in the embodiments of the present disclosure is a connection line segment for connecting two components (the two components can be two signal lines, or the two components can be a transistor and a signal line).

In the first display region AA1 of the present disclosure, the at least two pixel circuits in the pixel circuit group Z are arranged along the second direction y, the first constant voltage signal line H1 extends along the first direction x, and the at least two pixel circuits in one pixel circuit group Z are connected to a same first constant voltage signal line H1. In the embodiment of the present disclosure, "the at least two pixel circuits in the pixel circuit group Z are connected to a same first constant voltage signal line H1" can be understood based on the following description: in a region in which one pixel circuit group Z or a region adjacent to the pixel circuit group Z is located, only a signal line segment belonging to one first constant voltage signal line H1 is provided, and the pixel circuits in the pixel circuit group Z are electrically connected to the first constant voltage signal line H1 through the first connection portion, where the signal line segment and the first constant voltage signal line H1 extend in a same direction, and the signal line segment is a part of the first constant voltage signal line H1. In other words, in the first display region AA1, for the pixel circuits arranged in the second direction y, the at least two pixel circuits correspond to one first constant voltage signal line; one pixel circuit group includes at least two pixel circuits arranged in the second direction y, and for the pixel circuit groups arranged in the first direction x, one column of pixel circuit groups correspond to one first constant voltage signal line.

The structure of the pixel circuit shown in FIG. 14 can be referred to FIG. 4, and details are not described herein again. The display panel is a multi-layer stacking structure. Structures located in different layers in the display panel are connected to each other through via holes of an insulation layer. FIG. 14 marks a via hole position Ko. A first electrode of the first light-emitting control transistor T5 is electrically connected to the power signal line P through a via hole at the via hole position Ko. The via hole at another position in the pixel circuit can be understood with reference to the circuit diagram in FIG. 4 and description of the following embodiment related to a membrane layer structure of a display panel.

The constant voltage signal line shown in the embodiment of FIG. 14 can be a reset signal line Ref.

Figure 15:
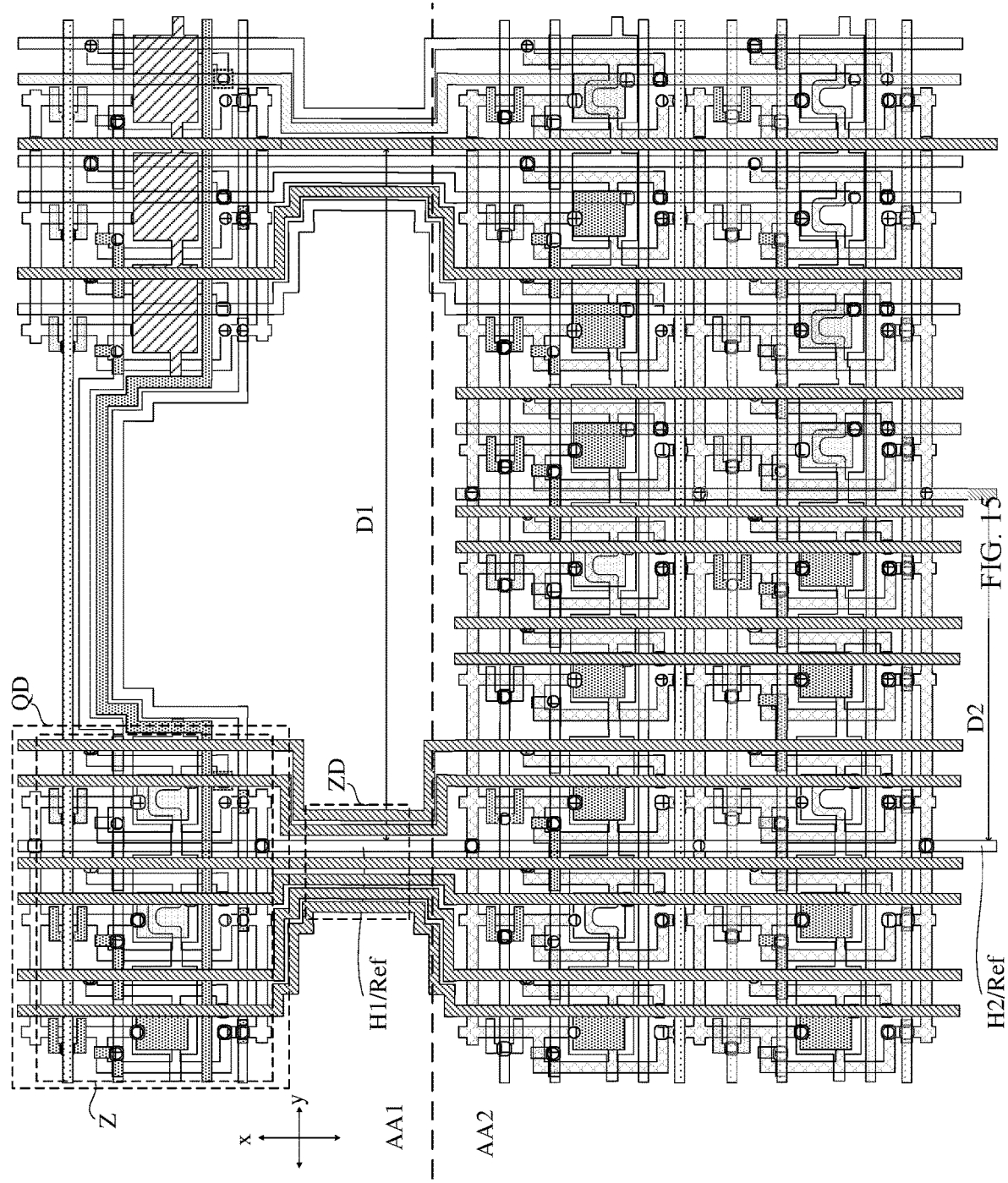
FIG. 15 is a partial schematic view of another display panel according to an embodiment of the present disclosure.

FIG. 15 is a partial schematic view of another display panel according to an embodiment of the present disclosure. An example where the pixel circuits are arranged in a second direction y to form the pixel circuit rows is illustrated. FIG. 15 illustrates one pixel circuit row in a first display region AA1, two pixel circuit rows in a second display region AA2, and a boundary region between the first display region AA1 and the second display region AA2. The first constant voltage signal lines H1 in the first display region AA1 are arranged in a same manner as that in the embodiment of FIG. 14. In the second display region AA2, three pixel circuits sequentially arranged in the second direction y correspond to one second constant voltage signal line H2. In another embodiment, in the second display region AA2, three pixel circuits sequentially arranged in the second direction y correspond to three second constant voltage signal lines H2. In other words, the pixel circuits are arranged in the first direction x to form the pixel circuit column, and one pixel circuit column corresponds to one second constant voltage signal line H2.

In the embodiment of FIG. 15, the reset signal lines Ref include the first constant voltage signal line H1 located in the first display region AA1 and the second constant voltage signal line H2 located in the second display region AA2. A distance D1 between two adjacent first constant voltage signal lines H1 is greater than a distance D2 between two adjacent second constant voltage signal lines H2. FIG. 15 shows that the first constant voltage signal line H1 is connected to the second constant voltage signal line H2. In some embodiments, the first constant voltage signal line H1 and the second constant voltage signal line H2 are not connected to each other. In the embodiments of the present disclosure, a line arrangement of the reset signal line Ref is designed with reference to an arrangement of the pixel circuits 21 in the first display region AA1, which reduces the number of the reset signal lines in the first display region AA1. In one aspect, in the second direction y, only one reset signal line Ref can be disposed in a region corresponding to one pixel circuit group Z, which can reduce a width of a circuit region QD in the second direction y. In another aspect, in an the direction along which the reset signal line Ref extends, the reset signal line Ref extends from the circuit region QD to the wiring region ZD, which can also reduce the number of the reset signal lines Ref in the wiring region ZD, and thus reducing a width of the wiring region in the second direction y. With such configuration, the reset signal lines in the first display region AA1 can be designed in such a manner that an area of non-light transmission traces in the first display region AA1 can be reduced and thus an area of the light transmission region of the first display region AA1 can be increased.

In an embodiment of the present disclosure, the signal lines are classified according to regions in which the line segments of the signal lines are located. At least one signal line can include a signal line sub-segment and a signal line branch segment that are connected to each other, the signal line sub-segment is located in the circuit region, and the signal line branch segment is located in the wiring region. In some embodiments, with regard to one signal line, the signal line branch segment is connected to two adjacent signal line sub-segments. In other words, the signal line branch segment is a signal transmission line segment located in the wiring region, and the signal line sub-segment is a signal line segment located in the circuit region and electrically connected to the pixel circuit.

FIG. 14 shows a power signal line P and a data line D that extend along the first direction x, and a first scanning line S1, a second scanning line S2, a third scanning line S3, and a light-emitting control line E that each extend along the second direction y. The power signal line P includes a power signal line sub-segment Pa located in the circuit region QD, the data line D includes a data line sub-segment Da located in the circuit region QD, the first scanning line S1 includes a first scanning line sub-segment S1a located in the circuit region QD, the second scanning line S2 includes a second scanning line sub-segment S2a located in the circuit region QD, the third scanning line S3 includes a third scanning line sub-segment S3a located in the circuit region QD, and the light-emitting control line E includes a light-emitting control line sub-segment Ea located in the circuit region QD. In the embodiment of FIG. 14 of the present disclosure, the first constant voltage signal line H1 and the data line D extend in substantially same directions.

For example, in the pixel circuit, the first electrode of the first light-emitting control transistor T5 is electrically connected to the power signal line sub-segment Pa, and the first electrode of the data writing transistor T1 is electrically connected to the data line sub-segment Da. The control terminals of the data writing transistors T1 in a same pixel circuit group Z are electrically connected to a same first scanning line sub-segment S1a. In one pixel circuit group Z, the control terminals of the first light-emitting control transistor T5 and the control terminals of the second light-emitting control transistor T6 are electrically connected to a same light-emitting control line sub-segment Ea. The control terminals of the first reset transistors T3 in a same pixel circuit group Z are electrically connected to the second scanning line sub-segment S2a. The control terminals of the second reset transistors T4 in a same pixel circuit group Z are electrically connected to the third scanning line sub-segment S3a.

In an embodiment, referring to FIG. 14 again, the first connection portion 1J includes a first connection sub-portion 1Ja and a second connection sub-portion 1Jb. The second electrodes of the first reset transistors T3 in a same pixel circuit group Z are electrically connected to the first constant voltage signal line H1 through the first connection sub-portion 1Ja, and the second electrodes of the second reset transistors T4 in a same pixel circuit group Z are electrically connected to the first constant voltage signal line H1 through the second connection sub-portion 1Jb. When the pixel circuit 21 operates, the second electrode of the first reset transistor T3 and the second electrode of the second reset transistor T4 receive a voltage signal provided by a same first constant voltage signal line H1. In this implementation, corresponding first connection sub-portion 1Ja and second connection sub-portion 1Jb are provided respectively based on positions of the first reset transistor T3 and the second reset transistor T4 in the pixel circuit, layout of relative positions of the transistors in the pixel circuit does not need to be changed, and the first connection sub-portion 1Ja and the second connection sub-portion 1Jb do not need to bypass lines in the circuit region QD. In this way, the setting of the first connection portion has a relatively small impact on a space occupied by the circuit region QD.

Figure 16:
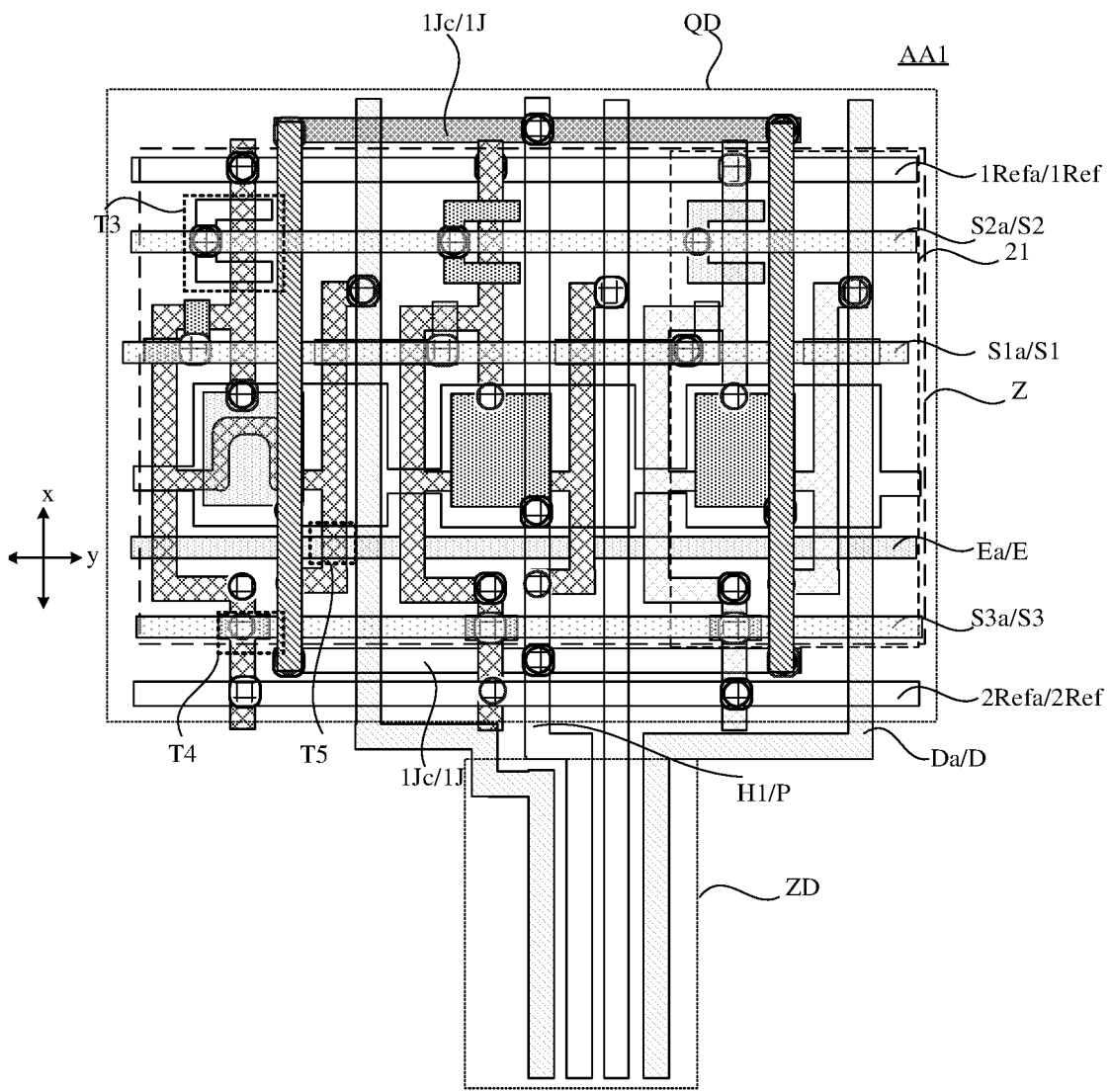
FIG. 16 is a partial schematic view of another display panel according to an embodiment of the present disclosure.
Figure 17:
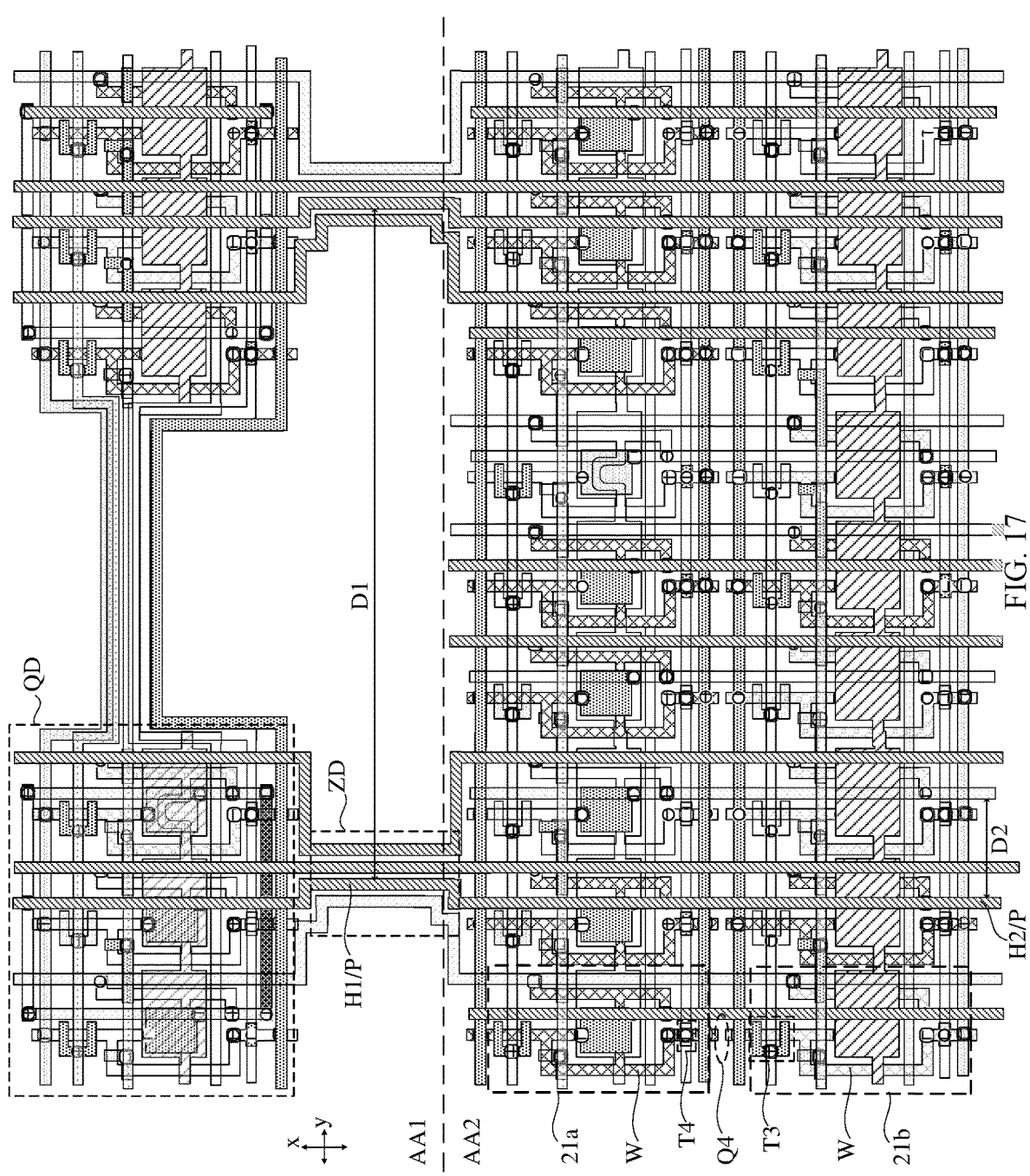
FIG. 17 is a partial schematic view of another display panel according to an embodiment of the present disclosure.

In another embodiment, the constant voltage signal line is a power signal line. FIG. 16 is a partial schematic view of another display panel according to an embodiment of the present disclosure. FIG. 17 is a partial schematic view of another display panel according to an embodiment of the present disclosure. The pixel circuit in FIG. 16 can be referred to the pixel circuit in FIG. 8. FIG. 16 shows only some of the signal lines and some of the transistors. The structures in FIG. 17 same as that in FIG. 14 can be referred to FIG. 14, and details are not repeated herein.

In an embodiment, as shown in FIG. 16, in the first display region AA1, the pixel circuit group Z includes three pixel circuits 21 arranged in the second direction y, and the pixel circuits 21 in a same pixel circuit group Z are electrically connected to a same first constant voltage signal line H1. FIG. 16 shows a first reset signal line 1Ref and a second reset signal line 2Ref. The first reset signal line 1Ref includes a first reset signal line sub-segment 1Refa located in the circuit region QD, and the second electrode of the first reset transistor T3 is electrically connected to the first reset signal line sub-segment 1Refa. The second reset signal line 2Ref includes a second reset signal line sub-segment 2Refa located in the circuit region QD, and the second electrode of the second reset transistor T4 is electrically connected to the second reset signal line sub-segment 2Refa.

In an embodiment, the first connection portion 1J includes a third connection sub-portion 1Jc, and the first electrodes of the first light-emitting control transistors T5 in a same pixel circuit group Z are electrically connected to the first constant voltage signal line H1 through the third connection sub-portion 1Jc. The third connection sub-portion 1Jc is designed based on positions of the first light-emitting control transistors T5 in the pixel circuit, the layout of positions of the transistors in the pixel circuit does not need to be changed, and the third connection sub-portion does not need to bypass lines in the circuit region QD. The setting of the third connection sub-portion has a relatively small impact on a space occupied by the circuit region QD.

In the embodiment of FIG. 16, an extending direction of the first constant voltage signal line H1 is approximately the same as an extending direction of the data line D. The reset signal line Ref extends along the second direction y. In an embodiment, the first signal lines extending along the first direction x include the power signal line P and the data line D, and the second signal lines, each of which extends along the second direction y, include the first scanning line S1, the second scanning line S2, the third scanning line S3, the light-emitting control line E, and the reset signal line Ref.

The first constant voltage signal line H1 in the embodiment of FIG. 16 is the power signal line P. FIG. 16 show one circuit region QD and one wiring region ZD. The first constant voltage signal line H1 extends from the circuit region QD to the wiring region ZD. The pixel circuits 21 in one pixel circuit group Z in the first display region AA1 are electrically connected to a same power signal line P, which can reduce the number of the first power signal lines each extending to the wiring region ZD. Therefore, a width occupied by the wiring region ZD in the second direction y can be reduced, which reduces the area of the non-light transmission traces in the first display region AA1.

That the pixel circuits are arranged in the second direction y to form the pixel circuit rows is illustrated as an example. FIG. 17 shows one pixel circuit row in the first display region AA1, two pixel circuit rows in the second display region AA2, and a boundary region between the first display region AA1 and the second display region AA2. The constant voltage signal line in the embodiment of FIG. 17 is the power signal line P. The first constant voltage signal lines H1 in the first display region AA1 are arranged in a same manner as that in the embodiment of FIG. 16. In the second display region AA2, three pixel circuits sequentially arranged in the second direction y correspond to three second constant voltage signal lines H2. In other words, the pixel circuits are arranged in the first direction x to form the pixel circuit column, and one pixel circuit column corresponds to one second constant voltage signal line H2. In another embodiment, in the second display region AA2, three pixel circuits sequentially arranged in the second direction y correspond to one second constant voltage signal line H2.

In an embodiment of FIG. 17, the power signal lines include the first constant voltage signal line H1 located in the first display region AA1 and the second constant voltage signal line located in the second display region AA2. A distance D1 between two adjacent first constant voltage signal lines H1 can be greater than a distance D2 between two adjacent second constant voltage signal lines H2. FIG. 17 shows that the first constant voltage signal line H1 is connected to the second constant voltage signal line H2. In some embodiments, the first constant voltage signal line H1 cannot be connected to the second constant voltage signal line H2. In this embodiment of the present disclosure, a line arrangement manner of the power signal line P is designed with reference to an arrangement manner of the pixel circuits 21 in the first display region AA1, and in a direction along which the power signal line P extends, the power signal line P extends from the circuit region QD to the wiring region ZD. In this way, of the number of the power signal lines P in the wiring region ZD can be reduced, which can reduce a width of the wiring region ZD in the second direction y. The power signal line in the first display region AA1 is designed, to in such manner that an area of the lines in the non-light transmission region is reduced and then an area of the light transmission region of the first display region AA1 is increased.

In an embodiment, as shown in FIG. 17, at a position of a region Q4, corresponding semiconductor layers W in two adjacent pixel circuits (a pixel circuit 21a and a pixel circuit 21b) in the first direction x (that is, a column direction) are disconnected from each other, so that a first reset transistor T3 of the pixel circuit 21b and a second reset transistor T4 of the pixel circuit 21a are not connected to each other. In this embodiment, for one pixel circuit, the second electrode of the first reset transistor T3 and the second electrode of the second reset transistor T4 are connected to different reset signal lines. As shown in FIG. 16, the second electrode of the first reset transistor T3 is electrically connected to the first reset signal line 1Ref, and the second electrode of the second reset transistor T4 is electrically connected to the second reset signal line 2Ref. With such configuration where corresponding semiconductor layers W in two pixel circuits adjacent to each other in the first direction x are disconnected from each other, a case in which a voltage signal received by the second electrode of the second reset transistor T4 of the pixel circuit 21a is interfered by a reset signal from the first reset signal line connected to the first reset transistor T3 of the pixel circuit 21b when the control terminal of the drive transistor is reset after the first reset transistor T3 is turned on, can be eliminated. That is, when the pixel circuit 21a operates, the second electrode of the second reset transistor T4 can receive a reset signal from the second reset signal line to reset the first electrode of the light-emitting device. In other words, when one pixel circuit operates, the second electrode of the first reset transistor and the second electrode of the second reset transistor can receive different reset signals, respectively.

FIG. 18 is a partial schematic view of another display panel according to an embodiment of the present disclosure. FIG. 18 shows one circuit region QD in a first display region AA1. In another embodiment, the first signal lines extending in the first direction x, include a power signal line P, a data line D, and a reset signal line Ref; and the second signal lines, each of which extends in the second direction y, include a first scanning line S1, a second scanning line S2, a third scanning line S3, and a light-emitting control line E. The pixel circuits 21 in a same pixel circuit group Z are connected to a same reset signal line Ref. For example, the second electrodes of the first reset transistors T3 in a same pixel circuit group Z are electrically connected to the reset signal line Ref through the first connection sub-portion 1Ja, and the second electrodes of the second reset transistors T4 in a same pixel circuit group Z are electrically connected to the reset signal line Ref through the second connection sub-portion 1Jb. The pixel circuits 21 in a same pixel circuit group Z are connected to a same power signal line P. For example, the first electrodes of the first light-emitting control transistors T5 in a same pixel circuit group Z are electrically connected to the power signal line P through the third connection sub-portion 1Jc. In this implementation, the reset signal line Ref and the power signal line P that are located in in the first display region AA1 are designed, which can reduce the area of the non-light transmission region and then increase an area of the light transmission region of the first display region AA1.

The following shows a layer structure of a display panel according to an embodiment of the present disclosure, to describe positions of layers at which the signal lines and the structures in a pixel circuit are located.

FIG. 19 is a cross-sectional view along tangent B-B' in FIG. 14. In an embodiment, as shown in FIG. 19, a display panel includes a substrate 10, and a semiconductor layer W, a first metal layer M1, a second metal layer M2, a third metal layer M3, and a fourth metal layer M4 that are located on the substrate 10 and disposed away from the substrate 10. The display panel can further include insulation layers, one of which is located between adjacent metal layers, and another one of which is located between a semiconductor layer and a metal layer. The semiconductor layer W can be made of any one of silicon and metal oxide. In an embodiment, the semiconductor layer W includes low temperature polycrystalline. In another embodiment, the semiconductor layer W includes indium gallium zinc oxide.

In an embodiment, the pixel circuit 21 includes a channel and a storage capacitor Cst. For example, each transistor of the pixel circuit 21 includes a channel. FIG. 19 shows a channel m of the drive transistor Tm, and the channel m is located in the semiconductor layer W. The storage capacitor Cst includes a first electrode plate Ca and a second electrode plate Cb. The first electrode plate Ca is located in the first metal layer M1, and the second electrode plate Cb is located in the second metal layer M2. The light-emitting control line sub-segment Ea is located in the first metal layer M1, the third scanning line sub-segment S3a is located in the third metal layer M3, and the data line sub-segment Da is located in the fourth metal layer M4. FIG. 19 further shows that the first constant voltage signal line H1 is located in the fourth metal layer M4. The second connection sub-portion 1Jb is located in the semiconductor layer W, and the second connection sub-portion 1Jb is electrically connected to the first constant voltage signal line H1 through a via hole K of the insulation layer. In some embodiments, the first constant voltage signal line H1 and the data line extend in a same direction, and the first constant voltage signal line H1 and the data line sub-segment Da are located in a same metal layer. The first constant voltage signal line H1 and the signal line that extends in a same direction as the first constant voltage signal line H1 are disposed in a same metal layer, which can arrange the signal lines having a same extending direction in a same layer on the premise that different signal lines extending in a same direction are insulated from each other, and thus can reduce the number of the metal layers in the display panel. In the display panel, the signal lines and other elements that are located in the metal layers can be manufactured using photoetching process, and structures located in a same metal layer can be manufactured by using a same photoetching process. The number of the metal layers is related to the manufacturing process of the photoetching process, which reduce the number of the manufacturing processes of the photoetching technique by reducing the number of the metal layers in the display panel, thereby simplifying the manufacturing process and reducing process cost.

FIG. 19 only illustrates that the first connection portion 1J is located in the semiconductor layer W. In some embodiments, the first connection portion 1J is located at any one of the first metal layer M1, the second metal layer M2, and the third metal layer M3, which in not repeated herein. In a case where the first connection portions has a same length, the first connection portion disposed in the metal layer can reduce a resistance of the first connection portion, thereby reducing a voltage drop of a voltage signal transmitted on the first constant voltage signal line.

In some embodiments, the first connection portions are located in two or more layers of the semiconductor layer W, the first metal layer M1, the second metal layer M2, and the third metal layer M3. Taking the first connection sub-portion 1Ja as an example, in an example case where the first connection sub-portion 1Ja includes a first sub-portion located in the semiconductor layer W and a second sub-portion located in the first metal layer M1, the first sub-portion and the second sub-portion at least partially overlap and are connected in parallel, which can reduce the resistance of the first connection sub-portion 1Ja. The first sub-portion and the second sub-portion are equivalent to two layers of traces. That is, in this embodiment, the first connection portion is set to be two or more layers of traces connected in parallel, which can reduce an overall resistance of the first connection portion, and further reduce an overall voltage drop of the constant voltage signal lines.

In an embodiment, as shown in FIG. 14, the first scanning line sub-segment S1a and the second scanning line sub-segment S2a that are located in the circuit region QD are located in the third metal layer M3. That is, the first scanning line sub-segment S1a, the second scanning line sub-segment S2a, and the third scanning line sub-segment S3a are located in a same layer. The power signal line sub-segment Pa is located in the fourth metal layer, that is, the power signal line sub-segment Pa and the data line sub-segment Da are located in a same metal layer.

In an embodiment, as shown in FIG. 16, the channel m is located in the semiconductor layer W, the first electrode plate Ca of the storage capacitor Cst is located in the first metal layer M1, and the second electrode plate Cb is located in the second metal layer M2; the light-emitting control line sub-segment Ea, the first reset signal line sub-segment 1Refa, and the second reset signal line sub-segment 2Refa are located in the first metal layer M1; the three scanning line sub-segments are located in the third metal layer M3; and the data line sub-segment Da and the first constant voltage signal line H1 are located in the fourth metal layer M4.

In an embodiment of the present disclosure, the display panel includes the semiconductor layer on the substrate, and the first metal layer, the second metal layer, the third metal layer, and the fourth metal layer that are sequentially located on the semiconductor layer away from the substrate. The channels of the transistors in the pixel circuit are located in the semiconductor layer. The first electrode plate of the storage capacitor is located in the first metal layer, and the second electrode plate of the storage capacitor is located in the second metal layer. The data line, the scanning line (including the first scanning line, the second scanning line, and the third scanning line), the reset signal line, the power signal line, and the light-emitting control line are approximately arranged in the four metal layers (the first metal layer, the second metal layer, the third metal layer, and the fourth metal layer), respectively.

In some embodiments, the first metal layer and the second metal layer are made of a same material, and the third metal layer and the fourth metal layer are made of a same material. The first metal layer and the second metal layer are made of a material including molybdenum. The third metal layer and the fourth metal layer are made of a material including one or more of titanium, aluminum, and molybdenum. In an embodiment, the third metal layer and the fourth metal layer each has a titanium/aluminum/titanium three-layer structure.

In another embodiment, the third metal layer and the fourth metal layer have a molybdenum/aluminum/molybdenum three-layer structure.

Figure 20:
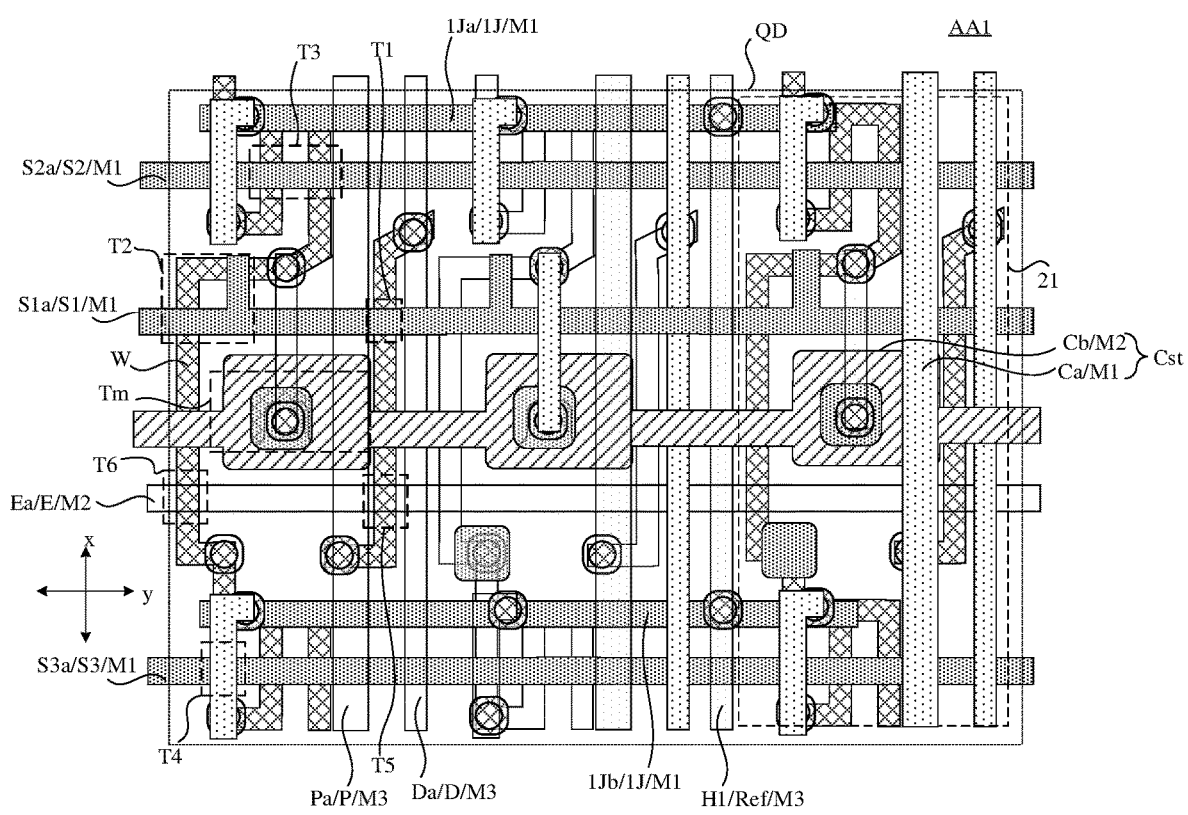
FIG. 20 is a partial schematic view of another display panel according to an embodiment of the present disclosure.

FIG. 20 is a partial schematic view of another display panel according to an embodiment of the present disclosure. FIG. 20 shows a drive transistor Tm, and another transistor in a pixel circuit. The pixel circuit in FIG. 20 can be referred to the pixel circuit shown in FIG. 4. In another embodiment, FIG. 20 shows one circuit region QD in the first display region AA1, one pixel circuit group is provided in the circuit region QD, and the pixel circuit group includes three pixel circuits 21 arranged in the second direction y. The power signal line sub-segment Pa, the data line sub-segment Da, the first scanning line sub-segment S1a, the second scanning line sub-segment S2a, the third scanning line sub-segment S3a, and the light-emitting control line sub-segment Ea, and the first constant voltage signal line H1 that are electrically connected to the pixel circuit 21 are provided in the circuit region QD, and the connection between the signal line sub-segments and the transistors in the pixel circuit 21 can be referred to the descriptions in the embodiment of FIG. 14, which will not be repeated herein. The pixel circuits 21 in one pixel circuit group are connected to a same first constant voltage signal line H1 through the first connection portion 1J.

Channels of the transistors in the pixel circuit shown in an embodiment of FIG. 20 can be located in the semiconductor layer W. The first electrode plate Ca of the storage capacitor Cst, the first scanning line sub-segment S1a, the second scanning line sub-segment S2a, and the third scanning line sub-segment S3a are located in the first metal layer M1. The second electrode plate Cb of the storage capacitor Cst and the light-emitting control line sub-segment Ea are located in the second metal layer M2. The data line sub-segment Da and the power signal line sub-segment Pa are located in the third metal layer M3. The first constant voltage signal line H1 is located in the third metal layer M3. That is, the first constant voltage signal line H1 and the data line sub-segment Da are located in a same metal layer. The first constant voltage signal line H1 and the signal line that extends in a same direction as the first constant voltage signal line H1 are disposed in a same metal layer. With such configuration, the signal lines extending in a same direction are disposed in a same layer on the premise that different signal lines extending in a same direction are insulated from each other, which can reduce the number of the metal layers in the display panel. In the display panel, the signal lines and other elements that are located in the metal layer can be manufactured using photoetching process, and the structures located in a same metal layer can be manufactured using a same photoetching process. The number of the metal layers is related to a manufacturing process of the photoetching process. The number of the manufacturing processes of the photoetching process can be reduced by reducing the number of the metal layers in the display panel, thereby simplifying the manufacturing process and reducing the process cost.

In some embodiments, the first metal layer and the second metal layer are made of a same material. The first metal layer and the second metal layer can be made of a material including molybdenum, and the third metal layer can be made of a material including one or more of titanium, aluminum, and molybdenum. In an embodiment, the third metal layer has a titanium/aluminum/titanium three-layer structure. In another embodiment, the third metal layer has a molybdenum/aluminum/molybdenum three-layer structure.

In an embodiment, the first constant voltage signal line H1 is a reset signal line Ref, the first connection portion 1J includes a first connection sub-portion 1Ja and a second connection sub-portion 1Jb, and the first connection sub-portion 1Ja and the second connection sub-portion 1Jb are located in the first metal layer M1.

The pixel circuit in the embodiment of FIG. 20 is the same as the pixel circuit in the embodiment of FIG. 14, and a difference therebetween lies in the layer structure of the display panel. In an embodiment, as shown in FIG. 14, the lines are arranged in the semiconductor layer and the four metal layers that are located on the substrate to the form the pixel circuit driving the light-emitting device. In an embodiment, as shown in FIG. 20, the semiconductor layer and the three metal layers that are located on the substrate, to form the pixel circuit and the signal lines connected to the pixel circuit.

In an embodiment, as shown in FIG. 20, the light-emitting control line sub-segment Ea is located in the second metal layer M2. In another embodiment, the light-emitting control line sub-segment Ea is located in the first metal layer M1, and layer positions of other signal lines are the same as those in FIG. 20, which will not be repeated herein.

FIG. 20 exemplarily illustrates that the first connection portion 1J is located in the first metal layer M1. In some embodiments, the first connection portion 1J is located in the semiconductor layer W or the second metal layer M2. In a case where lengths of the first connection portions are the same, the first connection portions are disposed in the metal layers, which can reduce the resistance of the first connection portions, thereby reducing the voltage drop of the voltage signal transmitted on the first constant voltage signal line.

In some embodiments, the first connection portion 1J is located in at least two layers of the semiconductor layer, the first metal layer, and the second metal layer. That is, the first connection portion is contrasted with two or three layers of traces connected in parallel, which can reduce an overall resistance of the first connection portion and further reduce an overall voltage drop of the constant voltage signal line.

Figure 21:
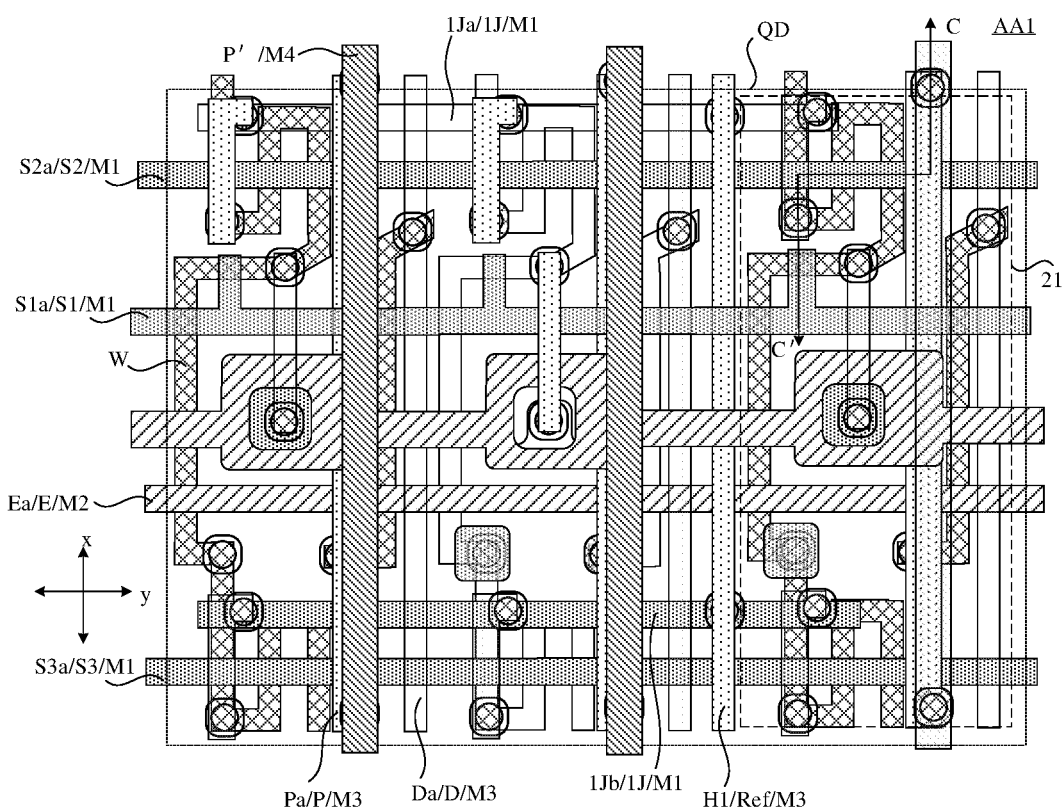
FIG. 21 is a partial schematic view of another display panel according to an embodiment of the present disclosure.
Figure 22:
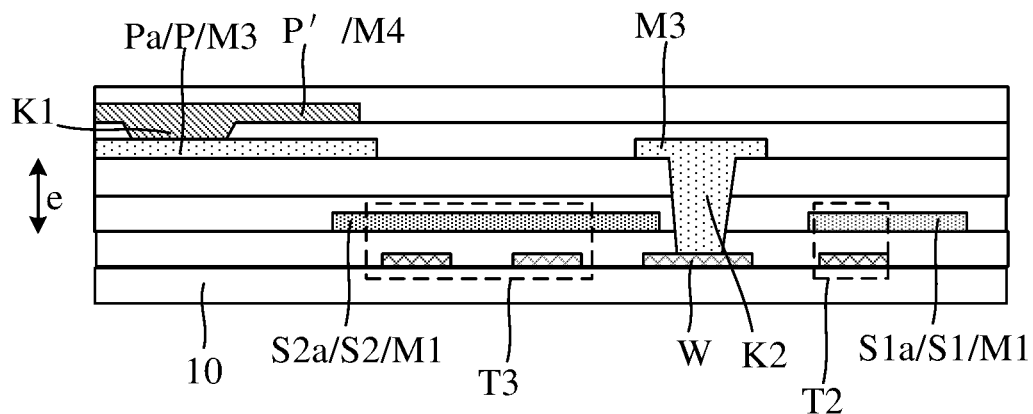
FIG. 22 is a cross-sectional view along a line C-C' in FIG. 21 according to an embodiment of the present disclosure.

In an embodiment, the display panel further includes a fourth metal layer. In an embodiment, the fourth metal layer and the third metal layer are made of a same material. FIG. 21 is a partial schematic view of another display panel according to an embodiment of the present disclosure. FIG. 22 is a cross-sectional view along tangent C-C' in FIG. 21. A line arrangement manner of the circuit region QD in FIG. 21 is substantially the same as a line arrangement manner of the circuit region QD in an embodiment in FIG. 20, and the structure in the FIG. 21 and FIG. 22 same as the structure in FIG. 20, and the same structure can be referred to FIG. 20, which will not be repeated herein.

As shown in FIG. 21 and FIG. 22, the display panel can further include an auxiliary power supply line P' located in the fourth metal layer M4, and the power signal line sub-segment Pa is located in the third metal layer M3. In a direction e perpendicular to a plane of the substrate 10, the auxiliary power signal line P' and the power signal line sub-segment Pa at least partially overlap, and the auxiliary power signal line P' is electrically connected, through a via hole K1, to the power signal line sub-segment Pa overlapped with the auxiliary power signal line P'. The auxiliary power signal line P' and the power signal line sub-segment Pa are connected in parallel, which can reduce the voltage drop loss on the power signal line and further reduce power consumption of the display panel.

FIG. 22 further illustrates the threshold compensation transistor T2 and the first reset transistor T3 in a pixel circuit. In FIG. 22, the second electrode of the first reset transistor T3 can be electrically connected to the first constant voltage signal line H1 (namely, a reset signal line Ref) through a via hole K2.

In some embodiments, in the pixel circuit shown in FIG. 4 and FIG. 8, the control terminal of the first reset transistor T3 is electrically connected to the second scanning line S2, and the control terminal of the second reset transistor T4 is electrically connected to the third scanning line S3. That is, In some embodiments, the first reset transistor T3 and the second reset transistor T4 are controlled by different scanning lines. For example, four groups of drive circuits are disposed in a non-display region in the display panel to provide a signal to the first scanning line, the second scanning line, the third scanning line, and the light-emitting control line that are located in the display region.

Figure 23:
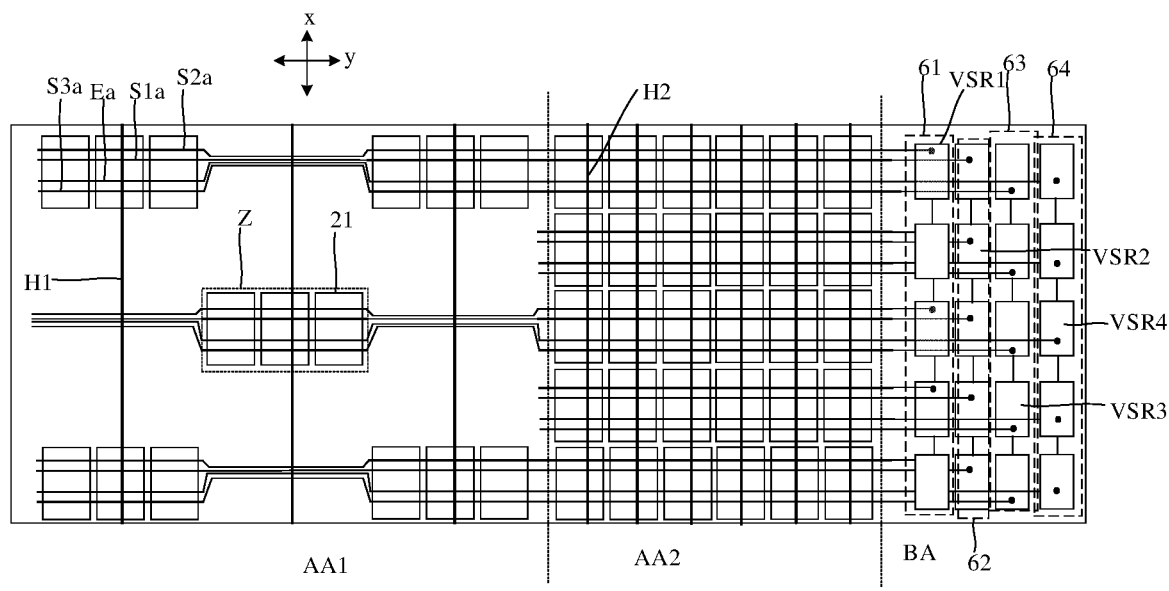
FIG. 23 is a partial schematic view of another display panel according to an embodiment of the present disclosure.

FIG. 23 is a partial schematic view of another display panel according to an embodiment of the present disclosure. In an embodiment, as shown in FIG. 23, the display panel further has a non-display region BA, in which a first scanning drive circuit 61, a second scanning drive circuit 62, a third scanning drive circuit 63, and a light-emitting drive circuit 64 are provided. The first scanning drive circuit 61 includes first shift registers VSR1 that are cascaded, and the second scanning line sub-segment S2a corresponding to one pixel circuit group Z extends into the non-display region BA to be electrically connected to an output terminal of one first shift register VSR1. The second scanning drive circuit 62 includes second shift registers VSR2 that are cascaded, and the first scanning line sub-segment S1a corresponding to one pixel circuit group Z extends into the non-display region BA to be electrically connected to an output terminal of the second shift register VSR2. The third scan drive circuit 63 includes third shift registers VSR3 that are cascaded, and the third scanning line sub-segment S3a corresponding to one pixel circuit group Z extends into the non-display region BA to be electrically connected to an output terminal of the third shift register VSR3. The light-emitting drive circuit 64 includes fourth shift registers VSR4 that are cascaded, and the light-emitting control line sub-segment Ea corresponding to one pixel circuit group Z extends into the non-display region BA to be electrically connected to an output terminal of the fourth shift register VSR4.

In some embodiments, in the pixel circuit shown in FIG. 6, both the control terminal of the first reset transistor T3 and the control terminal of the second reset transistor T4 are electrically connected to the second scanning line S2. When the pixel circuit operates, the control terminal of the first reset transistor T3 and the control terminal of the second reset transistor T4 receive a same control signal. That is, the control terminal of the drive transistor Tm and the first electrode of the light-emitting device are simultaneously reset. An embodiment where the control terminal of the first reset transistor T3 and the control terminal of the second reset transistor T4 receive a same control signal with reference to the embodiment of FIG. 6. The same structures in the following embodiments of FIG. 24 and FIG. 25 as those in the embodiment of FIG. 14 can be referred to the embodiment of FIG. 14, which will not be repeated herein.

Figure 24:
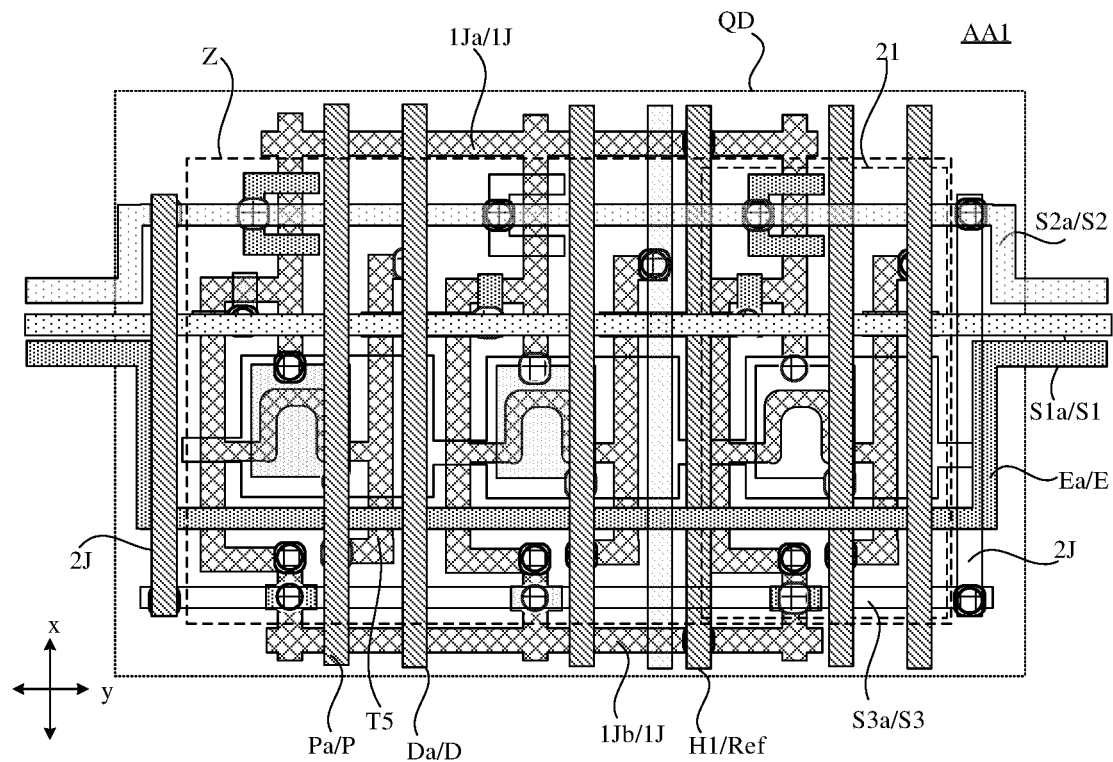
FIG. 24 is a partial schematic view of another display panel according to an embodiment of the present disclosure.

FIG. 24 is a partial schematic view of another display panel according to an embodiment of the present disclosure. In an embodiment, FIG. 24 shows one circuit region QD in a first display region AA1, the display panel further includes a second connection portion 2J, and on edges of two opposite sides of the pixel circuit group Z that are arranged along the second direction y, the second scanning line sub-segment S2*a* and the third scanning line sub-segment S3*a* are electrically connected to each other through the second connection portion 2J. The pixel circuit group Z includes at least two pixel circuits. The pixel circuit includes a drive transistor and switch transistors. Taking the region in which the transistors are arranged in the at least two pixel circuits as a whole, an edge of the pixel circuit group Z can be understood as a periphery of the regions in which the transistors are arranged in the at least two pixel circuits. In this implementation, the second connection portion is disposed on the edge of the pixel circuit group, which does not affect line arrangement of the pixel circuits in the pixel circuit group. With such configuration where the scanning lines extend from the circuit region to the wiring region, the number of the scanning lines in the wiring region can be reduced, thereby reducing the space occupied by the non-light transmission region and correspondingly increasing the area of the light transmission region of the first display region.

Figure 25:
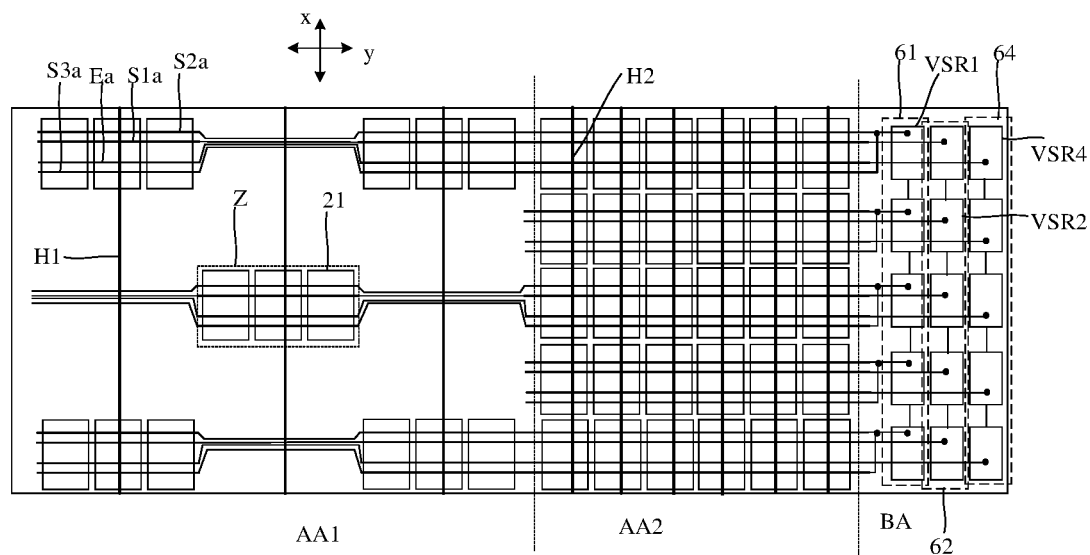
FIG. 25 is a simplified partial schematic view of another display panel according to an embodiment of the present disclosure.

FIG. 25 is a partial simplified schematic diagram of another display panel according to an embodiment of the present disclosure. A structure of the pixel circuit in FIG. 25 is shown in only a simplified manner. In an embodiment, as shown in FIG. 25, the display panel further has a non-display region BA, in which a first scanning drive circuit 61 is provided, and the first scanning drive circuit 61 includes first shift registers VSR1 that are cascaded. The second scanning line sub-segment S2*a* and the third scanning line sub-segment S3*a* that correspond to one pixel circuit group Z extend into the non-display region BA to be electrically connected to an output terminal of a same first shift register VSR1. In an embodiment, the display panel further includes a second scan drive circuit 62 and a light-emitting drive circuit 64 that are located in the non-display region BA. The second scan drive circuit 62 includes second shift registers VSR2 that are cascaded, and the first scanning line sub-segment S1*a* corresponding to one pixel circuit group Z extends into the non-display region BA to be electrically connected to an output terminal of the second shift register VSR2. The light-emitting drive circuit 64 includes fourth shift registers VSR4 that are cascaded. A light-emitting control line sub-segment E*a* corresponding to one pixel circuit group Z extends into the non-display region BA to be electrically connected to an output terminal of the fourth shift register VSR4. With such configuration, one group of drive circuits in the non-display region can be reduced, which can reduce the space occupied by the non-display region, and can increase a screen-to-body ratio of the display panel.

Relative positions of the first constant voltage signal line and the pixel circuit group corresponding thereto in the first display region are described in the following embodiments.

In an embodiment, in the first display region AA1, as shown in FIG. 14, the first constant voltage signal line H1 electrically connected to the pixel circuit group Z is located between two adjacent pixel circuits 21 in the pixel circuit group Z. Since line arrangement of pixel circuits 21 in the display panel are relatively complex, in order to ensure space utilization, there can be no relatively large blank space between adjacent pixel circuits 21 for disposing traces. Therefore, the first constant voltage signal line H1 can overlap some structures of the pixel circuit 21. The overlapping indicates that the orthographic projections of two or more structures overlap in a direction perpendicular to the plane of the substrate. For example, the first constant voltage signal line H1 overlaps the semiconductor layer W. In the embodiment of the present disclosure, that the first constant voltage signal line H1 is located between two adjacent pixel circuits 21 can be understood as: the first constant voltage signal line H1 is located between centers of the two adjacent pixel circuits 21, and the center of the pixel circuit 21 is located in a region in which the drive transistor Tm is located. The first constant voltage signal line H1 is disposed between two adjacent pixel circuits 21 in the pixel circuit group corresponding to the first constant voltage signal line H1. In other words, for one first constant voltage signal line H1, the pixel circuits 21 that are located at two sides of the first constant voltage signal line H1 and that are electrically connected to the first constant voltage signal line H1, are located in a same pixel circuit group Z. With such configuration of the first constant voltage signal line H1, a length of the first connection portion 1J can be shortened as much as possible, which can reduce the space occupied by the entire circuit region QD. In a case where the first constant voltage signal line H1 extends from the circuit region QD into the wiring region, the signal lines each extending in a same direction as the first constant voltage signal line H1 are all converged to a first virtual center line in the circuit region QD (a trace convergence manner shown in FIG. 29) in the wiring region, which can reduce bypassing of the signal lines, can reduce the space occupied by the entire circuit region QD, and correspondingly increase the area of the light transmission region of the first display region AA1.

Figure 26:
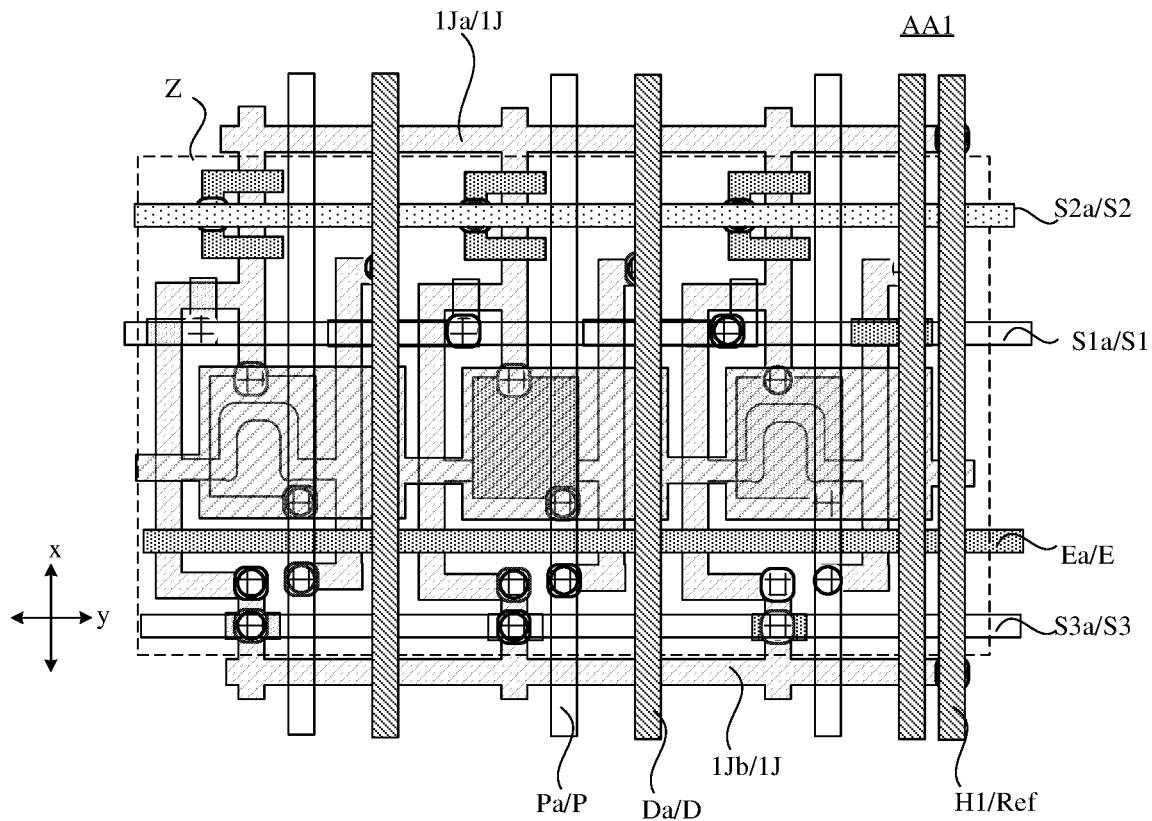
FIG. 26 is a partial schematic view of another display panel according to an embodiment of the present disclosure.

FIG. 26 is a partial schematic view of another display panel according to an embodiment of the present disclosure. In an embodiment, as shown in FIG. 26, in the first display region AA1, the first constant voltage signal line H1 electrically connected to one pixel circuit group Z is located on an edge of the pixel circuit group Z. The edge of the pixel circuit group Z can be understood as an edge of a region occupied by the transistors arranged in the pixel circuit group Z. In this case, primary structures (the drive transistor and the switch transistors) of the pixel circuits 21 in the pixel circuit group Z are all located at a same side of the first constant voltage signal line H1. FIG. 26 shows that the drive transistors of the pixel circuits 21 are all located at a left side of the first constant voltage signal line H1. This implementation can be applied in corporation with a line arrangement manner in the wiring region, for example, being combined with a convergence manner of the signal lines in the wiring region in the following embodiment in FIG. 32. In this way, bypassing of the signal lines when the first constant voltage signal line extends from the circuit region QD to the wiring region can be reduced, and an area of the light transmission region between two adjacent circuit regions can be increased as much as possible, which can reduce diffraction caused when ambient light passes through the first display region. When such configuration is applied in an under-screen photosensitive device solution, the optical performance of the photosensitive device can be improved.

Figure 27:
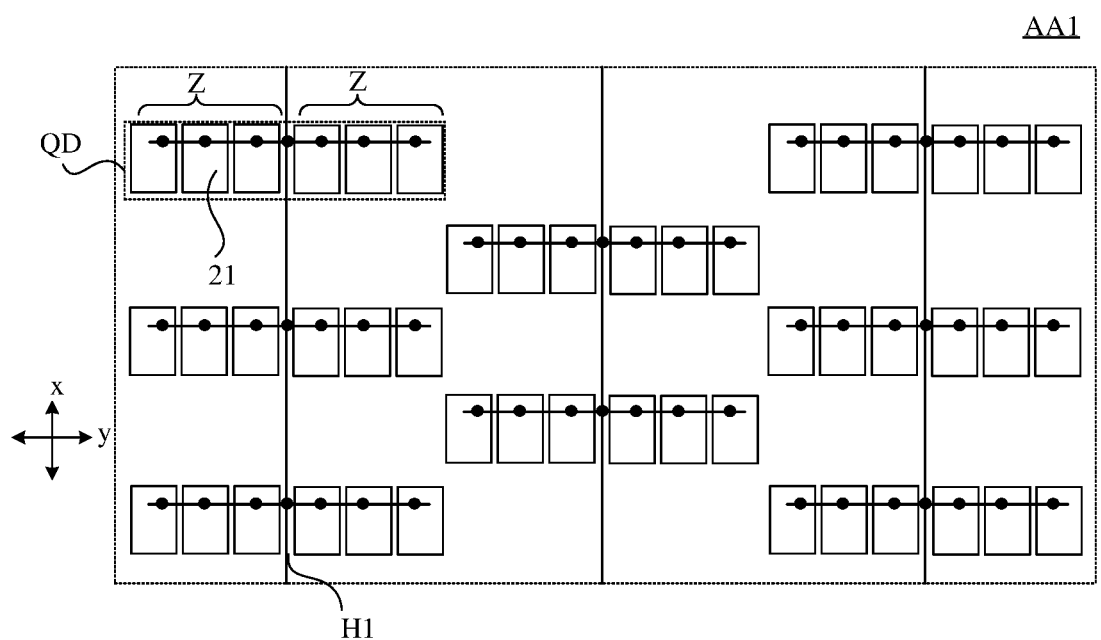
FIG. 27 is a partial schematic view of another display panel according to an embodiment of the present disclosure.

FIG. 27 is a partial schematic view of another display panel according to an embodiment of the present disclosure. The pixel circuit structures in FIG. 27 are all shown in a simplified manner. In an embodiment, as shown in FIG. 27, in the first display region AA1, the pixel circuit groups Z located at two sides of one first constant voltage signal line H1 and adjacent to the first constant voltage signal line H1 are each connected to the first constant voltage signal line H1. FIG. 27 shows that two pixel circuit groups Z are provided in one circuit region QD. In an embodiment, one pixel circuit group Z can drive one pixel unit to emit white light, which can reduce the number of the first constant voltage signal lines H1, decrease the area of the non-light transmission region of the first display region, and correspondingly increase the area of the light transmission region of the first display region, and thus increase the light transmittance of the first display region.

Figure 28:
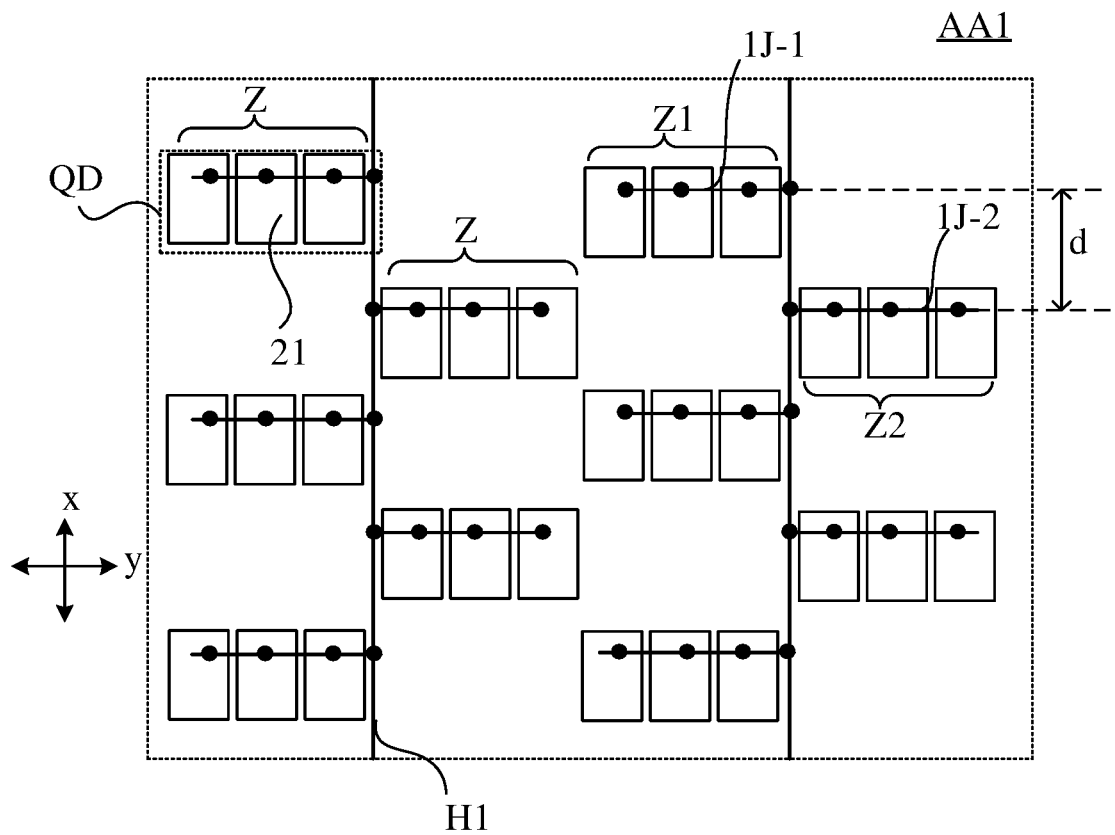
FIG. 28 is a partial schematic view of another display panel according to an embodiment of the present disclosure.

FIG. 28 is a partial schematic view of another display panel according to an embodiment of the present disclosure. In an embodiment, as shown in FIG. 28, the pixel circuit groups Z located at two sides of the first constant voltage signal line H1 are staggered in the second direction y. In other words, the pixel circuit groups Z that are located at two the sides of the first constant voltage signal line H1 and that are connected to the first constant voltage signal line H1 are not aligned in the second direction y. As shown in FIG. 28, a pixel circuit group Z1 and a pixel circuit group Z2 are staggered in the second direction y, and a staggered distance between the pixel circuit group Z1 and the pixel circuit group Z2 in the first direction x is d. The pixel circuits in the pixel circuit group Z1 are electrically connected to the first constant voltage signal line H1 through a first connection portion 1J-1, and the pixel circuits in the pixel circuit group Z2 are electrically connected to the first constant voltage signal line H1 through a first connection portion 1J-2. In FIG. 28, a distance between the first connection portion 1J-1 and the first connection portion 1J-2 can be used to represent the staggered distance d between the two pixel circuit groups. In some embodiments, a calculated distance between same structures in the two pixel circuit groups in the first direction x can represent the staggered distance d between the two pixel circuit groups.

In some embodiments, d is not smaller than a length of one pixel circuit 21 in the first direction x. The greater d is, the more sparsely the pixel circuit group are arranged, resulting in a greater total area of the light transmission region formed between circuit regions, which can improve the light transmittance of the overall first display region.

In the foregoing embodiments, a line arrangement manner of the first constant voltage signal line is designed to improve the light transmittance of the first display region, which can ensure a requirement on the light transmittance of the display panel when the line arrangement manner is applied in the under-screen photosensitive device. The wiring of the signal lines between circuit regions adjacent in the first display region is considered to be designed to reduce the diffraction caused when ambient light passes through the first display region, to improve an imaging effect of the photosensitive device when the wiring manner is applied in the under-screen photosensitive device solution.

In this embodiment of the present disclosure, the signal lines extending in a same direction and located between the adjacent circuit regions are converged, to centrally converge the signal lines that extend in a same direction, thereby reducing a diffraction phenomenon occurring when the ambient light passes through the first display region.

Figure 29:
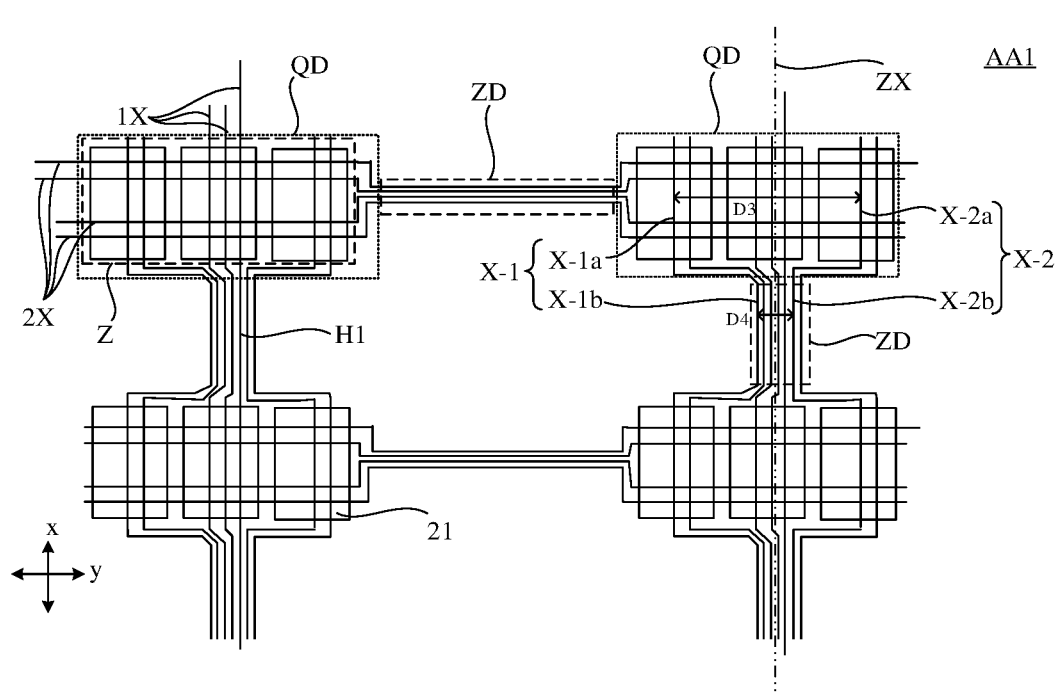
FIG. 29 is a partial schematic view of a first display region of another display panel according to an embodiment of the present disclosure.

FIG. 29 is a partial schematic view of another display panel according to an embodiment of the present disclosure. In an embodiment, as shown in FIG. 29, the first display region AA1 includes the circuit region QD and the wiring region ZD. That the circuit region QD includes one pixel circuit group Z is shown. A wiring region ZD is provided between two adjacent circuit regions QD, and the signal line segments are provided in the wiring region ZD.

In an embodiment, the signal lines include first signal lines 1X extending in the first direction x and second signal lines 2X each extending in the second direction y. An extending direction of the signal line can understood as a substantially extending direction of the signal line. The first signal lines 1X include the first constant voltage signal line H1. Three pixel circuits 21 in one pixel circuit group Z are connected to a same first constant voltage signal line H1. That is, one pixel circuit group Z corresponds to one constant voltage signal line H1. In an embodiment, the first constant voltage signal line H1 is the reset signal line, the first signal lines 1X further include the data line and the power signal line, and the second signal lines include a first scanning line, a second scanning line, a third scanning line, and a light-emitting control line. In another embodiment, the first constant voltage signal line H1 is the power signal line, the first signal lines 1X include the data line and the reset signal line, and the second signal lines include the first scanning line, the second scanning line, the third scanning line, and the light-emitting control line.

FIG. 29 shows a first signal sub-line X-1 and a second signal sub-line X-2 that extend in a substantially same direction. The first signal sub-line X-1 includes a first signal sub-line sub-segment X-1a located in the circuit region QD and a first signal sub-line branch segment X-1b located in the wiring region ZD. The first signal sub-line sub-segment X-1a and the first signal sub-line branch segment X-1b are connected to each other. The second signal sub-line X-2 includes a second signal sub-line sub-segment X-2a located in the circuit region QD and a second signal sub-line branch segment X-2b located in the wiring region ZD. The second signal sub-line sub-segment X-2a and the second signal sub-line branch segment X-2b are connected to each other. In one circuit region QD, a gap between the first signal sub-line sub-segment X-1a and the second signal sub-line sub-segment X-2a is D3, and in one wiring region ZD, a gap between the first signal sub-line branch segment X-1a and the second signal sub-line branch segment X-2b is D4, where D4<D3. With such configuration, the signal lines extending in a same direction can be converged when the signal lines extend from the circuit region QD to the wiring region ZD, which can form a light transmission region having a relatively large area between the wiring region ZD and the circuit region QD, and weaken a diffraction phenomenon caused when light passes through the first display region. When such configuration is applied in the under-screen photosensitive device solution, the optical performance of the photosensitive device can be improved.

In this embodiment of the present disclosure, a convergence manner of the signal lines that is used when the signal lines extend from the circuit region to the wiring region can be designed with reference to an arrangement manner of a pixel circuit group in the first display region. In an embodiment, as shown in FIG. 29, the first signal lines 1X extending in the first direction x are converged in the wiring region ZD, and the second signal lines 1X extending in the second direction y are converged in the wiring region ZD.

In an embodiment, as shown in FIG. 29, the signal lines that extend from the circuit region QD to the wiring region ZD are converged at a position, close to a center region, between two adjacent circuit regions QD. As shown in FIG. 29, the circuit region can include a first virtual center line ZX, and a distance from an edge of the circuit region QD at a first side of the first virtual center line ZX to the first virtual center line ZX is equal to a distance from an edge of the circuit region QD at a second side of the first virtual center line ZX to the first virtual center line ZX. Both the first signal sub-line branch segment X-1b and the second signal sub-line branch segment X-2b extend in a direction same as a direction along which the first virtual center line ZX extends. The first virtual center line ZX passes through the wiring region ZD.

The extending directions of both the first signal sub-line branch segment X-1b and the second signal sub-line branch segment X-2b can be understood as an extending direction of the signal line branch segment. In some embodiments, the signal line branch segment located in the wiring region ZD is in a shape of a straight line. In some embodiments, the signal line branch segment located in the wiring region ZD can be in a shape of a curved line. In a case where the signal line branch segment is in a shape of the curved line, an overall extending direction of the signal line at which the signal line branch segment is located can be understood as an extending direction of the signal line branch segment, or can be understood as an extending direction of the signal line branch segment.

The first virtual center line of the circuit region and the edges of the circuit region can be understood with reference to the following description. In an embodiment of the present disclosure, at least one pixel circuit group is provided in the circuit region, and an area of a region jointly occupied by the primary structures (the drive transistor and the switch transistors) of the pixel circuit in the pixel circuit group is regarded as a region area occupied by the circuit region. In this case, the region area occupied by the circuit region substantially has a particular geometric shape. The first virtual center line ZX is determined based on the geometric shape, and the distances from two opposite edges of the geometric shape in a second direction to the first virtual center line ZX are equal to each other. Taking a technique error into consideration, the distances are regarded to be equal to each other when an error difference between the distances from the two edges of the circuit region QD at the two sides of the first virtual center line ZX to the first virtual center line ZX falls within ±10%.

Figure 30:
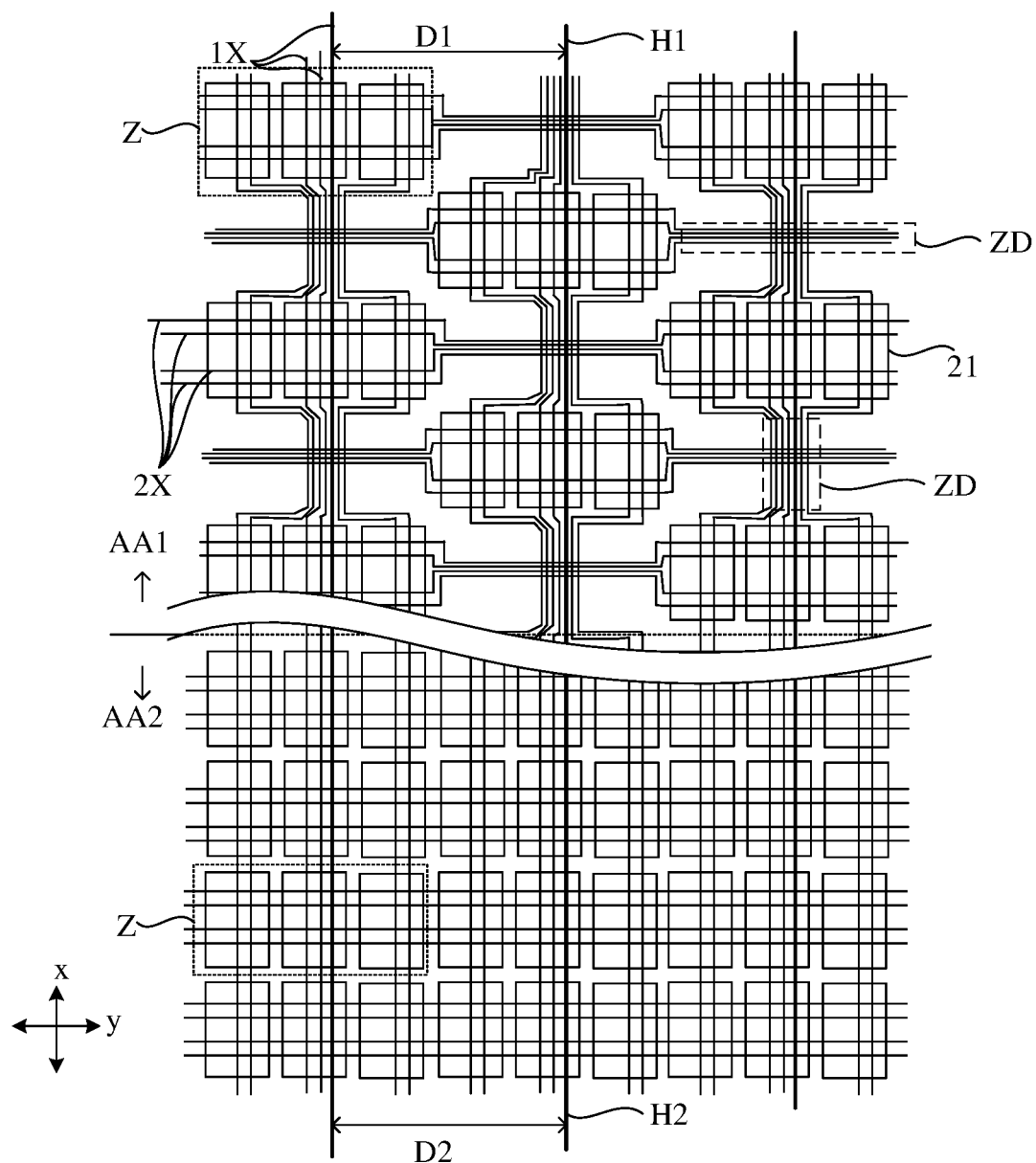
FIG. 30 is a partial schematic view of another display panel according to an embodiment of the present disclosure.

FIG. 30 is a partial schematic view of another display panel according to an embodiment of the present disclosure. In an embodiment, as shown in FIG. 30, in the wiring region ZD of the first display region AA1, the first signal line 1X extending in the first direction x and the second signal line 2X extending in the second direction y are converged in a same manner as that in FIG. 29. In the first display region AA1, one pixel circuit group Z includes three pixel circuits 21, and the three pixel circuits 21 are connected to a same first constant voltage signal line H1. In the second display region AA2, one pixel circuit group Z includes three pixel circuits 21, and the three pixel circuits 21 are connected to a same second constant voltage signal line H2. In other words, the constant voltage signal lines in the second display region AA2 are arranged in a same manner as the constant voltage signal lines in the first display region AA1. In this implementation, a distance D1 between two adjacent first constant voltage signal lines H1 in the first display region AA1 is equal to a distance D2 between two adjacent second constant voltage signal lines H2 in the second display region AA2. In the second display region AA2, the pixel circuit in one pixel circuit group Z can drive one pixel unit to emit white light. In this implementation, a line arrangement manner of the first constant voltage signal line H1 in the first display region AA1 is first designed, which can reduce the number of the first constant voltage signal lines H1 in the first display region AA1. Therefore, the area of the non-light transmission region in the first display region AA1 can be reduced, and the area of the light transmission region is correspondingly increased, which can improve the light transmittance of the first display region AA1. With reference to an arrangement manner of the pixel circuits in the first display region AA1, the signal lines extending in a same direction and located between adjacent circuit regions QD is designed in a convergence manner, which can reduce diffraction occurring when light passes through the first display region. In an embodiment, a line arrangement manner of the constant voltage signal lines in the second display region is set to be the same as a line arrangement manner of the constant voltage signal lines in the first display region, to simplify a layout design of constant voltage signal lines in the display panel.

Figure 31:
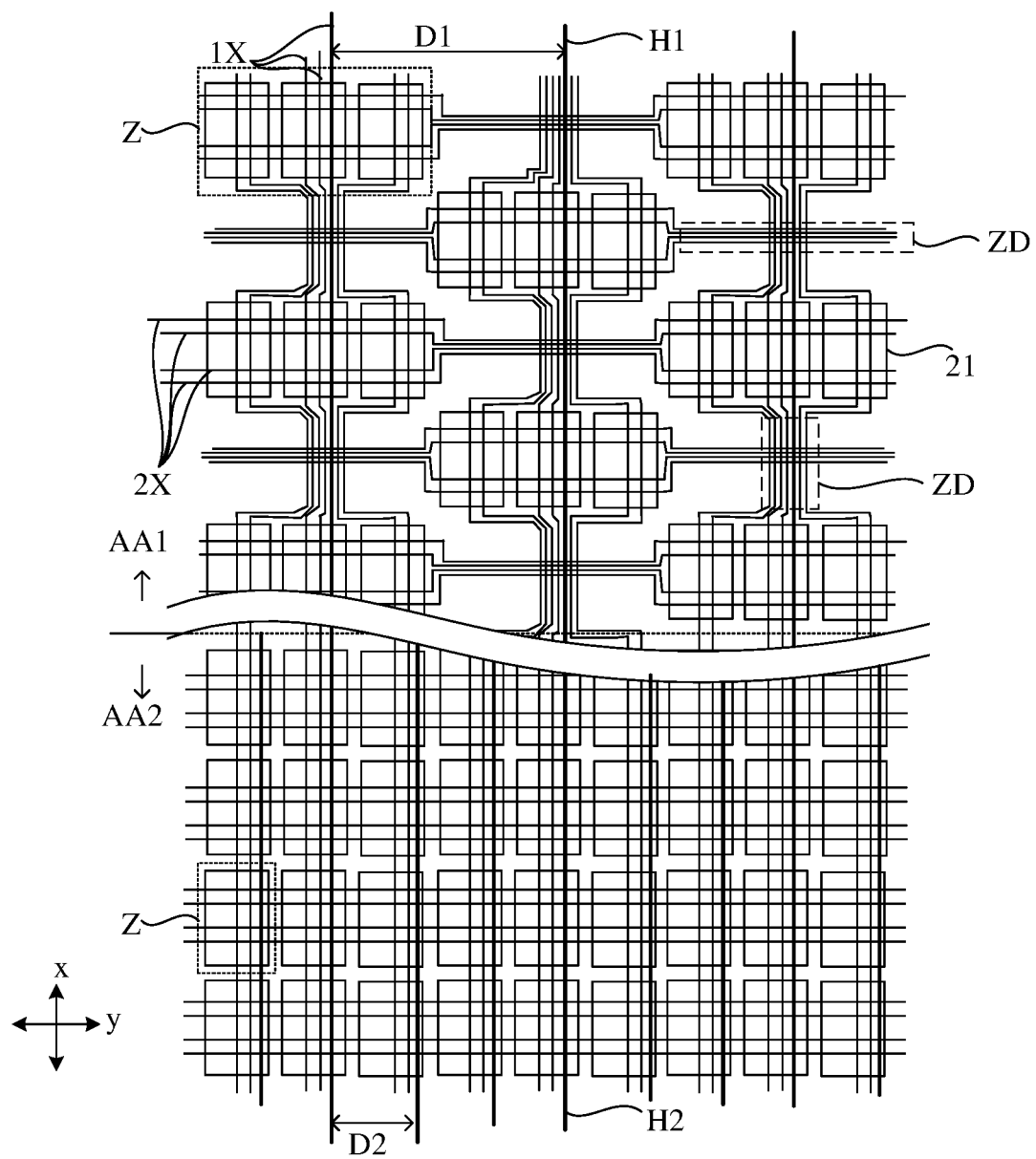
FIG. 31 is a partial schematic view of another display panel according to an embodiment of the present disclosure.

FIG. 31 is a partial schematic view of another display panel according to an embodiment of the present disclosure. In the embodiment of FIG. 31, a line arrangement manner of the first display region AA1 is the same as that in the embodiment of FIG. 30, and is different from a line arrangement manner of the second constant voltage signal lines H2 in the second display region AA2. In an embodiment, as shown in FIG. 31, the number of the pixel circuits 21 in one pixel circuit group Z in the second display region AA2 is smaller than the number of the pixel circuits in one pixel circuit group Z in the first display region AA1. One pixel circuit 21 in one pixel circuit group Z in the second display region AA2 is connected to one second constant voltage signal line H2. In an embodiment, the distance D1 between two adjacent first constant voltage signal lines H1 in the first display region AA1 is greater than the distance D2 between two adjacent second constant voltage signal lines H2 in the second display region AA2. In the second display region AA2, the pixel circuits in one pixel circuit group Z are incapable of driving one pixel unit to emit white light. In this implementation, an arrangement density of the second constant voltage signal lines H2 in the second display region AA2 is relatively large, which can reduce the voltage drop loss on the constant voltage signal line.

In an embodiment, as shown in FIG. 31, one pixel circuit group Z in the first display region AA1 includes three pixel circuits 21, and one pixel circuit group Z in the second display region AA2 includes one pixel circuit 21.

In an embodiment, one pixel circuit group Z in the first display region AA1 includes three pixel circuits 21, and one pixel circuit group Z in the second display region AA2 includes two pixel circuits 21.

Figure 32:
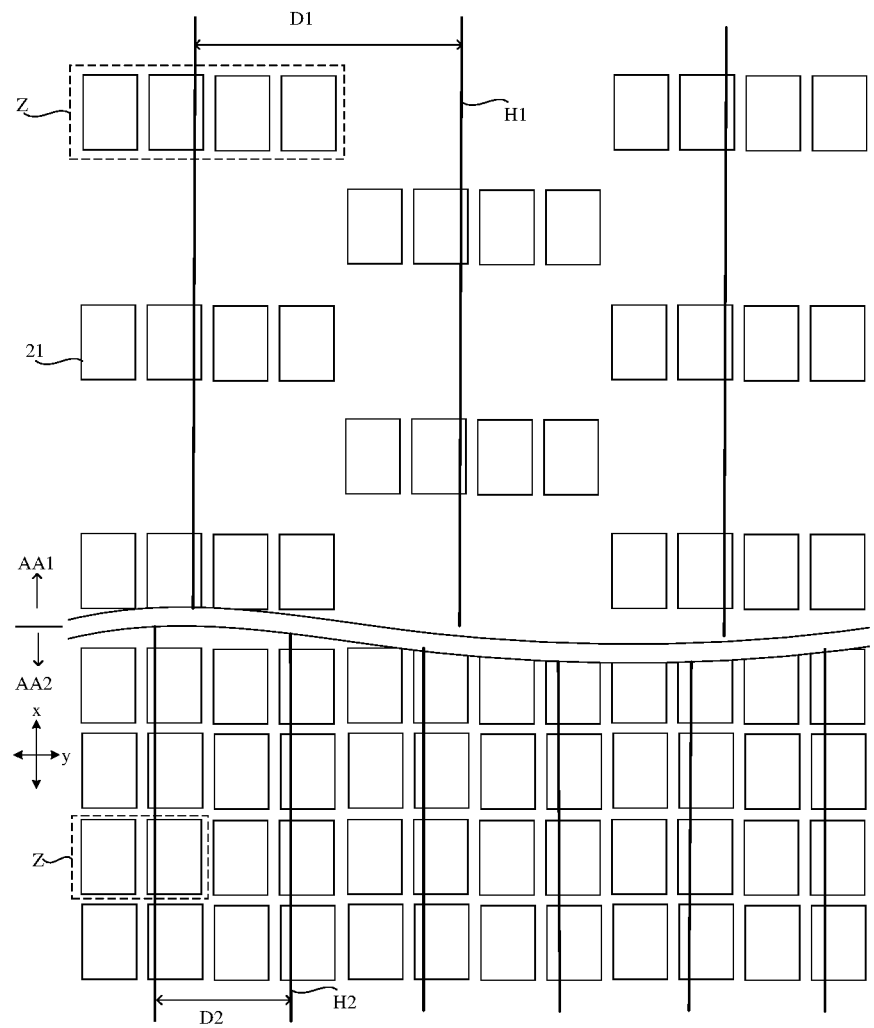
FIG. 32 is a partial schematic view of another display panel according to an embodiment of the present disclosure.

In an embodiment, one pixel circuit group Z in the first display region AA1 includes four pixel circuits 21. FIG. 32 is a partial schematic view of another display panel according to an embodiment of the present disclosure. FIG. 32 only shows the constant voltage signal line in the display region. As shown in FIG. 32, one pixel circuit group Z in the first display region AA1 includes four pixel circuits 21 arranged in the second direction y, and the four pixel circuits 21 correspond to one first constant voltage signal line H1. One pixel circuit group Z in the second display region AA2 includes two pixel circuits 21 corresponding to one second constant voltage signal line H2. In other words, in the second display region AA2, the pixel circuits 21 are arranged in the first direction x to form a column, and two columns of pixel circuits correspond to one second constant voltage signal line H2.

In an embodiment, one pixel circuit group Z in the first display region AA1 includes four pixel circuits 21, and one pixel circuit group Z in the second display region AA2 includes one or three pixel circuits 21.

FIG. 29 shows a convergence manner of a line between two adjacent circuit regions QD. In another embodiment, the signal lines that extend from the circuit region QD to the wiring region ZD are converged, and are converged at a position corresponding to an edge region of the circuit region QD in the wiring region ZD.

Figure 33:
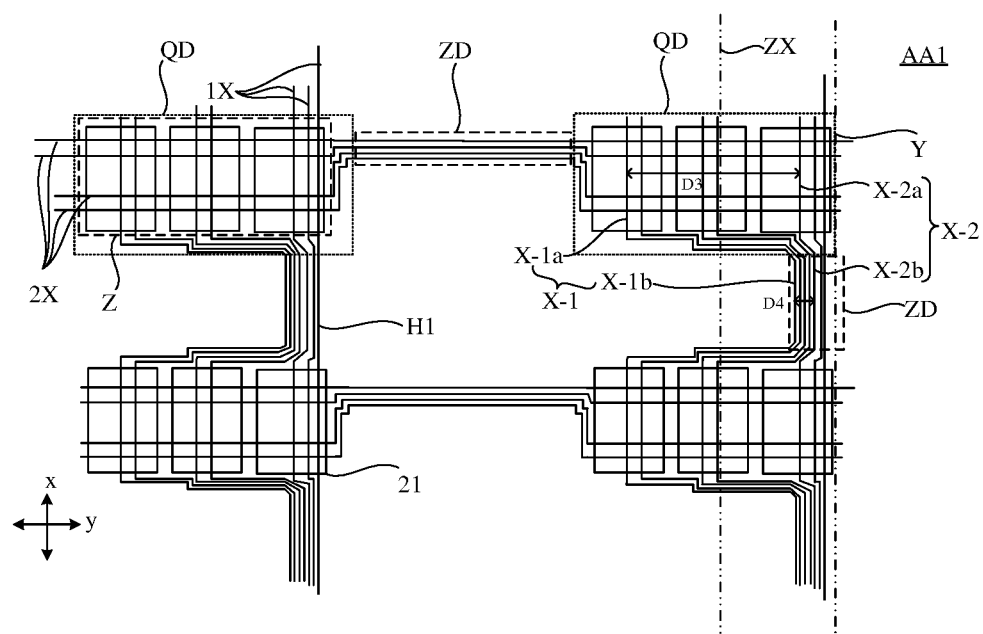
FIG. 33 is a partial schematic view of another display panel according to an embodiment of the present disclosure.

FIG. 33 is a partial schematic view of another display panel according to an embodiment of the present disclosure. FIG. 33 shows a first signal sub-line X-1 and a second signal sub-line X-2 that extend in a substantially same direction. In one circuit region QD, a gap between the first signal sub-line sub-segment X-1a and the second signal sub-line sub-segment X-2a is D3, and in one wiring region ZD, a gap between the first signal sub-line branch segment X-1a and the second signal sub-line branch segment X-2b is D4, where D4<D3. As shown in FIG. 33, both the first signal sub-line branch segment X-1b and the second signal sub-line branch segment X-2b extends in directions parallel to a first virtual center line ZX and are located at a same side of the first virtual center line ZX. The circuit region QD further includes a first virtual boundary Y parallel to the first virtual center line ZX, and the wiring region ZD is adjacent to an extending line of first virtual boundary Y. The first virtual center line can be referred to the embodiment of FIG. 29. The first virtual boundary can be understood as an edge of a geometric shape formed by a region area jointly occupied by primary structures of the pixel circuit in the pixel circuit group.

When extending from the circuit region QD to the wiring region ZD, the signal lines having a same extending direction are converged at a position corresponding to an edge region of the circuit region QD. This implementation can be applied with reference to an arrangement manner of the pixel circuits in the first display region AA1, to form the light transmission region having a relatively large area between the wiring region ZD and the circuit region QD, and weaken a diffraction phenomenon caused when light passes through the first display region. When such implementation is applied in the under-screen photosensitive device solution, the optical performance of the photosensitive device can be improved.

The line arrangement manner of the second constant voltage signal lines in the second display region in the embodiment of FIG. 33 can be referred to the embodiments in FIG. 30 and FIG. 31.

Figure 34:
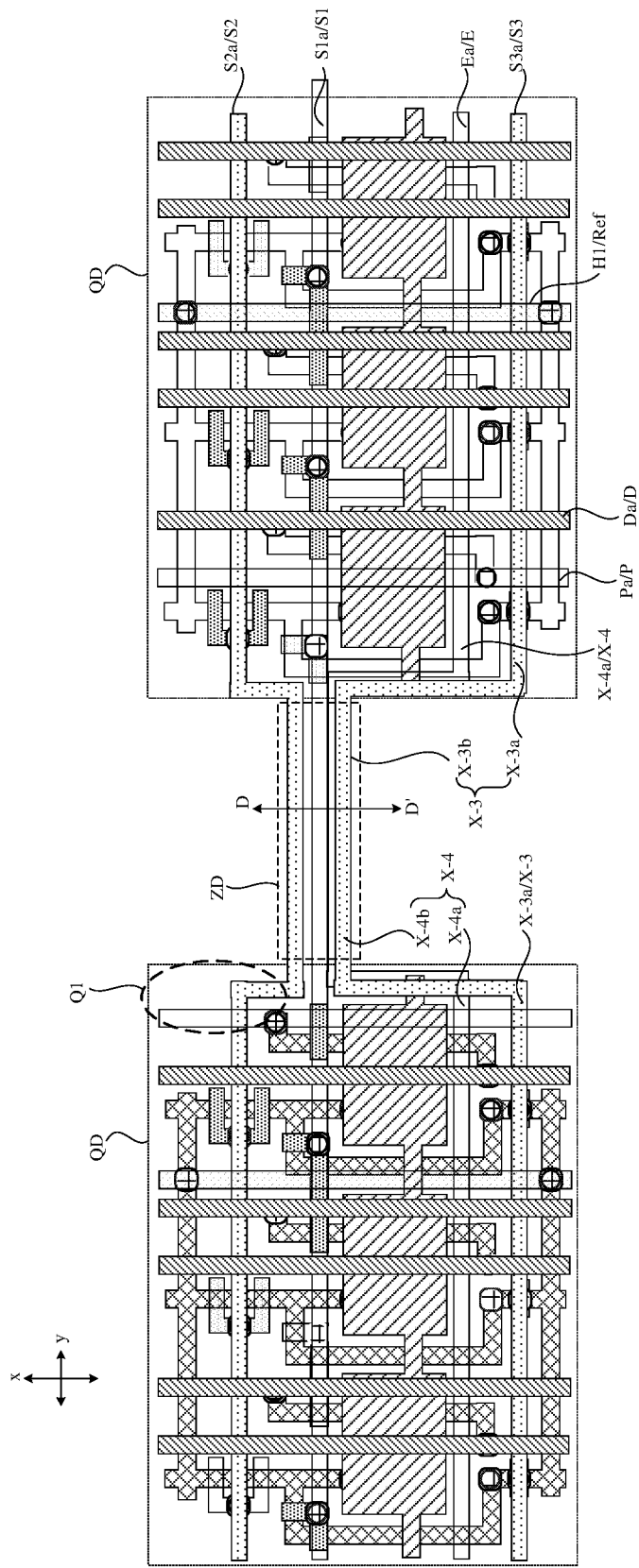
FIG. 34 is a partial schematic view of another display panel according to an embodiment of the present disclosure.
Figure 35:
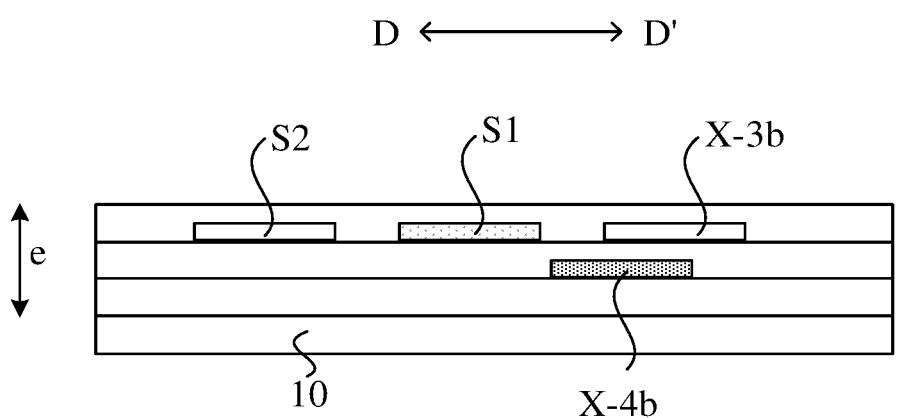
FIG. 35 is a cross-sectional view along a line D-D' in FIG. 34 according to an embodiment of the present disclosure.

FIG. 34 is a partial schematic view of another display panel according to an embodiment of the present disclosure. FIG. 35 is a cross-sectional view along tangent D-D' in FIG. 34. In an embodiment, as shown in FIG. 34, the signal lines include a third signal sub-line X-3 and a fourth signal sub-line X-4 that extend in a same direction. The same extending direction indicates that the two signal lines extend in a substantially same direction. The third signal sub-line X-3 includes a third signal sub-line sub-segment X-3a located in the circuit region QD and a third signal sub-line branch segment X-3b located in the wiring region ZD, and the third signal sub-line sub-segment X-3a and the third signal sub-line branch segment X-3b are connected to each other. FIG. 34 shows two third signal sub-line sub-segments X-3a respectively located in two circuit regions QD. The fourth signal sub-line X-4 includes a fourth signal sub-line sub-segment X-4a located in the circuit region QD and a fourth signal sub-line branch segment X-4b located in the wiring region ZD, and the fourth signal sub-line sub-segment X-4a and the fourth signal sub-line branch segment X-4b are connected to each other. FIG. 34 shows two fourth signal sub-line sub-segments X-4a, where each fourth signal sub-line sub-segment X-4a and one third signal sub-line sub-segment X-3a are located in a same circuit region QD. FIG. 34 further shows a fourth signal sub-line branch segment X-4b with which the third signal sub-line branch segment X-3b is located in a same wiring region ZD. As shown in FIG. 35, in the wiring region ZD, in the direction perpendicular to the plane of the substrate 10, the third signal sub-line branch segment X-3b and the fourth signal sub-line branch segment X-4b at least partially overlap. Such configuration in this implementation can reduce the width of the wiring region in a width direction of a signal line branch segment. That is, an area occupied by the wiring region can be reduced, which can increase the area of the light transmission region of the first display region. Two signal line branch segments are set to be at least partially overlap in the wiring region, which can also reduce a gap between two adjacent signal lines in the wiring region. Therefore, the diffraction occurring when the light passes through the first display panel can be reduced.

Figure 36:
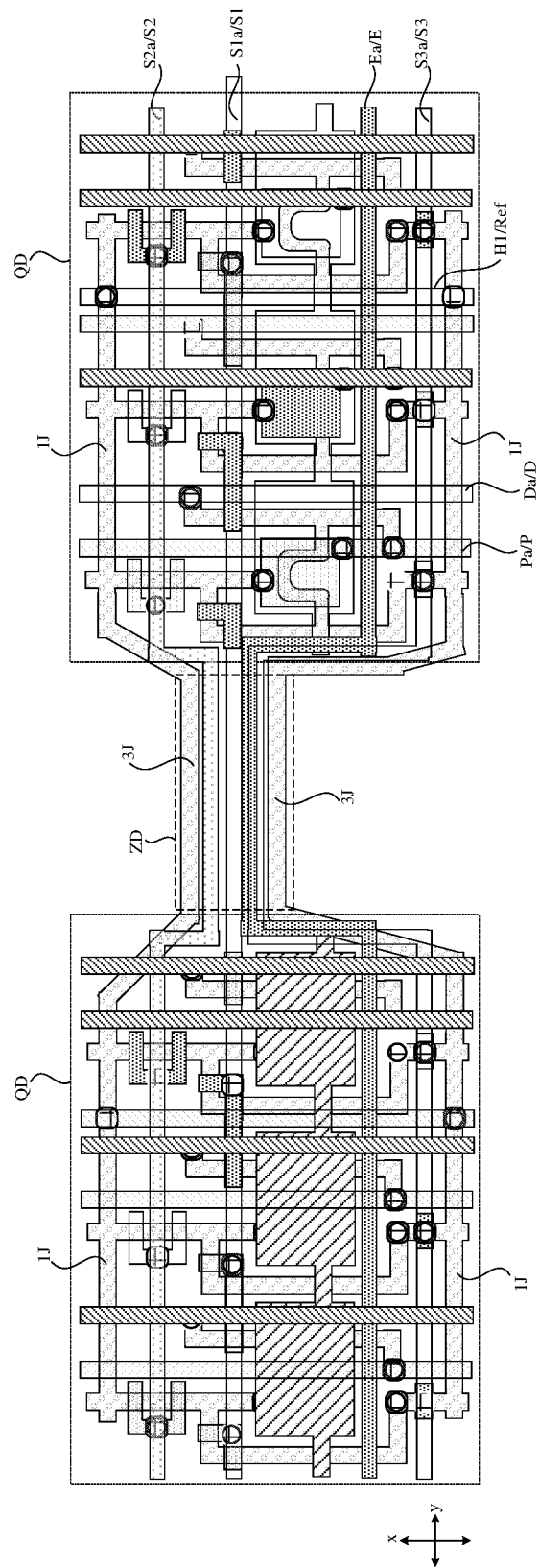
FIG. 36 is a partial schematic view of another display panel according to an embodiment of the present disclosure.

FIG. 36 is a partial schematic view of another display panel according to an embodiment of the present disclosure. As shown in FIG. 36, in a first display region AA1, the display panel further includes a third connection portion 3J, and two first connection portions 1J adjacent to each other in the second direction y are electrically connected through the third connection portion 3J. The third connection portion 3J is located in the wiring region ZD. With the providing of the third connection portion 3J, first connection portions 1J in the circuit regions QD arranged in the second direction y can be connected to each other. Overall, the first connection portion 1J and the third connection portion 3J constitute a horizontally connected line extending in the second direction y. In this case, in general, in the first display region AA1, the first constant voltage signal lines H1, the first connection portions 1J, and the third connection portions 3J can form grid-shaped lines, thereby reducing the voltage drop of the constant voltage signal transmitted on the first constant voltage signal line H1.

Figure 37:
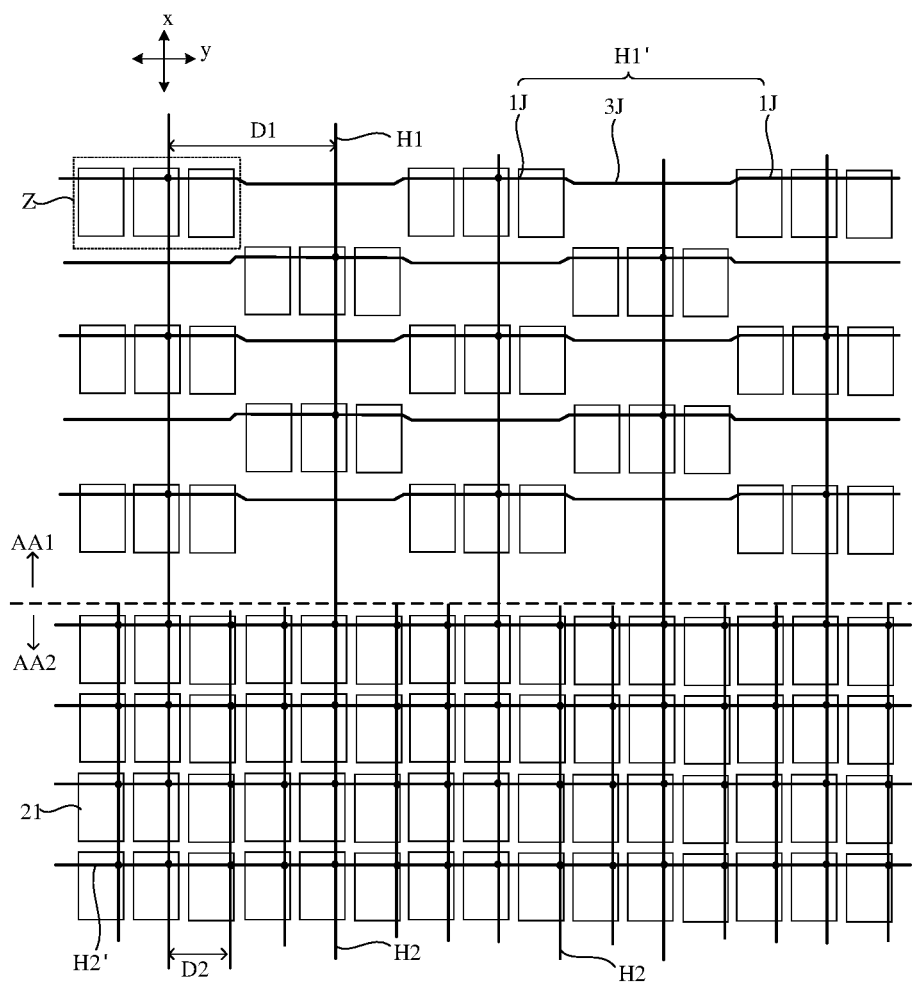
FIG. 37 is a partial schematic view of another display panel according to an embodiment of the present disclosure.

FIG. 37 is a partial schematic view of another display panel according to an embodiment of the present disclosure. FIG. 37 shows a part of the first display region AA1 and a part of the second display region AA2. A first auxiliary constant voltage signal line H1' is provided in the first display region AA1 and extends along the second direction y. The first auxiliary constant voltage signal line H1' extends in a direction intersecting the directions along which the first constant voltage signal lines H1 extend. One first auxiliary constant voltage signal line H1' intersects and is electrically connected to the first constant voltage signal lines H1. The first auxiliary constant voltage signal line H1' and the first constant voltage signal line H1 transmit a same voltage signal. In this case, in the first display region AA1, the first auxiliary constant voltage signal line H1' and the first constant voltage signal lines H1 intersect to form grid-shaped lines. A second auxiliary constant voltage signal line H2' is provided in the second display region AA2a. The second auxiliary constant voltage signal line H2' extends along the second direction y, and the extending direction of the second auxiliary constant voltage signal line H2' and an extending direction of the second constant voltage signal line H2 intersect. In this case, one second auxiliary constant voltage signal line H2' intersects and is electrically connected to the second constant voltage signal lines H2. The second auxiliary constant voltage signal line H2' and the second constant voltage signal line H2 transmit a same voltage signal. In the second display region AA2, the second auxiliary constant voltage signal line H2' and the second constant voltage signal lines H2 intersect to form grid-shaped lines. In this implementation, the grid-shaped lines are used for transmitting the constant voltage signal, which can reduce the voltage drop of the constant voltage signal, and reduce power consumption.

In some embodiments, the constant voltage signal line in FIG. 37 is a reset signal line.

In some embodiments, the constant voltage signal line in FIG. 37 is a power signal line.

In some embodiments, the first auxiliary constant voltage signal line H1' includes the first connection portions 1J and the third connection portions 3J that are alternately connected.

In an embodiment, the third connection portion 3J and the first connection portion 1J are located in a same layer. In another embodiment, the third connection portion 3J and the first connection portion 1J are located in different layers, respectively.

With reference to FIG. 19, the third connection portion 3J can be located in any one of the semiconductor layer W, the first metal layer M1, the second metal layer M2, and the third metal layer M3.

With reference to FIG. 20, the third connection portion 3J can be located in any one of the semiconductor layer W, the first metal layer M1, and the second metal layer M2.

Figure 38:
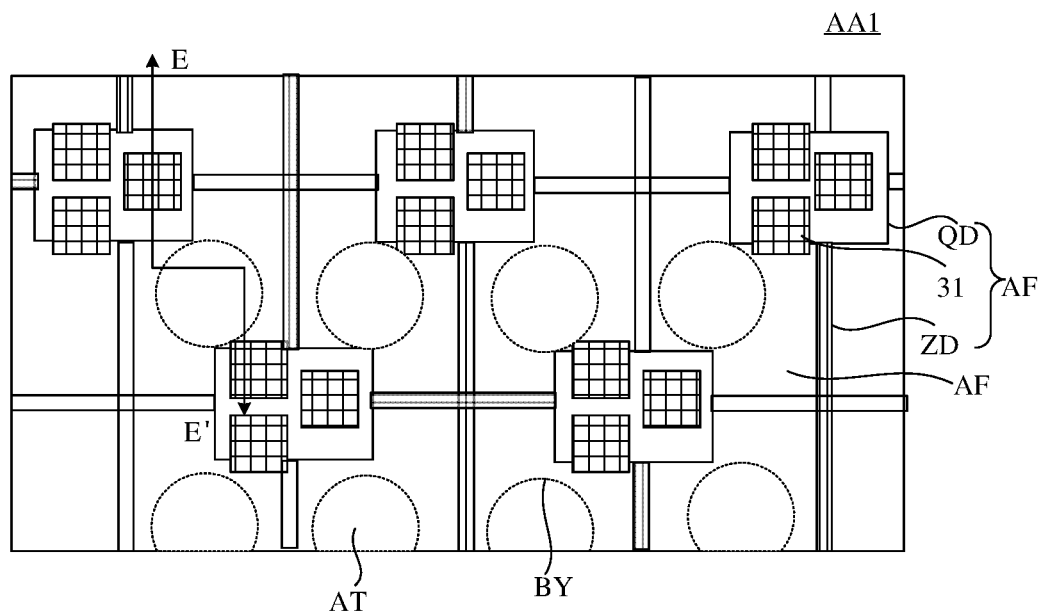
FIG. 38 is a partial schematic view of another display panel according to an embodiment of the present disclosure.

FIG. 38 is a partial schematic view of another display panel according to an embodiment of the present disclosure. In an embodiment, as shown in FIG. 38, the first display region AA1 includes a light transmission region AT and a non-light transmission region AR A virtual boundary BY between the light transmission region AT and the non-light transmission region AF is a curved line. That is, a virtual boundary of the light transmission region AT is a curved line. The non-light transmission region AF includes the circuit region QD, the wiring region ZD, and a region in which the light-emitting device 31 is located, and the non-light transmission region AF at least partially surrounds the light transmission region AT. The non-light transmission structures in the non-light transmission region AF include the light-emitting device 31, the pixel circuit located in the circuit region QD, and the signal lines in the wiring region ZD. In this embodiment of the present disclosure, the virtual boundary of the light transmission region AT is set as the curved line, which can improve diffraction occurring when the light passes through the first display region. When such configuration is applied in the under-screen photosensitive device solution, the optical performance of the photosensitive device can be improved. When the photosensitive device is a camera, impact of the diffraction phenomenon on an image captured by the camera can be weakened, which can improve articulation of the photographed image, and improve photographic image quality. In some embodiments, the display panel includes a shading layer located on the substrate and has an opening. In an embodiment, the shading layer is made of a black color resistance or a shading (non-light transmission) metal. In the direction perpendicular to the plane of the substrate, the shading layer, another non-light transmission structure in the display panel, and an overlapping region formed by them are the non-light transmission region. An overlapping region formed by the opening of the shading layer and a light transmission region in other layer of the display panel is the light transmission region AT.

In some embodiments, an orthographic projection of the opening of the shading layer on the substrate substantially coincides with the light transmission region. That is, a shape of the opening of the shading layer is substantially the same as a shape of the light transmission region.

Figure 39:
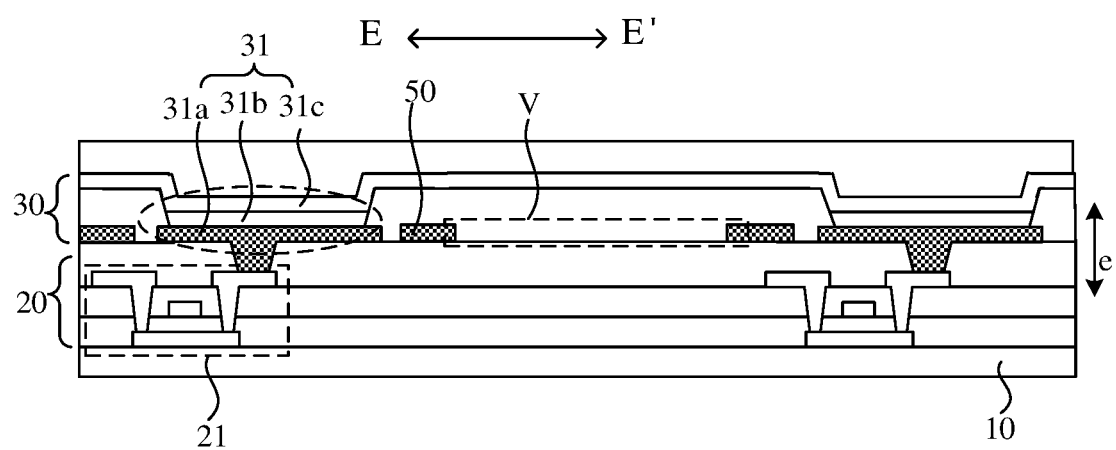
FIG. 39 is a schematic cross-sectional view along a line E-E in FIG. 38 according to an embodiment of the present disclosure.

FIG. 39 is a cross-sectional view along tangent E-E' in FIG. 38. In an embodiment, as shown in FIG. 39, a shading layer 50 and the first electrode 31a of the light-emitting device 31 are located in a same layer. A region where an opening V of the shading layer 50 is located is the light transmission region AT. In the direction e perpendicular to the plane of the substrate 10, a shape of an orthographic projection of the opening V of the shading layer 50 is a shape of the virtual boundary BY of the light transmission region AT. In this implementation, the shape of the opening of the shading layer is designed, and the edge of the opening is designed as a curved line, so that the virtual boundary of the light transmission region is in a shape of the curved line. The shading layer 50 and the first electrode 31a can be located in a same layer, which can be manufactured in a same production process and simplify the production process.

In another embodiment, the shading layer 50 is located on a side of the second electrode 31c facing away from the substrate 10. In this implementation, the shading layer 50 further includes a first opening. In the direction perpendicular to the plane of the substrate, the first opening exposes the light-emitting device 31, which can ensure light-emitting of the light-emitting device 31.

In another embodiment, the shading layer 50 is located on a side of the pixel circuit 21 close to the substrate 10. In this embodiment, the shading layer 50 is formed on the substrate 10, and an array layer 20 and a display layer 30 are then sequentially formed after forming the shading layer 50 on the substrate 10. The providing of the shading layer 50 does not affect a production process of the array layer and the display layer in the display panel.

In another embodiment, the shading layer 50 is located between the array layer 20 and the display layer 30 and includes a second opening. A via hole through which the pixel circuit 21 and the first electrode 31a of the light-emitting device 31 are connected to each other is provided in the second opening.

Figure 40:
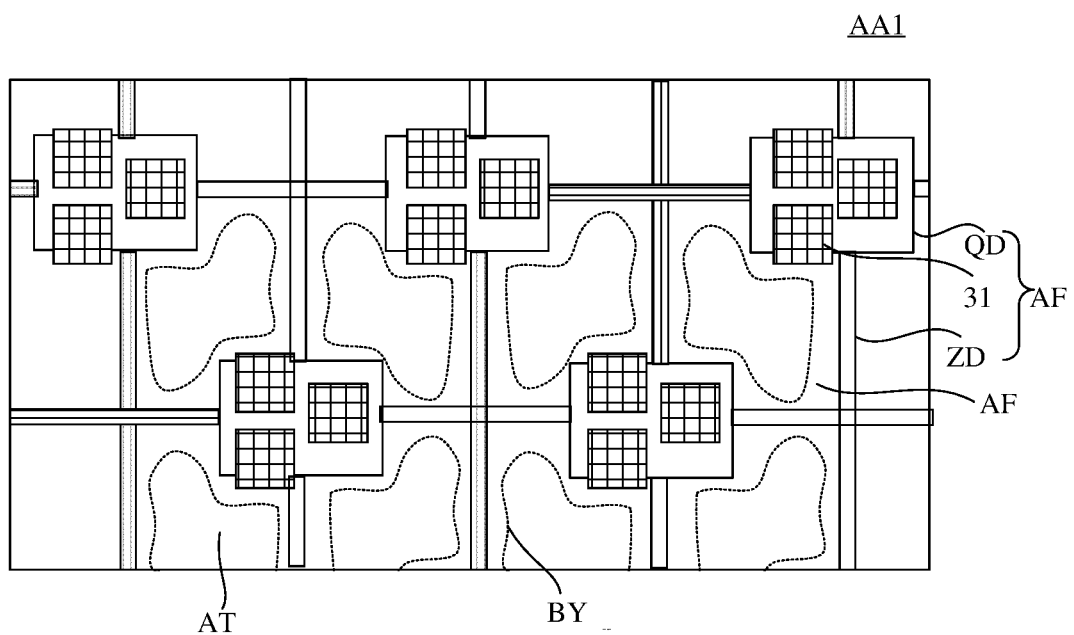
FIG. 40 is a partial schematic view of another display panel according to an embodiment of the present disclosure.

FIG. 38 exemplarily illustrates a shape of the light transmission region AT is a circle. A shape of the light transmission region in an embodiment of the present disclosure can be an ellipse or another irregular shape. It is generally regarded that graphics such as a circle, a triangle, a polygon, and the like that can be defined and named in mathematics are regular shapes. Correspondingly, graphics that cannot be defined and named are irregular shapes. In other words, the irregular shape cannot be named based on a definition in mathematics. FIG. 40 is a partial schematic view of another display panel according to an embodiment of the present disclosure. As shown in FIG. 40, a shape of the light transmission region AT can an irregular shape, and the virtual boundary BY between the light transmission region AT and the non-light transmission region AF is in a shape of a curved line. That is, the virtual boundary of a graphic of the light transmission region AT is a curved line.

Figure 41:
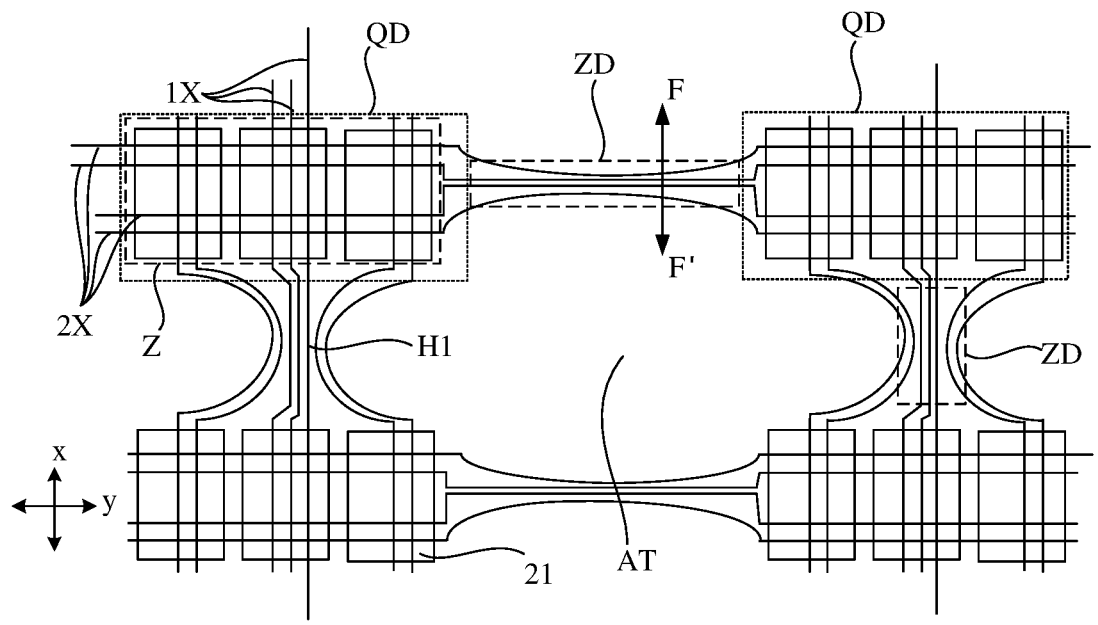
FIG. 41 is a partial schematic view of another display panel according to an embodiment of the present disclosure.

FIG. 41 is a partial schematic view of a first display region of another display panel according to an embodiment of the present disclosure. In an embodiment, as shown in FIG. 41, at least one signal line located on an edge of the wiring region ZD is in a shape of a curved line. The signal line in the wiring region ZD is designed can avoid a case in which the wiring region ZD has a straight boundary, which can reduce a degree of diffraction occurring when light passes through the first display region AA1. An irregular shaped region, like the cloud, defined by four circuit regions QD and four wiring regions ZD in FIG. 41, is the light transmission region AT. In a non-light transmission region AF, a graphic formed, by an orthographic projection of a non-light transmission structure (for example, a first electrode of a light-emitting device 31, a component (including transistors, a capacitor pole plate, and a connection line between the transistors) of the pixel circuit, the connection portion located on the edge of the pixel circuit group in the foregoing embodiment, the signal line located in the wiring region, or another non-light transmission structure) on the substrate 10 is a shape of the non-light transmission region AR In this case, an edge of the orthographic projection graphic is the virtual boundary BY between the non-light transmission region AF and the light transmission region AT.

In the embodiment of FIG. 41, the shapes of the lines in the wiring region ZD and the circuit region QD are designed to enable the virtual boundary of the light transmission region AT to be a curved line, so that the light transmission region AT having a relatively large area is formed in a region surrounded by the wiring region ZD and the circuit region QD, thereby improving light transmittance of the first display region AA1.

Figure 42:
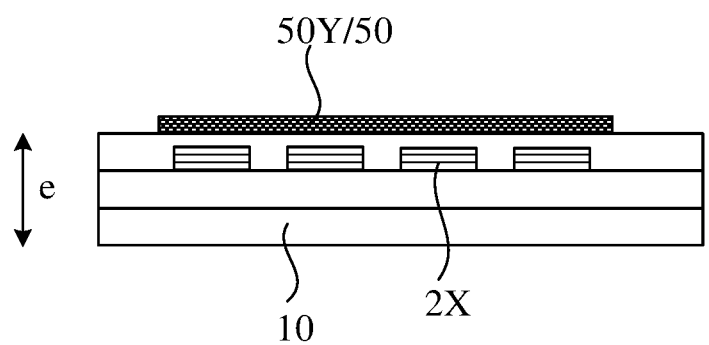
FIG. 42 is a schematic cross-sectional view at a position of a tangent F-F' in FIG. 41 according to an embodiment of the present disclosure.

FIG. 42 is a cross-sectional view along tangent F-F' in FIG. 41. In an embodiment, as shown in FIG. 42, the display panel includes a shading layer 50 including a shading unit 50Y. An orthographic projection of the shading unit 50Y on the substrate 10 covers an orthographic projection of the wiring region ZD on the substrate 10. In other words, in the direction e perpendicular to the plane of the substrate 10, lines in the shading unit 50Y and lines in the wiring region ZD overlap. That the shading unit 50Y shades a gap between signal lines in the wiring region ZD can reduce diffraction occurring when the light passes through the wiring region ZD.

FIG. 42 shows only that the second signal lines 2X in the wiring region ZD are located in a same layer, which is not limited in the present disclosure.

In an embodiment, some line segments located on an edge of the circuit region QD are designed. The line segment located on the edge of the circuit region QD is in a shape of a curved line. In some embodiments, the line segment located on the edge of the circuit region QD is a line segment of a signal line that extends from the circuit region QD to the wiring region ZD. For example, for a signal line in a region Q1 shown in the embodiment of FIG. 34, a line segment at the position is a part of the line segment of the second scanning line S2. In an embodiment, the line segment in the region Q1 shown in the embodiment in FIG. 34 is in a shape of a curved line. When a part of the line segment of the curved line and another non-light transmission structure jointly constitute a virtual boundary of the light transmission region, diffraction occurring when the light passes through the first display region can be reduced.

In this embodiment of the present disclosure, the display panel includes a light-emitting device group, and the light-emitting device group includes n light-emitting devices. That is, of the number of the light-emitting devices in the light-emitting device group is the same as the number of the pixel circuits in one pixel circuit group in the first display region. The n light-emitting devices in the light-emitting device group can match each other to mix light to emit white light.

In an embodiment, in the first display region, one pixel circuit in the pixel circuit group is electrically connected to one light-emitting device, and one pixel circuit group corresponds to one light-emitting device group.

In another embodiment, in the first display region, one pixel circuit in a pixel circuit group is electrically connected to two or more light-emitting devices, and one pixel circuit group corresponds to two or more light-emitting device groups.

In some embodiments, one light-emitting device group includes one first light-emitting device, one second light-emitting device, and one third light-emitting device that emit light of different colors, which are a total of three light-emitting devices. In an embodiment, the first light-emitting device, the second light-emitting device, and the third light-emitting device can be a red light-emitting device, a green light-emitting device, and a blue light-emitting device, respectively.

Figure 43:
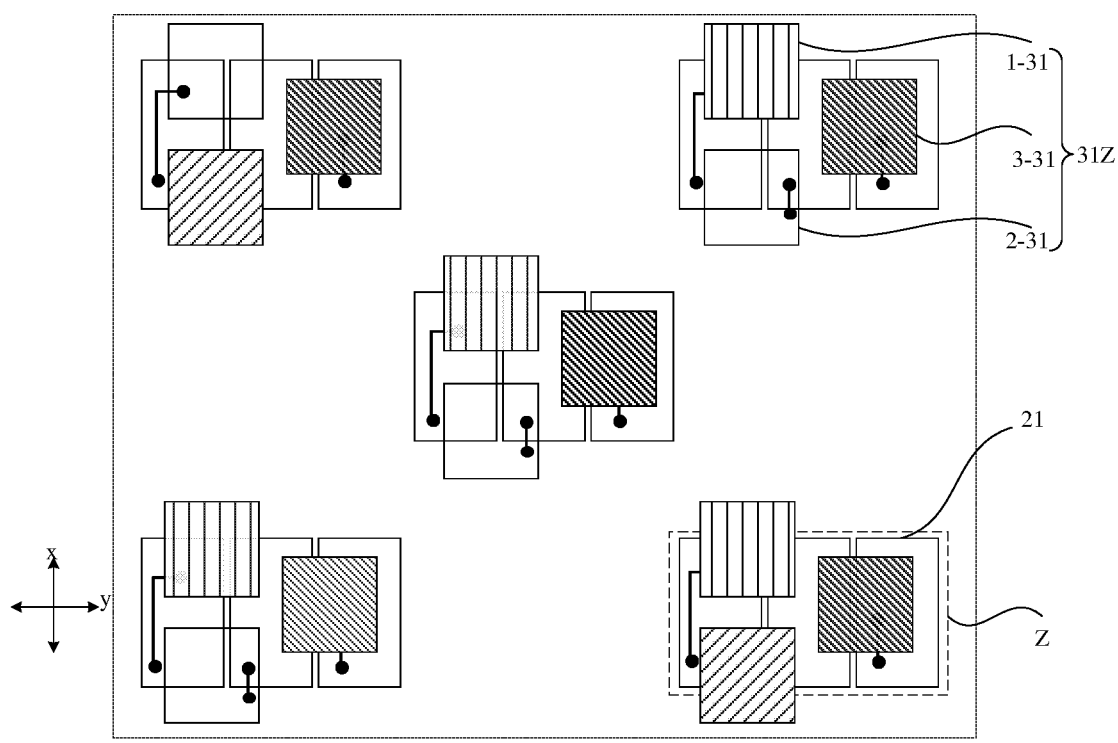
FIG. 43 is a partial schematic view of a first display region of another display panel according to an embodiment of the present disclosure.

FIG. 43 is a partial schematic view of a first display region of another display panel according to an embodiment of the present disclosure. In an embodiment, as shown in FIG. 43, one pixel circuit group Z includes three pixel circuits 21, and the first light-emitting device 1-31, the second light-emitting device 2-31, and the third light-emitting device 3-31 that are located in one light-emitting device group 31Z are arranged in a shape of "A". The pixel circuit groups Z are in a one-to-one correspondence with the light-emitting device groups 31Z, and one pixel circuit 21 in one pixel circuit group Z is correspondingly connected to one light-emitting device. The second light-emitting control transistor in the pixel circuit is electrically connected to the first electrode of the light-emitting device. In some embodiments, the first electrode of the light-emitting device is relatively far away from the second light-emitting control transistor in the pixel circuit connected to the first electrode, and is connected to the corresponding second light-emitting control transistor through a conducting wire that is manufactured in a same layer as the first electrode.

Figure 44:
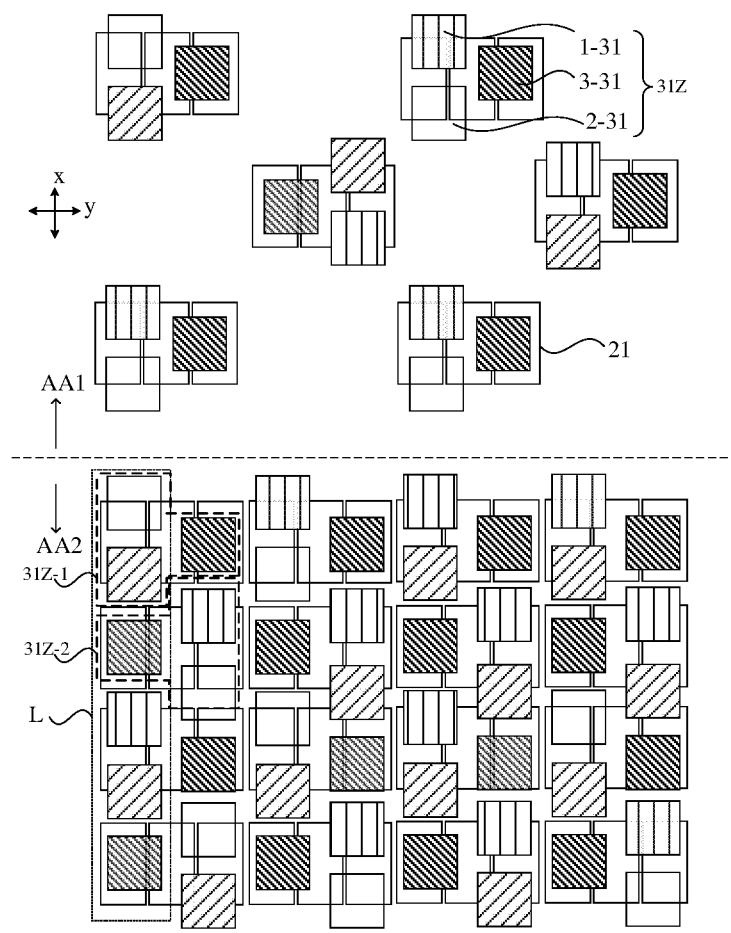
FIG. 44 is a partial schematic view of another display panel according to an embodiment of the present disclosure.

FIG. 44 is a partial schematic view of another display panel according to an embodiment of the present disclosure. FIG. 44 shows an arrangement manner of light-emitting devices in the first display region AA1, and an arrangement manner of the light-emitting devices in the second display region AA2. In an embodiment, in the second display region AA2, the first light-emitting devices 1-31, the second light-emitting devices 2-31, and the third light-emitting devices 3-31 are alternately arranged in the first direction x to form a light-emitting device column L, and a plurality of light-emitting device columns L are arranged in the second direction y. In the second display region AA2, the three light-emitting devices in the light-emitting device group 31Z-1 and the three light-emitting devices in the light-emitting device group 31Z-2 are arranged in a shape of "品". The light-emitting device group 31Z-1 and the light-emitting device group 31Z-2 that are adjacent in the first direction x constitute one repetition unit.

In the light-emitting device group shown in FIG. 43, areas of the first light-emitting device 1-31, the second light-emitting device 2-31, and the third light-emitting device 3-31 are approximately equal. In an embodiment, the first light-emitting device 1-31 is a red light-emitting device, the second light-emitting device 2-31 is a blue light-emitting device, and the third light-emitting device 3-31 is a green light-emitting device.

Figure 45:
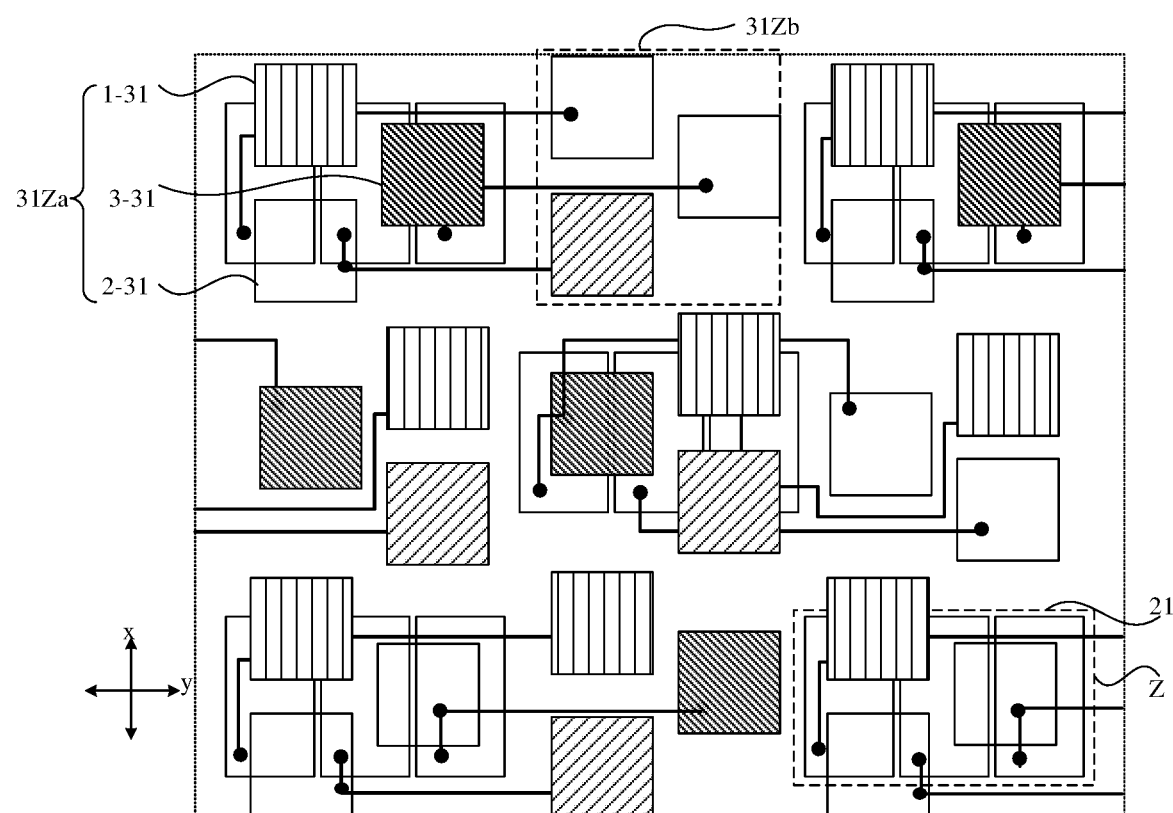
FIG. 45 is a partial schematic view of a first display region of another display panel according to an embodiment of the present disclosure.

FIG. 45 is a partial schematic view of a first display region of another display panel according to an embodiment of the present disclosure. In an embodiment, as shown in FIG. 45, in the first display region, one pixel circuit group Z corresponds to two light-emitting device groups 31Z. That is, one pixel circuit 21 is correspondingly electrically connected to two light-emitting devices that respectively located in two light-emitting device groups 31Z and that emit light of a same color. As shown in FIG. 45, the light-emitting device group 31Za and the light-emitting device group 31Zb correspond to a same pixel circuit group Z.

Embodiments in which one pixel circuit group corresponds to three or more light-emitting device groups can be referred to FIG. 45, which will not be repeated herein.

Figure 46:
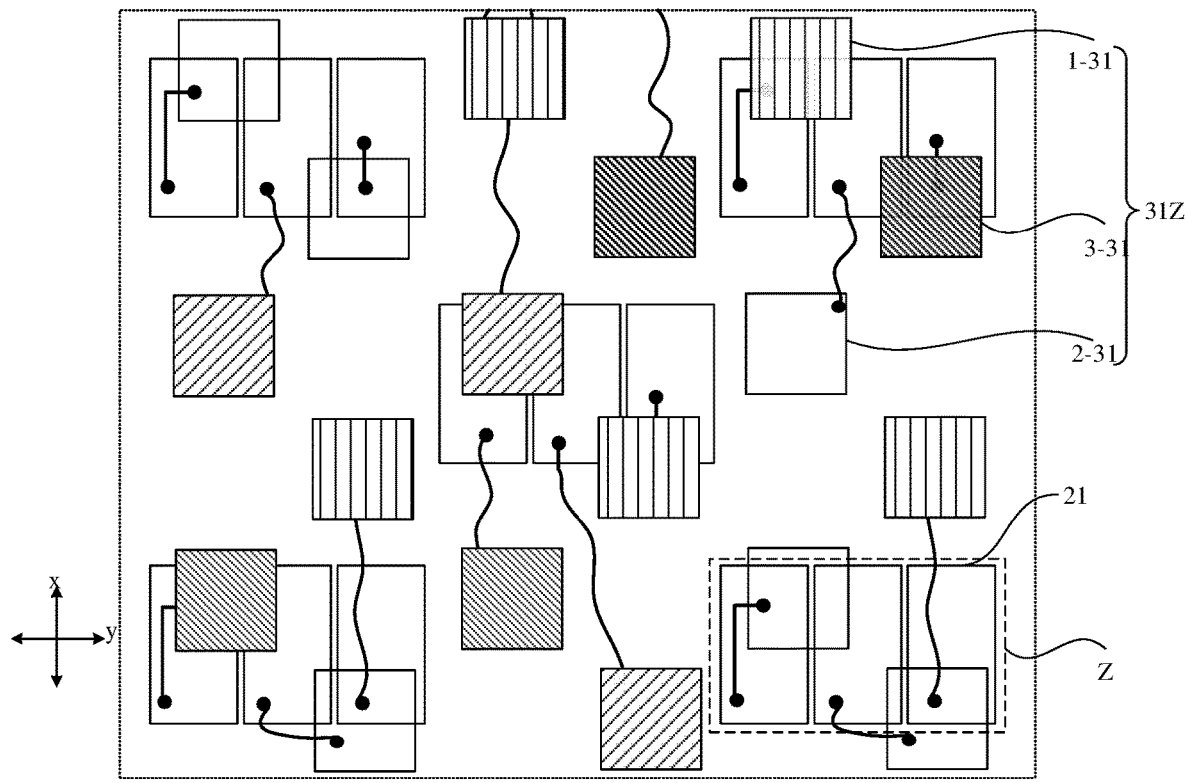
FIG. 46 is a partial schematic view of another display panel according to an embodiment of the present disclosure.

FIG. 46 is a partial schematic view of a first display region of another display panel according to an embodiment of the present disclosure. In an embodiment, as shown in FIG. 46, three light-emitting devices in one light-emitting device group 31Z are dispersedly disposed. Light-emitting devices in the first display region AA1 are uniformly distributed. In an embodiment, a line electrically connecting the light-emitting device and the pixel circuit 21 is in a shape of a curved line, which reduces diffraction occurring when the light passes through the first display region AA1.

Figure 47:
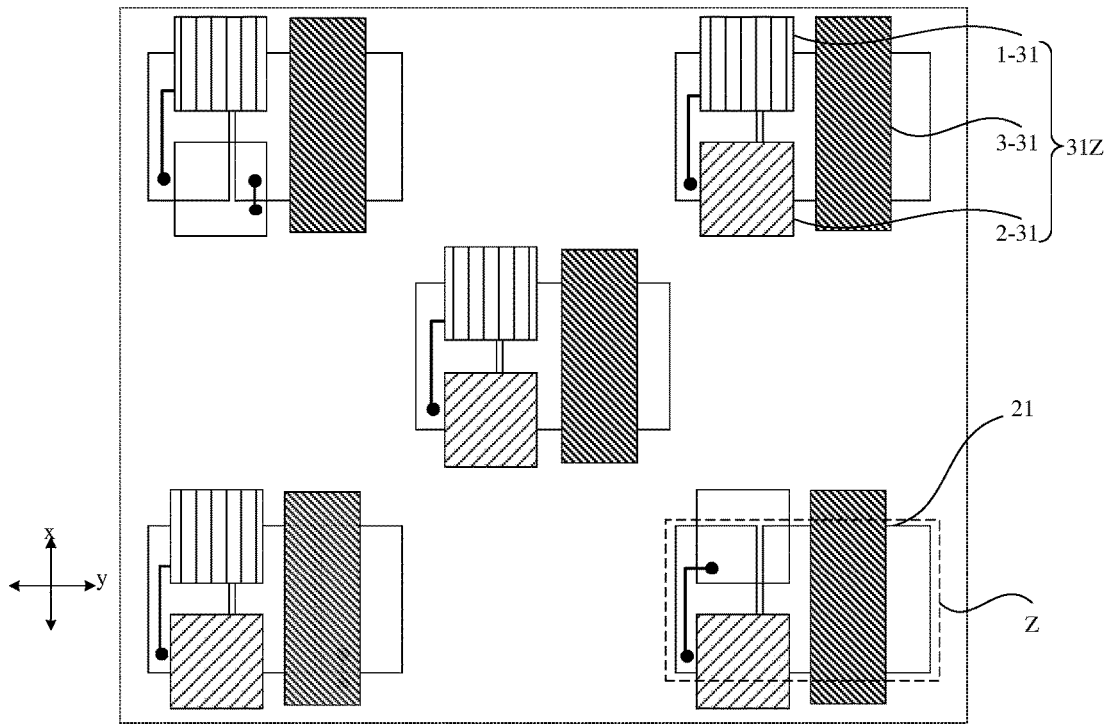
FIG. 47 is a partial schematic view of a first display region of another display panel according to an embodiment of the present disclosure.

FIG. 47 is a partial schematic view of a first display region of another display panel according to an embodiment of the present disclosure. In an embodiment, as shown in FIG. 47, one pixel circuit group Z includes three pixel circuits 21. In one light-emitting device group 31Z, the first light-emitting device 1-31, the second light-emitting device 2-31, and the third light-emitting device 3-31 are arranged in a "π" shape. FIG. 47 shows that pixel circuit groups Z are in a one-to-one correspondence with the light-emitting device groups 31Z, and one pixel circuit 21 is correspondingly connected to one light-emitting device.

Figure 48:
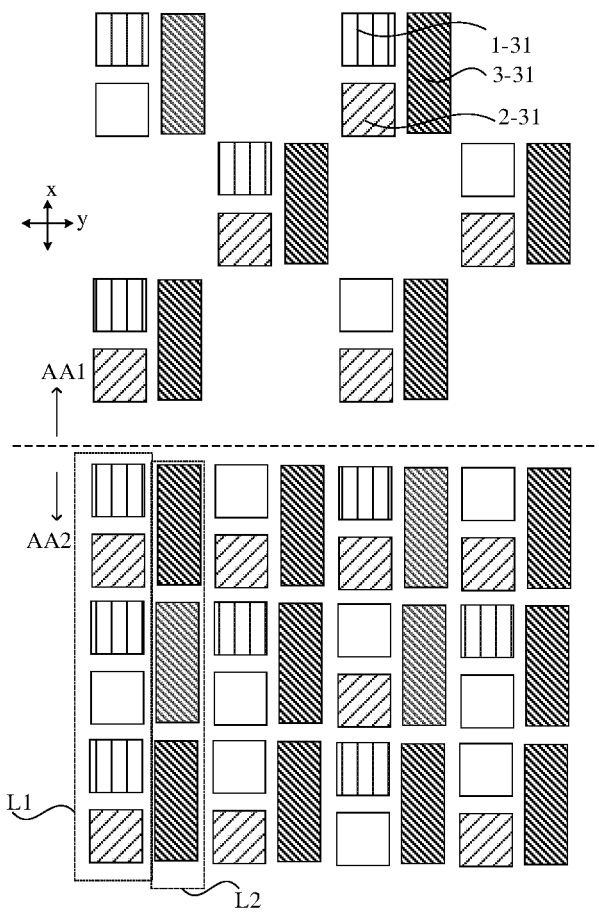
FIG. 48 is a partial schematic view of another display panel according to an embodiment of the present disclosure.

FIG. 48 is a partial schematic view of another display panel according to an embodiment of the present disclosure. FIG. 48 shows an arrangement manner of light-emitting devices in a first display region AA1, and an arrangement manner of light-emitting devices in a second display region AA2. In an embodiment, in the second display region AA2, the first light-emitting devices 1-31 and the second light-emitting devices 2-31 are alternately arranged in the first direction x to form a first light-emitting device column L1, and a plurality of third light-emitting devices 3-31 are alternately arranged in the first direction x to form a second light-emitting device column L2. In the second direction y, the first light-emitting device columns L1 and the second light-emitting device columns L2 are alternately arranged. For any one of one first light-emitting device column L1 and one second light-emitting device column L2 that are adjacent to each other, one third light-emitting device 3-31 corresponds to one first light-emitting device 1-31 and one second light-emitting device 2-31. A length of the third light-emitting device 3-31 in the first direction x is greater than a length of the first light-emitting device 1-31 in the first direction x, and the length of the third light-emitting device 3-31 in the first direction x is greater than a length of the second light-emitting device 2-31 in the first direction x. In an embodiment, the length of the third light-emitting device 3-31 in the first direction x is substantially a sum of the length of the first light-emitting device 1-31 in the first direction x and the length of the second light-emitting device 2-31 in the first direction x. In an embodiment, an area of the first light-emitting device 1-31 is substantially the same as an area of the second light-emitting device 2-31, and an area of the third light-emitting device 3-31 is substantially twice the area of the first light-emitting device 1-31.

Figure 49:
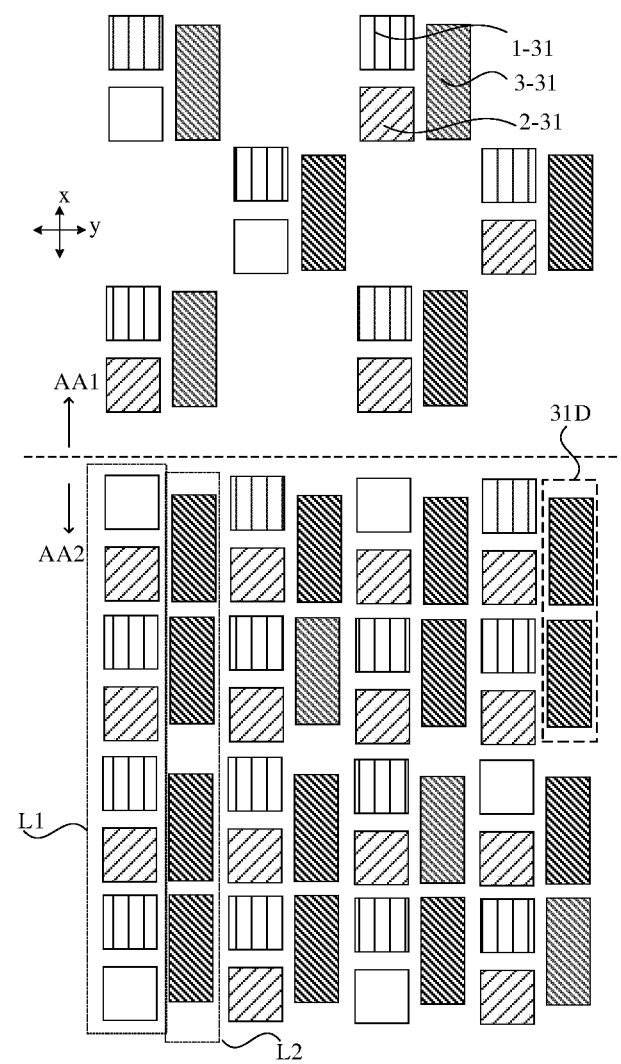
FIG. 49 is a partial schematic view of another display panel according to an embodiment of the present disclosure.

FIG. 49 is a partial schematic view of another display panel according to an embodiment of the present disclosure. FIG. 49 shows an arrangement manner of the light-emitting devices in the first display region AA1, and an arrangement manner of the light-emitting devices in the second display region AA2. In an embodiment, in the second display region AA2, a plurality of third light-emitting devices 3-31 in a second light-emitting device column L2 are arranged at distances that are not equal to each other. Two adjacent third light-emitting devices 3-31 having a relatively small distance in the first direction x form a device pair 31D. When a light-emitting layer of a light-emitting device is produced through vapor deposition in a manufacturing process of the display panel, the two third light-emitting devices 3-31 in the device pair 31D can share an opening of a mask. In an embodiment, the third light-emitting device 3-31 is a blue light-emitting device.

In some embodiments, a light-emitting device group includes one first light-emitting device, one second light-emitting device, and two third light-emitting devices that emit different colors of light, i.e., a total of four light-emitting devices.

Figure 50:
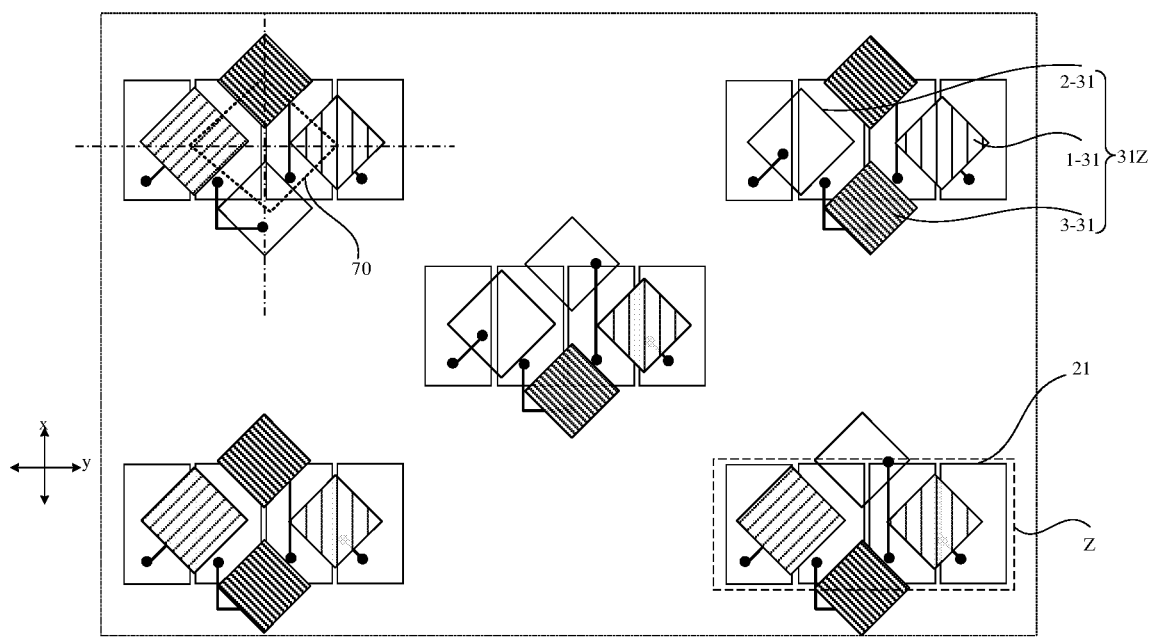
FIG. 50 is a partial schematic view of a first display region of another display panel according to an embodiment of the present disclosure.

FIG. 50 is a partial schematic view of a first display region of another display panel according to an embodiment of the present disclosure. In an embodiment, as shown in FIG. 50, one pixel circuit group Z includes four pixel circuits 21. In one light-emitting device group 31Z, four light-emitting devices are respectively located at four vertex angles of a first virtual quadrilateral 70. Two third light-emitting devices 3-31 are respectively located at two diagonal vertex angles of the first virtual quadrilateral 70, and the first light-emitting device 1-31 and the second light-emitting device 2-31 are located at the other two diagonal vertex angles of the first virtual quadrilateral. In an embodiment, the third light-emitting device 3-31 is a green light-emitting device, and one of the first light-emitting device 1-31 and the second light-emitting device 2-31 is a red light-emitting device, and the other one thereof is a blue light-emitting device. That the light-emitting device is located at the vertex angle of the first virtual quadrilateral 70 can be understood as: a geometric center of the light-emitting device coincides with the vertex angle of the first virtual quadrilateral 70. The light-emitting device includes a light-emitting layer, and a geometric center of a graphic of the light-emitting layer is the geometric center of the light-emitting device.

In an embodiment, in the light-emitting device group 31Z, a line connecting centers of two third light-emitting devices 3-31 is substantially parallel to the first direction x, and a line connecting a center of the first light-emitting device 1-31 and a center of the second light-emitting device 2-31 is substantially parallel to the second direction y.

In an embodiment, an area of the second light-emitting device 2-31 is greater than an area of the first light-emitting device 1-31, and an area of the second light-emitting device 2-31 is greater than an area of the third light-emitting device 3-31.

Figure 51:
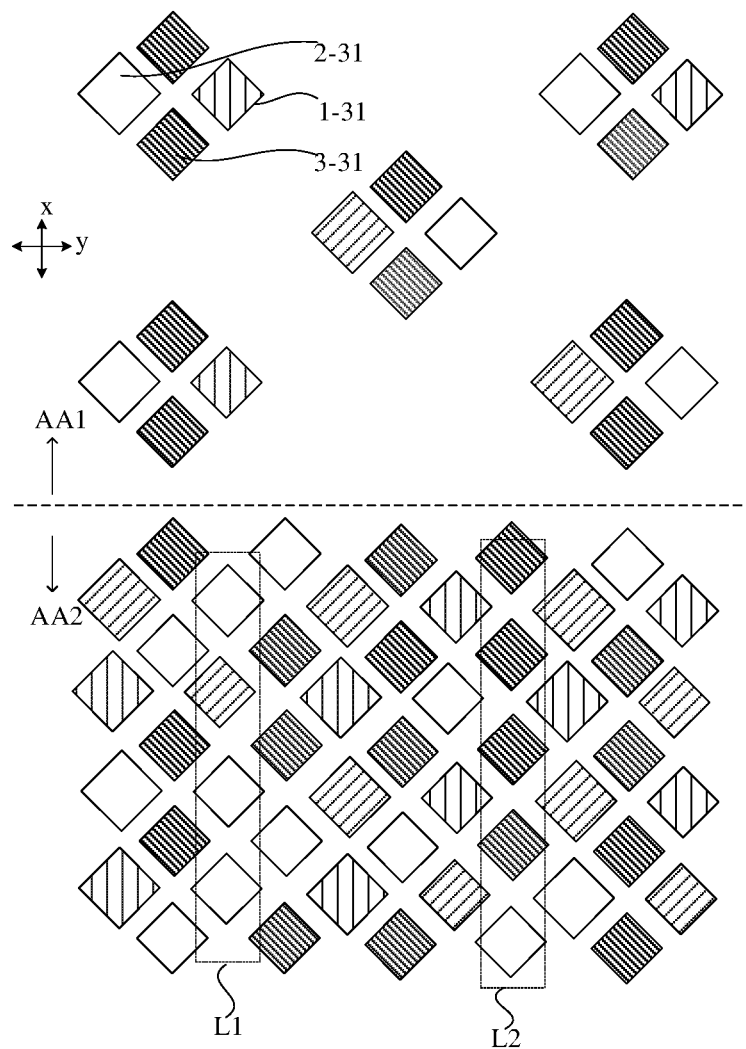
FIG. 51 is a partial schematic view of another display panel according to an embodiment of the present disclosure.

FIG. 51 is a partial schematic view of another display panel according to an embodiment of the present disclosure. FIG. 51 shows an arrangement manner of the light-emitting devices in the first display region AA1, and an arrangement manner of the light-emitting devices in the second display region AA2. In the second display region AA2, the first light-emitting devices 1-31 and the second light-emitting devices 2-31 are alternately arranged in the first direction x to form a first light-emitting device column L1, and a plurality of third light-emitting devices 3-31 are arranged in the first direction x to form a second light-emitting device column L2. In the second direction y, the first light-emitting device columns L1 and the second light-emitting device columns L2 are alternately arranged. In an embodiment, as shown in FIG. 51, the third light-emitting devices 3-31 are green light-emitting devices, which can improve evenness of the arrangement of the green light-emitting devices. When a sub-pixel rendering manner is used for display, an overall display effect can be improved.

Figure 52:
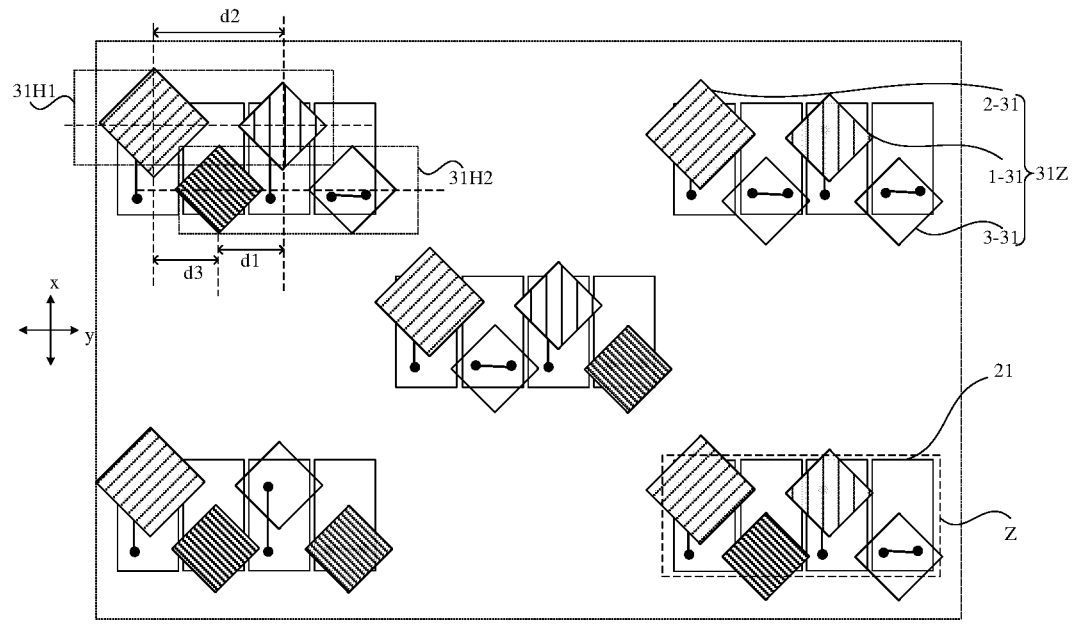
FIG. 52 is a partial schematic view of a first display region of another display panel according to an embodiment of the present disclosure.

FIG. 52 is a partial schematic view of a first display region of another display panel according to an embodiment of the present disclosure. In another embodiment, as shown in FIG. 52, one pixel circuit group Z includes four pixel circuits 21. In one light-emitting device group 31Z, a first light-emitting device 1-31 and a second light-emitting device 2-31 are arranged in a second direction y to form a first device column 31H1, and two third light-emitting devices 3-31 are arranged in the second direction to form a second device column 31H2. The second direction y intersects the first direction x. The first device column 31H1 and the second device column 31H2 are arranged in the first direction x in a staggered manner. In the second direction y, a staggered distance between one third light-emitting device 3-31 and the first light-emitting device 1-31 is d1, and a distance between the first light-emitting device 1-31 and the second light-emitting device 2-31 is d2, where d1 is smaller than d2. A staggered distance between the third light-emitting device 3-31 and the second light-emitting device 2-31 is d3, where d3 is smaller than d2. It can be understood that a staggered distance between two light-emitting devices is calculated based on a distance between same structures in the two light-emitting devices in the second direction y. In an embodiment, the staggered distance between the two light-emitting devices is calculated based on a distance between geometric centers of the two light-emitting devices in the second direction y. An arrangement manner of the light-emitting devices in the second display region AA2 in this embodiment can be the same as the arrangement manner of the light-emitting devices in the second display region AA2 in the embodiment of FIG. 51.

In an embodiment, a line connecting a center of the first light-emitting device 1-31 and a center of the second light-emitting device 2-31 in the first device column 31H1 is substantially parallel to the second direction y, and a line connecting centers of the two third light-emitting devices 3-31 in the second device column 31H2 is substantially parallel to the second direction y.

In the foregoing embodiment, shapes of the light-emitting devices are all shown as a rectangular shape. It should be noted that a specific shape of the light-emitting device is not limited in the present disclosure. In some embodiments, the shape of the light-emitting device can be any one of a plurality of shapes such as a circle, a rounded rectangle, an ellipse, or a hexagon.

In another embodiment, the first display region AA1 includes a first sub-region and a second sub-region, and a pixel circuit that drives the light-emitting device in the second subregion is located in the first sub-region, and the light transmittance of the second subregion is greater than the light transmittance of the first sub-region.

Figure 53:
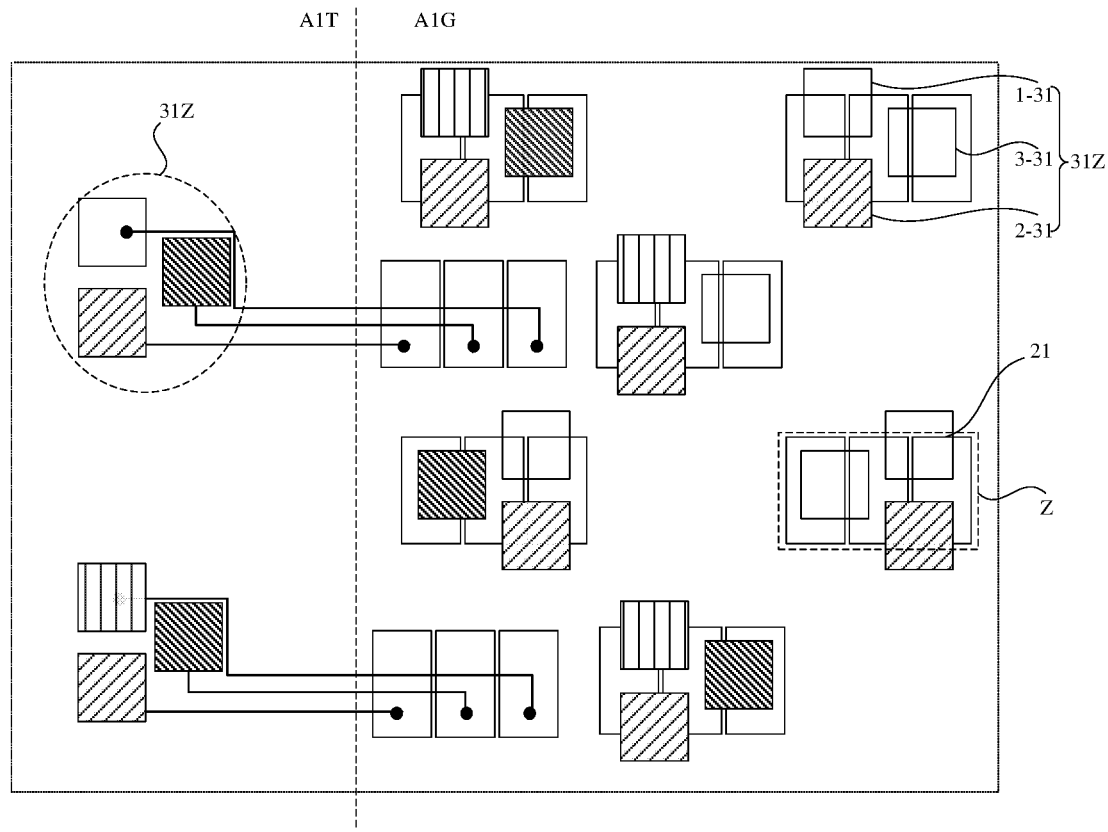
FIG. 53 is a partial schematic view of another display panel according to an embodiment of the present disclosure.

FIG. 53 is a partial schematic view of another display panel according to an embodiment of the present disclosure. FIG. 53 shows a first subregion A1G and a second subregion A1T in the first display region AA1. A light-emitting device group 31Z is provided in the second subregion A1T, and a pixel circuit that drives the light-emitting device group 31Z in the second sub-region A1T is located in the first subregion A1G. In other words, no pixel circuit is provided in the second subregion A1T, which can increase the light transmittance of the second subregion A1T to a relatively great extent. When such configuration is applied in the under-screen photosensitive device solution, the photosensitive device is correspondingly disposed below the second sub-region A1T, which can meet a relatively high requirement on the light transmittance of the display panel in the under-screen photosensitive device solution.

In an embodiment, a density of the light-emitting devices in the second sub-region A1T is smaller than a density of the light-emitting devices in the first subregion A1G.

In some embodiments, at the boundary between the first display region and the second display region, the first constant voltage signal line and the second constant voltage signal line are connected to each other.

Figure 54:
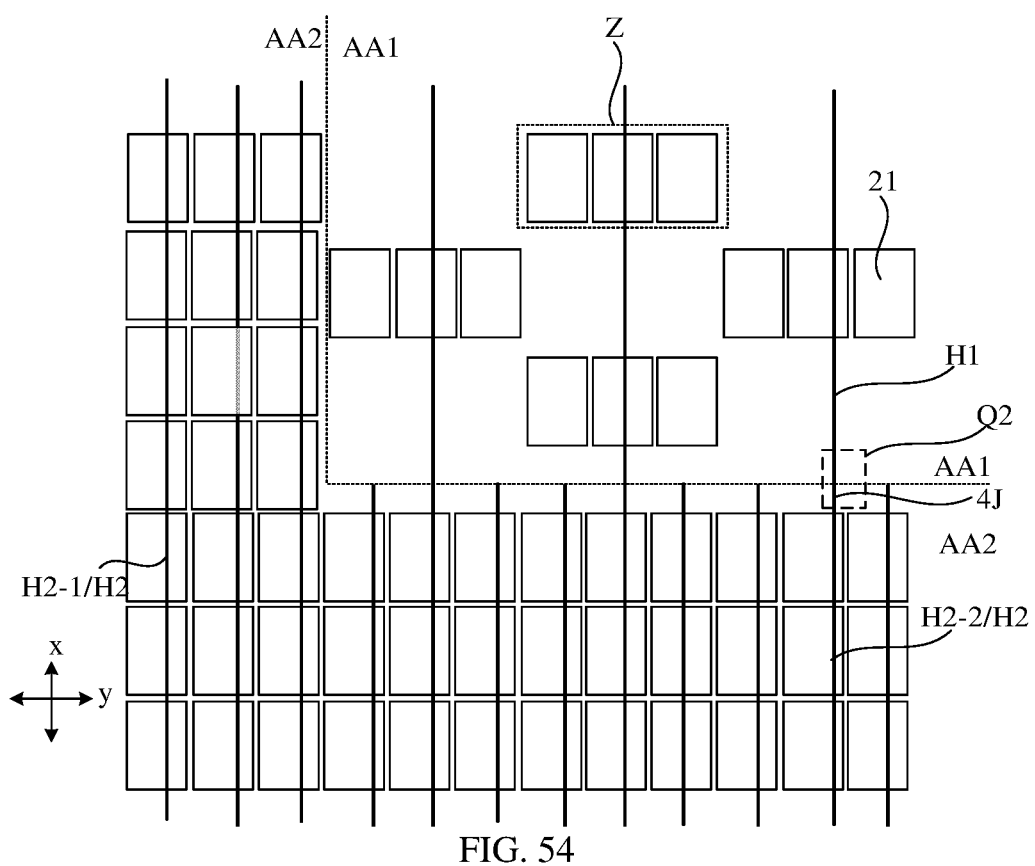
FIG. 54 is a partial schematic view of another display panel according to an embodiment of the present disclosure.

FIG. 54 is a partial schematic view of another display panel according to an embodiment of the present disclosure. In an embodiment, as shown in FIG. 54, at the boundary between the first display region AA1 and the second display region AA2, the first constant voltage signal line H1 is electrically connected to the second constant voltage signal line H2 through the fourth connection portion 4J. A line segment shown in a region Q2 in FIG. 54 is the fourth connection portion 4J.

Figure 55:
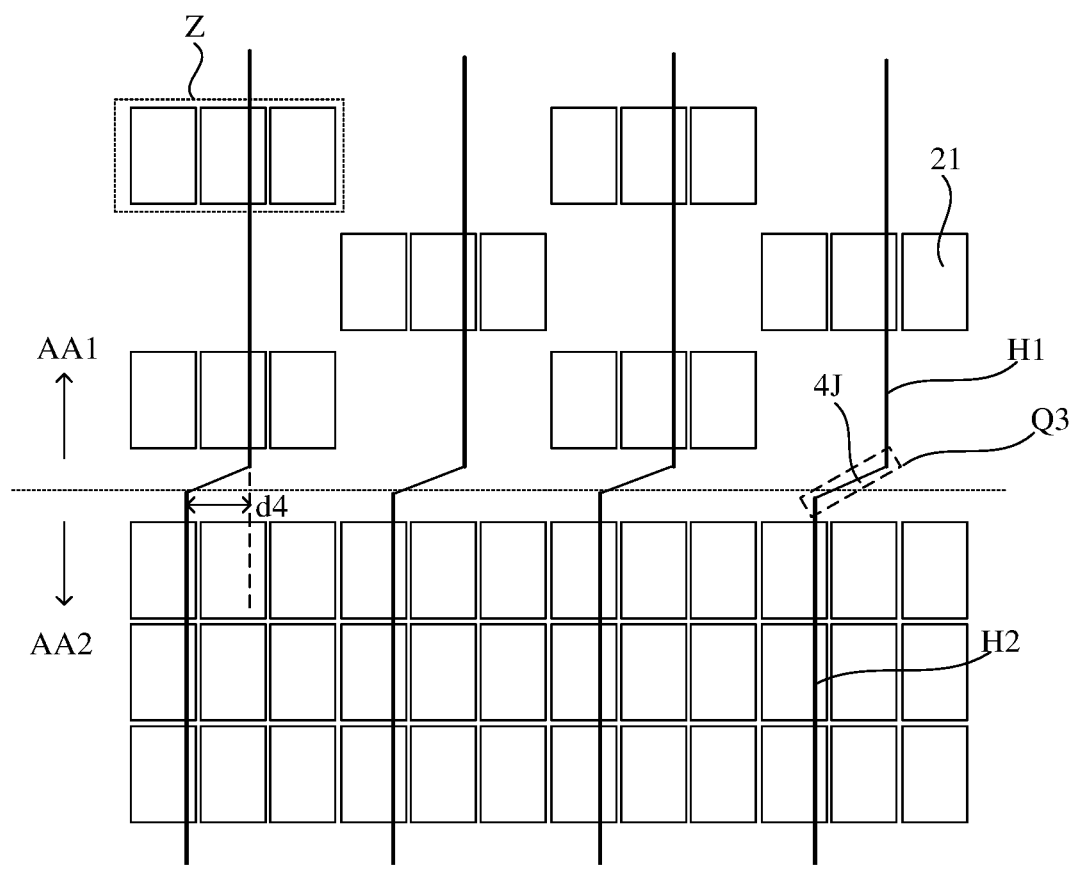
FIG. 55 is a partial schematic view of another display panel according to an embodiment of the present disclosure.

FIG. 55 is a partial schematic view of another display panel according to an embodiment of the present disclosure. In another embodiment, as shown in FIG. 55, at a boundary between the first display region AA1 and the second display region AA2, the first constant voltage signal line H1 is electrically connected to the second constant voltage signal line H2 through the fourth connection portion 4J. A line segment shown in a region Q3 in FIG. 55 is the fourth connection portion 4J.

In some embodiments, the first display region AA1 occupies a relatively small proportion of the entire display region. The second display region AA2 surrounds at least a part of the first display region AA1. The first display region AA1 is provided, so that the second display region AA2 is not in a regular rectangular shape (which can be shown in both FIG. 1 and FIG. 2). In other words, the second display region AA2 has a notch whose shape is the same as a shape of the first display region AA1. Therefore, the second constant voltage signal lines that have different lengths in the first direction x is provided in the second display region AA2, such as a second constant voltage signal line H2-1 and a second constant voltage signal line H2-2 shown in FIG. 54. In this embodiment of the present disclosure, the first constant voltage signal line H1 is connected to the second constant voltage signal line H2-2 through the fourth connection portion. In this way, a voltage signal can be transferred to the first constant voltage signal line H1 in the first display region AA1 through the second constant voltage signal line H2-2, to provide the voltage signal to the pixel circuits in the first display region AA1, and a voltage drop difference between the second constant voltage signal line H2-1 and the second constant voltage signal line H2-2 can be reduced, which can achieve evenness of the display panel.

In an embodiment, the fourth connection portion, the first constant voltage signal line H1, and the second constant voltage signal line H2 are located in a same metal layer. In an embodiment, as shown in FIG. 54, an end of the fourth connection portion 4J is connected to the first constant voltage signal line H1, and the other end thereof is connected to the second constant voltage signal line H2. The fourth connection portion 4J does not cross in its extending direction, a signal line (for example, the data line) that is located in a same metal layer as the constant voltage signal line, and the fourth connection portion located at a boundary between two regions is located in a same metal layer as the constant voltage signal line. In this solution, a line arrangement manner of the second constant voltage signal lines H2 in the second display region AA2 is designed to corporately implement that the first constant voltage signal line H1 is electrically connected to the second constant voltage signal line H2.

In another embodiment, the fourth connection portion 4J is located in a metal layer different from a metal layer where at least one of the first constant voltage signal line H1 and the second constant voltage signal line H2 is located.

In some embodiments, as shown in FIG. 55, in the first direction along which the constant voltage signal line extends, when the first constant voltage signal line H1 extends from the first display region AA1 into the second display region AA2, a distance d4 is formed between the first constant voltage signal line H1 and the second constant voltage signal line H2 that is relatively close to the first constant voltage signal line H1. The distance d4 perpendicular to the extending direction of the constant voltage signal line is relatively large, and the fourth connection portion 4J can intersect and short-circuit with another signal line that is located in a same layer as the constant voltage signal line. That the fourth connection portion can be located in a metal layer different from a layer where at least one of the first constant voltage signal line H1 and the second constant voltage signal line H2 is located, so that a case where lines transmitting different signals are short circuited can be avoided, the constant voltage signal line in the first display region and the constant voltage signal line in the second display region can be connected to each other.

Figure 56:
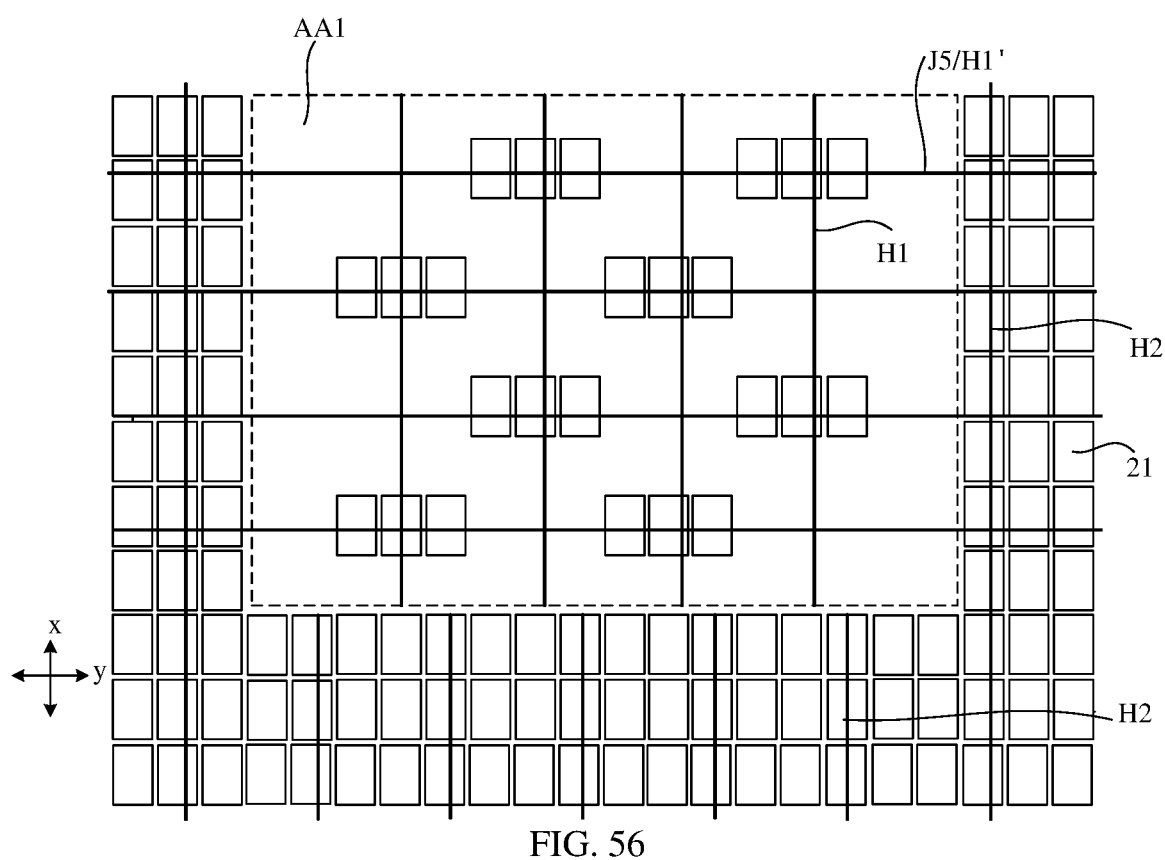
FIG. 56 is a partial schematic view of another display panel according to an embodiment of the present disclosure.

FIG. 56 is a partial schematic view of another display panel according to an embodiment of the present disclosure. In another embodiment, as shown in FIG. 56, at least one first constant voltage signal lines H1 ends at a position close to the second display region AA2. In other words, an end of the first constant voltage signal line H1 close to the second display region AA2 is not connected to the second constant voltage signal line H2. In an embodiment, the display panel further includes a fifth connection portion J5 located in the first display region AA1. The fifth connection portion J5 and an extending direction of the first constant voltage signal line H1 cross. For example, the fifth connection portion J5 substantially extends along the second direction y. The fifth connection portion J5 is electrically connected to the first constant voltage signal line H1 and extends from the first display region AA1 into the second display region AA2 to be electrically connected to the second constant voltage signal line H2. With reference to the descriptions in the embodiment of FIG. 55, the first connection portion 1J located in the circuit region QD, the third connection portion J4 located in the wiring region ZD, and the fifth connection portion J5 extending from the first display region AA1 into the second display region AA2 jointly constitute the first auxiliary constant voltage signal line H1'. In the first display region AA1, the first auxiliary constant voltage signal line H1' and the first constant voltage signal line H1 are electrically connected to each other and intersect to form a grid shape. In this implementation, the first auxiliary constant voltage signal line H1' can be used to transmit a constant voltage signal to the first constant voltage signal line H1, and the voltage drop on the constant voltage signal line in the first display region AA1 can be reduced.

In an embodiment, a part of the fifth connection portion J5 that is located in the first display region AA1 is located in a same layer as the first connection portion 1J.

Figure 57:
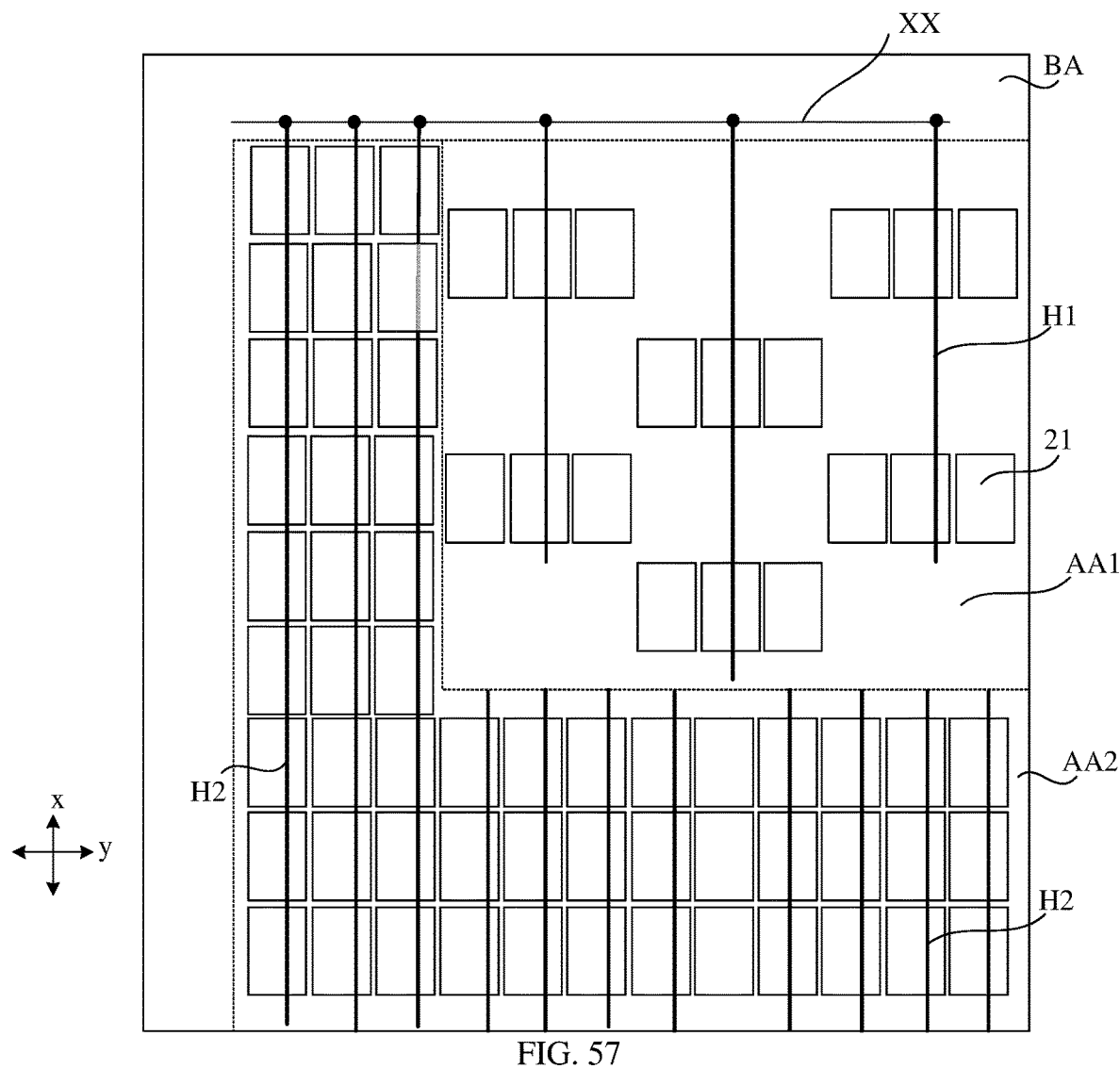
FIG. 57 is a partial schematic view of another display panel according to an embodiment of the present disclosure.

FIG. 57 is a partial schematic view of another display panel according to an embodiment of the present disclosure. In another embodiment, as shown in FIG. 57, the first constant voltage signal line H1 ends at a position close to the second display region AA2. In other words, the first constant voltage signal line H1 is not connected to the second constant voltage signal line H2 at the boundary position between the first display region AA1 and the second display region AA2. In an embodiment, the first constant voltage signal line H1 extends from the first display region AA1 into the non-display region BA in the extending direction of the first constant voltage signal line H1, and at least one second constant voltage signal line H2 extends from the second display region AA2 into the non-display region BA in an extending direction of the second constant voltage signal line H2. The first constant voltage signal line H1 is electrically connected to the second constant voltage signal line H2 through a lead XX located in the non-display region BA.

Figure 58:
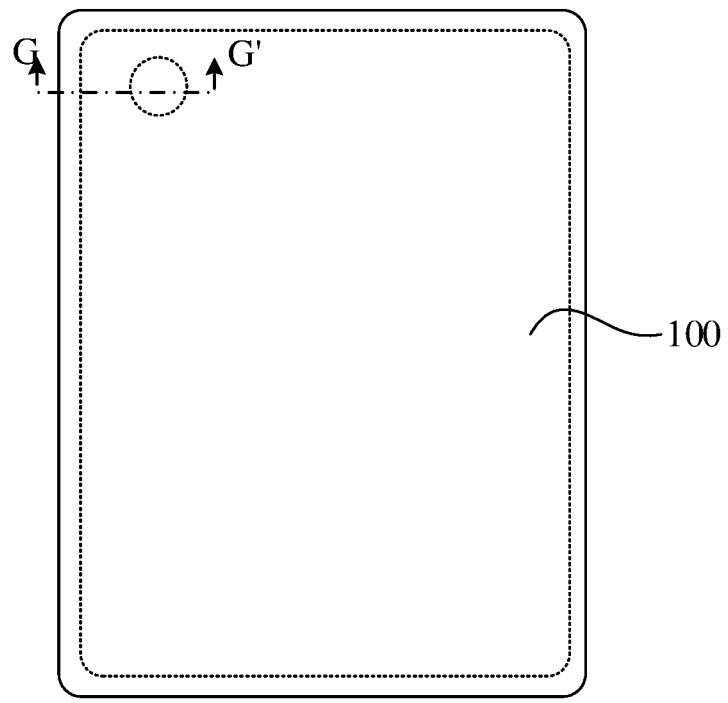
FIG. 58 is a schematic diagram of a display apparatus according to an embodiment of the present disclosure.
Figure 59:
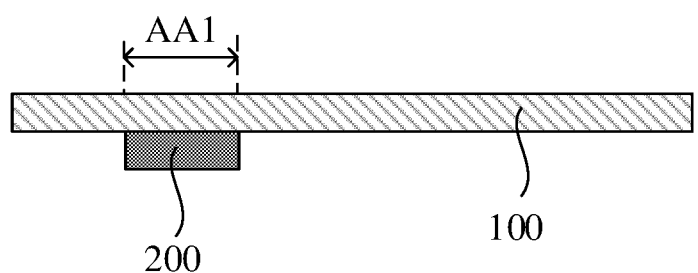
FIG. 59 is a cross-sectional view at a position of a tangent G-G' in FIG. 58 according to an embodiment of the present disclosure.

An embodiment of the present disclosure further provides a display apparatus. FIG. 58 is a schematic diagram of a display apparatus according to an embodiment of the present disclosure. FIG. 59 is a cross-sectional view along tangent G-G' in FIG. 58. As shown in FIG. 58, the display apparatus includes the display panel 100 according to any embodiment of the present disclosure. An arrangement manner of the sub-pixels in the display panel 100 has been described in the foregoing embodiments, and details are not repeated herein. In an embodiment of the present disclosure, the display apparatus can be, for example, any of devices having a display function, such as a mobile phone, a tablet computer, a notebook computer, an electronic paper book, a television, and an intelligent wearable product.

As shown in FIG. 59, the display apparatus can further include a photosensitive device 200 corresponding to a position of the first display region AA1 of the display panel 100. For example, a photosensitive surface of the photosensitive device 20 faces towards the display panel 100. The photosensitive device 200 can be an image capturing apparatus, and is configured to acquire outside image information. In an embodiment, the photosensitive device 200 is a complementary metal oxide semiconductor (CMOS) image capturing apparatus. In some other embodiments, the photosensitive device 200 can be a charge-coupled device (CCD) image capturing apparatus or an image capturing apparatus in another form. It can be understood that, the photosensitive device 200 can be not limited to the image capturing apparatus. For example, in some embodiments, the photosensitive device 200 can be an infrared sensor, a proximity sensor, and other optical sensors.

The above descriptions are merely some embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements fall within the scope of the technical solutions of the embodiments of the present disclosure.

What is claimed is:

1. A display panel, having a display region comprising a first display region and a second display region; and the display panel comprising:
   pixel circuits provided in the display region;
   light-emitting devices, wherein the pixel circuits are provided in the display region and electrically connected to the light-emitting devices;
   signal lines electrically provided in the display region and connected to the pixel circuits, wherein the signal lines comprise signal transmitting lines each extending in a first direction; and a first connection portion located in the first display region and extending along a second direction, wherein pixel circuit groups are disposed in the display region, wherein each of the pixel circuit groups comprises at least two pixel circuits of the pixel circuits, and the at least two pixel circuits are arranged in the second direction intersecting the first direction; and wherein the at least two pixel circuits in one of the pixel circuit groups are electrically connected to one of the signal transmitting lines through the first connection portion.

2. The display panel according to claim 1, wherein the signal transmitting lines comprise first signal lines provided in the first display region and second signal lines provided in the second display region; and wherein a distance D1 between two adjacent first signal lines of the first signal lines in the first display region and a distance D2 between two adjacent second signal lines of the second signal lines in the second display region satisfy: D1≥D2.

3. The display panel according to claim 1, wherein each of the pixel circuits comprises a drive transistor, a first reset transistor, and a second reset transistor, wherein the first reset transistor comprises a first electrode electrically connected to a control terminal of the drive transistor, and the second reset transistor comprises a first electrode electrically connected to a first electrode of one of the light-emitting devices;

the first connection portion comprises a first connection sub-portion and a second connection sub-portion; and second electrodes of the first reset transistors of the at least two pixel circuits in one of the pixel circuit groups are electrically connected to one of the signal transmitting lines through the first connection sub-portion; and second electrodes of the second reset transistors of the at least two pixel circuits in the one of the pixel circuit groups are electrically connected to another one of the signal transmitting lines through the second connection sub-portion.

4. The display panel according to claim 3, wherein each of the pixel circuits further comprises a data writing transistor, a first light-emitting control transistor, and a second light-emitting control transistor;

the signal lines further comprise power signal line sub-segments, data line sub-segments, first scanning line sub-segments, second scanning line sub-segments, third scanning line sub-segments, and light-emitting control line sub-segments;

a first electrode of the data writing transistor is electrically connected to one of the data line sub-segments, a second electrode of the data writing transistor is electrically connected to a first electrode of the drive transistor, and control terminals of the data writing transistors of the at least two pixel circuits in one of the pixel circuit groups are electrically connected to one of the first scanning line sub-segments;

a first electrode of the first light-emitting control transistor is electrically connected to one of the power signal line sub-segments, and a second electrode of the first light-emitting control transistor is electrically connected to the first electrode of the drive transistor; a first electrode of the second light-emitting control transistor is electrically connected to a second electrode of the drive transistor, and a second electrode of the second light-emitting control transistor is electrically connected to the first electrode of the one of the light-emitting devices; and both control terminals of the first light-emitting control transistors and control terminals of the second light-emitting control transistors that are of the at least two pixel circuits in one of the pixel circuit groups are electrically connected to one of the light-emitting control line sub-segments; and control terminals of the first reset transistors of the at least two pixel circuits in one of the pixel circuit groups are electrically connected to one of the second scanning line sub-segments, and control terminals of the second reset transistors of the at least two pixel circuits in one of the pixel circuit groups are electrically connected to one of the third scanning line sub-segments.

5. The display panel according to claim 1, wherein each of the pixel circuits comprises a drive transistor, a first light-emitting control transistor, and a second light-emitting control transistor;

a first electrode of the first light-emitting control transistor is electrically connected to one of the signal transmitting lines, and a second electrode of the first light-emitting control transistor is electrically connected to a first electrode of the drive transistor; and a first electrode of the second light-emitting control transistor is electrically connected to a second electrode of the drive transistor, and a second electrode of the second light-emitting control transistor is electrically connected to a first electrode of one of the light-emitting devices;

the first connection portion comprises a third connection sub-portion; and the first electrodes of the first light-emitting control transistors of the at least two pixel circuits in one of the pixel circuit groups are electrically connected to one of the signal transmitting lines through the third connection sub-portion.

6. The display panel according to claim 5, wherein each of the pixel circuits further comprises a data writing transistor, a first reset transistor, and a second reset transistor;

the signal lines further comprise reset signal line sub-segments, data line sub-segments, first scanning line sub-segments, second scanning line sub-segments, third scanning line sub-segments, and light-emitting control line sub-segments;

a first electrode of the data writing transistor is electrically connected to one of the data line sub-segments, a second electrode of the data writing transistor is electrically connected to a first electrode of the drive transistor, and control terminals of the data writing transistors of the at least two pixel circuits in one of the pixel circuit groups are electrically connected to one of the first scanning line sub-segments; a first electrode of the first reset transistor is electrically connected to a control terminal of the drive transistor, and a first electrode of the second reset transistor is electrically connected to the first electrode of the one of the light-emitting devices; and both a second electrode of the first reset transistor and a second electrode of the second reset transistor are electrically connected to one of the reset signal line sub-segments; and control terminals of the first reset transistors of the at least two pixel circuits in one of the pixel circuit groups are electrically connected to one of the second scanning line sub-segments; control terminals of the second reset transistors of the at least two pixel circuits in one of the pixel circuit groups are electrically connected to one of the third scanning line sub-segments; and both control terminals of the first light-emitting control transistors and control terminals of the second light-emitting control transistors that are of the at least two pixel circuits in one of the pixel circuit groups are electrically connected to one of the light-emitting control line sub-segments.

7. The display panel according to claim 1, wherein the first display region comprises a circuit region and a wiring region, and at least one of the pixel circuit groups is provided in the circuit region;
the signal lines comprise a first signal sub-line and a second signal sub-line that extend in a same direction, the first signal sub-line comprises a first signal sub-line sub-segment located in the circuit region and a first signal sub-line branch segment located in the wiring region, and the first signal sub-line sub-segment and the first signal sub-line branch segment are connected to each other; and the second signal sub-line comprises a second signal sub-line sub-segment located in the circuit region and a second signal sub-line branch segment located in the wiring region, and the second signal sub-line sub-segment and the second signal sub-line branch segment are connected to each other; and
in the circuit region, a gap between the first signal sub-line sub-segment and the second signal sub-line sub-segment is D3; and in the wiring region, a gap between the first signal sub-line branch segment and the second signal sub-line branch segment is D4, where D4<D3.

8. The display panel according to claim 7, wherein in the first display region,
the signal lines comprises a third signal sub-line and a fourth signal sub-line that extend in a same direction;
the third signal sub-line comprises a third signal sub-line sub-segment located in the circuit region and a third signal sub-line branch segment located in the wiring region, and the third signal sub-line sub-segment and the third signal sub-line branch segment are connected to each other; and the fourth signal sub-line comprises a fourth signal sub-line sub-segment located in the circuit region and a fourth signal sub-line branch segment located in the wiring region, and the fourth signal sub-line sub-segment and the fourth signal sub-line branch segment are connected to each other; and
in the wiring region, the third signal sub-line branch segment at least partially overlaps the fourth signal sub-line branch segment in a direction perpendicular to a plane of the substrate.

9. The display panel according to claim 7, wherein the first display region comprises a light transmission region and a non-light transmission region, and the non-light transmission region comprises the circuit region, the wiring region, and a region where the light-emitting devices are located; the non-light transmission region at least partially surrounds the light transmission region; and the light transmission region is in a circle shape, an ellipse shape, or an irregular shape.

10. The display panel according to claim 9, further comprising:
light-emitting device groups located in the circuit region, wherein each of the light-emitting device groups comprises n light-emitting devices of the light-emitting devices, and one of the at least two pixel circuits in one of the pixel circuit groups is electrically connected to at least one of the light-emitting devices;
wherein n=3, and each of the light-emitting device groups comprises a first light-emitting device, a second light-emitting device, and a third light-emitting device that emit light of three different colors;
wherein in one of the light-emitting device groups, the three light-emitting devices are arranged in a shape of "π";
wherein the first light-emitting device is a red light-emitting device configured to emit red light, the second light-emitting device is a blue light-emitting device configured to emit blue light, and the third light-emitting device is a green light-emitting device configured to emit green light; and
wherein a length of the second light-emitting device in the first direction is greater than a length of the first light-emitting device in the first direction and the length of the third light-emitting device of one of the light-emitting device groups in the first direction x.

11. The display panel according to claim 7, further comprising:
light-emitting device groups located in the circuit region, wherein each of the light-emitting device groups comprises n light-emitting devices of the light-emitting devices, and one of the at least two pixel circuits in one of the pixel circuit groups is electrically connected to at least one of the light-emitting devices;
wherein n=4, and each of the light-emitting device groups comprises a first light-emitting device, a second light-emitting device, and two third light-emitting devices; and
wherein the first light-emitting device is a red light-emitting device configured to emit red light, the second light-emitting device is a blue light-emitting device configured to emit blue light, and each of the two third light-emitting devices is a green light-emitting device configured to emit green light.

12. The display panel according to claim 1, further comprising:
light-emitting device groups located in the second display region, wherein each of the light-emitting device groups comprises n light-emitting devices of the light-emitting devices, and one of the at least two pixel circuits in one of the pixel circuit groups is electrically connected to at least one of the light-emitting devices;
wherein n=4, and each of the light-emitting device groups comprises a first light-emitting device, a second light-emitting device, and two third light-emitting devices;
wherein the four light-emitting devices in one of the light-emitting device groups are located at four vertex angles of a first virtual quadrangle, respectively, wherein the two third light-emitting devices are located at two diagonal vertex angles of the four vertex angles of the first virtual quadrangle, respectively, and the first light-emitting device and the second light-emitting device are located at the other two diagonal vertex angles of the four vertex angles of the first virtual quadrangle, respectively;
wherein the first light-emitting device is a red light-emitting device configured to emit red light, the second light-emitting device is a blue light-emitting device configured to emit blue light, and each of the two third light-emitting devices is a green light-emitting device configured to emit green light; and
wherein a light-emitting region of one of the n light-emitting devices is in a shape of a circle, a rounded rectangle, an ellipse, or a hexagon.

13. The display panel according to claim 1, wherein the first connection portion comprises a third connection sub-portion; and
the first electrodes of the first light-emitting control transistors of the at least two pixel circuits in one of the pixel circuit groups are electrically connected to one of the signal transmitting lines through the third connection sub-portion.

14. The display panel according to claim 13, wherein the first connection sub-portion, the second connection sub-portion and the third connection sub-portion each extend along the second direction; and
at least two of the first connection sub-portion, the second connection sub-portion and the third connection sub-portion are located in a same mental layer.

15. The display panel according to claim 14, wherein each of the pixel circuits comprises a storage capacitor, wherein the storage capacitor comprises a first electrode plate and a second electrode plate that is electrically connected to one of the power signal line sub-segments; and
wherein, in the circuit region, the first connection sub-portion, the second connection sub-portion, the third connection sub-portion, and the second electrode plate are located in a same metal layer.

16. The display panel according to claim 13, wherein each of the pixel circuits comprises a storage capacitor, wherein the storage capacitor comprises a first electrode plate and a second electrode plate that is electrically connected to one of the power signal line sub-segments; and
wherein, in the circuit region, the second electrode plates of the at least two pixel circuits in one of the pixel circuit groups are electrically connected to each other, and the third connection sub-portion is reused as the second electrode plate.

17. A display panel, having a display region comprising a first display region and a second display region; the first display region comprising a circuit region and a wiring region; and the display panel comprising:
pixel circuits provided in the display region;
light-emitting devices, wherein the pixel circuits are provided in the display region and electrically connected to the light-emitting devices;
signal lines electrically provided in the display region and connected to the pixel circuits, wherein the signal lines comprise at least one power signal line each extending in a first direction; and
a first connection portion located in the circuit region and extending along a second direction,
wherein pixel circuit groups are disposed in the circuit region, wherein each of the pixel circuit groups comprises at least two pixel circuits of the pixel circuits, and the at least two pixel circuits are arranged in the second direction intersecting the first direction; and
wherein the at least two pixel circuits in one of the pixel circuit groups are electrically connected to one of the at least one power signal line through the first connection portion.

18. The display panel according to claim 17, wherein, in the second display region, the at least two pixel circuits in one of the pixel circuit groups are electrically connected to one of the at least one power signal line, and a number of the at least two pixel circuits in one of the pixel circuit groups in the second display region is not greater than a number of the at least two pixel circuits in another one of the pixel circuit groups in the first display region.

19. The display panel according to claim 17, wherein each of the pixel circuits comprises a drive transistor, a first light-emitting control transistor, and a second light-emitting control transistor;
in the circuit region, the at least one power signal line comprises at least one power signal line sub-segment;
a first electrode of the first light-emitting control transistor is electrically connected to one of the at least one signal transmitting lines, and a second electrode of the first light-emitting control transistor is electrically connected to a first electrode of the drive transistor; and a first electrode of the second light-emitting control transistor is electrically connected to a second electrode of the drive transistor, and a second electrode of the second light-emitting control transistor is electrically connected to a first electrode of one of the light-emitting devices;
the first connection portion comprises a third connection sub-portion; and
the first electrodes of the first light-emitting control transistors of the at least two pixel circuits in one of the pixel circuit groups are electrically connected to one of the at least one signal transmitting line through the third connection sub-portion.

20. The display panel according to claim 19, wherein each of the pixel circuits further comprises a data writing transistor, a first reset transistor, and a second reset transistor;
in the circuit region, the signal lines further comprise data line sub-segments, first scanning line sub-segments, and light-emitting control line sub-segments;
a first electrode of the data writing transistor is electrically connected to one of the data line sub-segments, a second electrode of the data writing transistor is electrically connected to a first electrode of the drive transistor, and control terminals of the data writing transistors of the at least two pixel circuits in one of the pixel circuit groups are electrically connected to one of the first scanning line sub-segments; and
both control terminals of the first light-emitting control transistors and control terminals of the second light-emitting control transistors that are of the at least two pixel circuits in one of the pixel circuit groups are electrically connected to one of the light-emitting control line sub-segments.

21. The display panel according to claim 20, wherein each of the pixel circuits further comprises a first reset transistor and a second reset transistor;
in the circuit region, the signal lines further comprise reset signal line sub-segments, second scanning line sub-segments, and third scanning line sub-segments;
a first electrode of the first reset transistor is electrically connected to a control terminal of the drive transistor, and a first electrode of the second reset transistor is electrically connected to the first electrode of the one of the light-emitting devices; and both a second electrode of the first reset transistor and a second electrode of the second reset transistor are electrically connected to one of the reset signal line sub-segments; and
control terminals of the first reset transistors of the at least two pixel circuits in one of the pixel circuit groups are electrically connected to one of the second scanning line sub-segments; and control terminals of the second reset transistors of the at least two pixel circuits in one of the pixel circuit groups are electrically connected to one of the third scanning line sub-segments.

22. The display panel according to claim 21, wherein the second electrodes of the first reset transistors and the second electrodes of the second reset transistors that are of the at least two pixel circuits in one of the pixel circuit groups are electrically connected to one of the reset signal line sub-segments.

23. The display panel according to claim 21, wherein the reset signal line sub-segments comprise a first reset signal line sub-segment and a second reset signal line sub-segment each extending along the first direction; and the second electrodes of the first reset transistors of the at least two pixel circuits in one of the pixel circuit groups are electrically connected to the first reset signal line sub-segment, and the second electrodes of the second reset transistors of the at least two pixel circuits in one of the pixel circuit groups are electrically connected to the second reset signal line sub-segment.

24. The display panel according to claim 23, wherein, in the circuit region, at least two of one of the power signal line sub-segments, one of the data line sub-segments, one of the first reset signal line sub-segments, and one of the second reset signal line sub-segments are located in a same mental layer.

25. The display panel according to claim 24, wherein, in the circuit region, the power signal line sub-segments, the first reset signal line sub-segments, and the second reset signal line sub-segments are located in a same mental layer.

26. The display panel according to claim 21, wherein, in the circuit region, at least two of one of the first scanning line sub-segments, one of the second scanning line sub-segments, one of the third scanning line sub-segments are located in a same mental layer.

27. The display panel according to claim 19, wherein each of the pixel circuits comprises a storage capacitor, wherein the storage capacitor comprises a first electrode plate and a second electrode plate that is electrically connected to one of the power signal line sub-segments; and wherein, in the circuit region, the third connection sub-portion and the second electrode plate are located in a same metal layer.

28. The display panel according to claim 19, wherein each of the pixel circuits comprises a storage capacitor, wherein the storage capacitor comprises a first electrode plate and a second electrode plate that is electrically connected to one of the power signal line sub-segments; and wherein, in the circuit region, the second electrode plates of the at least two pixel circuits in one of the pixel circuit groups are electrically connected to each other, and the third connection sub-portion is reused as the second electrode plate.

29. The display panel according to claim 17, wherein, in the circuit region, one of the at least one power signal line electrically connected to one of the pixel circuit groups is located between two adjacent pixel circuits of the at least two pixel circuits in the pixel circuit group.

30. The display panel according to claim 17, wherein the at least one power signal line comprises a first power signal line located in the first display region and a second power signal line located in the second display region, wherein the first power signal line is electrically connected to the second power signal line;

the first power signal line comprises power signal line sub-segments located in the circuit region and power signal line branches located in the wiring region; and at least two of the one of the power signal line sub-segments, one of the power signal line branches, and the second power signal line are located in a same mental layer.

31. A display panel, having a display region comprising a first display region and a second display region; the first display region comprising a circuit region and a wiring region; and the display panel comprising:

pixel circuits provided in the display region;

light-emitting devices, wherein the pixel circuits are provided in the display region and electrically connected to the light-emitting devices;

signal lines electrically provided in the wiring region and connected to the pixel circuits, wherein the signal lines comprise at least one reset signal line each extending in a first direction; and a first connection portion located in the circuit region and extending along a second direction, wherein pixel circuit groups are disposed in the circuit region, wherein each of the pixel circuit groups comprises at least two pixel circuits of the pixel circuits, and the at least two pixel circuits are arranged in the second direction intersecting the first direction; and wherein the at least two pixel circuits in one of the pixel circuit groups are electrically connected to one of the at least one reset signal line through the first connection portion.

32. The display panel according to claim 31, wherein each of the pixel circuits comprises a drive transistor, a first reset transistor, and a second reset transistor, wherein the first reset transistor comprises a first electrode electrically connected to a control terminal of the drive transistor, and the second reset transistor comprises a first electrode electrically connected to a first electrode of one of the light-emitting devices;

the first connection portion comprises a first connection sub-portion and a second connection sub-portion;

in the circuit region, the at least one reset signal line comprises reset signal line sub-segments; and second electrodes of the first reset transistors of the at least two pixel circuits in one of the pixel circuit groups are electrically connected to one of the at least one reset signal line through the first connection sub-portion; and second electrodes of the second reset transistors of the at least two pixel circuits in the one of the pixel circuit groups are electrically connected to another one of the at least one reset signal line through the second connection sub-portion.

33. The display panel according to claim 32, wherein the at least one reset signal line comprises at least one first reset signal line sub-segment and at least one second reset signal line sub-segment that each extending along the first direction; and second electrodes of the first reset transistors of the at least two pixel circuits in one of the pixel circuit groups are electrically connected to one of the at least one first reset signal line sub-segment through the first connection sub-portion; and second electrodes of the second reset transistors of the at least two pixel circuits in the one of the pixel circuit groups are electrically connected to the second reset signal line sub-segment through the second connection sub-portion.

34. The display panel according to claim 33, wherein each of the pixel circuits further comprises a data writing transistor;

in the circuit region, the signal lines further comprise data line sub-segments, first scanning line sub-segments, second scanning line sub-segments, third scanning line sub-segments, and light-emitting control line sub-segments;

a first electrode of the data writing transistor is electrically connected to one of the data line sub-segments, a second electrode of the data writing transistor is electrically connected to a first electrode of the drive transistor, and control terminals of the data writing transistors of the at least two pixel circuits in one of the pixel circuit groups are electrically connected to one of the first scanning line sub-segments;

control terminals of the first reset transistors of the at least two pixel circuits in one of the pixel circuit groups are electrically connected to one of the second scanning line sub-segments, and control terminals of the second reset transistors of the at least two pixel circuits in one of the pixel circuit groups are electrically connected to one of the third scanning line sub-segments.

35. The display panel according to claim 34, wherein, in the circuit region, at least two of one of the first scanning line sub-segments, one of the second scanning line sub-segments, one of the third scanning line sub-segments are located in a same mental layer.

36. The display panel according to claim 33, wherein each of the pixel circuits further comprises a first light-emitting control transistor and a second light-emitting control transistor;

in the circuit region, the signal lines further comprise power signal line sub-segment;

a first electrode of the first light-emitting control transistor is electrically connected to one of the power signal line sub-segments, and a second electrode of the first light-emitting control transistor is electrically connected to the first electrode of the drive transistor; and a first electrode of the second light-emitting control transistor is electrically connected to a second electrode of the drive transistor, and a second electrode of the second light-emitting control transistor is electrically connected to the first electrode of the one of the light-emitting devices; and both control terminals of the first light-emitting control transistors and control terminals of the second light-emitting control transistors that are of the at least two pixel circuits in one of the pixel circuit groups are electrically connected to one of the light-emitting control line sub-segments.

37. The display panel according to claim 33, wherein, in the circuit region, one of the at least one first reset signal line sub-segment electrically connected to one of the pixel circuit groups is located between two adjacent pixel circuits of the at least two pixel circuits in the pixel circuit group, or one of the at least one second reset signal line sub-segment electrically connected to one of the pixel circuit groups is located between two adjacent pixel circuits of the at least two pixel circuits in the pixel circuit group.

38. The display panel according to claim 33, wherein, in the circuit region, at least one of the at least one first reset signal line sub-segment electrically connected to one of the pixel circuit groups is located at a same side of the at least two pixel circuits in the pixel circuit group, or at least one of the at least one second reset signal line sub-segment electrically connected to one of the pixel circuit groups is located at a same side of the at least two pixel circuits in the pixel circuit group.

39. The display panel according to claim 31, wherein the at least one reset signal line comprises at least one first reset signal line sub-segment located in the first display region and at least one second reset signal line sub-segment located in the second display region, wherein the at least one first reset signal line sub-segment and the at least one second reset signal line sub-segment are electrically connected to each other;

the at least one first reset signal line comprises reset signal line sub-segments located in the circuit region and reset signal line branches located in the wiring region; and at least two of one of the reset signal line sub-segments, one of the reset signal line branches, and the at least one second reset signal line are located in a same mental layer.

* * * * *